(12) United States Patent
Lin

(10) Patent No.: US 10,418,298 B2
(45) Date of Patent: Sep. 17, 2019

(54) SEMICONDUCTOR DEVICE AND METHOD OF FORMING DUAL FAN-OUT SEMICONDUCTOR PACKAGE

(71) Applicant: STATS ChipPac, Ltd., Singapore (SG)

(72) Inventor: Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 294 days.

(21) Appl. No.: 14/035,726

(22) Filed: Sep. 24, 2013

(65) Prior Publication Data

US 2015/0084206 A1 Mar. 26, 2015

(51) Int. Cl.
*H01L 23/31* (2006.01)
*H01L 23/00* (2006.01)
(Continued)

(52) U.S. Cl.
CPC ...... *H01L 23/3135* (2013.01); *H01L 23/5389* (2013.01); *H01L 24/19* (2013.01); *H01L 24/96* (2013.01); *H01L 21/568* (2013.01); *H01L 2224/0401* (2013.01); *H01L 2224/04105* (2013.01); *H01L 2224/12105* (2013.01); *H01L 2224/16225* (2013.01); *H01L 2224/24195* (2013.01); *H01L 2224/48091* (2013.01); *H01L 2224/73265* (2013.01); *H01L 2224/81005* (2013.01); *H01L 2225/1035* (2013.01); *H01L 2225/1058* (2013.01); *H01L 2924/01322* (2013.01); *H01L 2924/12041* (2013.01); *H01L 2924/12042* (2013.01); *H01L 2924/13091* (2013.01); *H01L 2924/15192* (2013.01); *H01L 2924/15311* (2013.01);
(Continued)

(58) Field of Classification Search
CPC ............ H01L 23/3135; H01L 23/5384; H01L 23/5389
USPC .......................... 257/773, 774, 778, 786, 787
See application file for complete search history.

(56) References Cited

U.S. PATENT DOCUMENTS

| | | | |
|---|---|---|---|
| 6,294,407 B1 * | 9/2001 | Jacobs | ............... H01L 21/4839 438/108 |
| 6,396,153 B2 | 5/2002 | Fillion et al. | |

(Continued)

*Primary Examiner* — Cuong Q Nguyen
*Assistant Examiner* — Peter M Albrecht
(74) *Attorney, Agent, or Firm* — Robert D. Atkins; Patent Law Group: Atkins and Associates, P.C.

(57) ABSTRACT

A semiconductor device has a semiconductor die with a first encapsulant disposed over the semiconductor die. A first build-up interconnect structure is formed over the semiconductor die and first encapsulant. The first build-up interconnect structure has a first conductive layer. The first conductive layer includes a plurality of first conductive traces. A second encapsulant is disposed over the semiconductor die and the first build-up interconnect structure. A second build-up interconnect structure is formed over the first build-up interconnect structure and the second encapsulant. The second build-up interconnect structure has a second conductive layer. The second conductive layer includes a plurality of second conductive traces. A distance between the second conductive traces is greater than a distance between the first conductive traces. A passive device is disposed within the first encapsulant and/or the second encapsulant. A plurality of conductive vias is disposed in the first encapsulant and/or the second encapsulant.

30 Claims, 31 Drawing Sheets

(51) Int. Cl.
  *H01L 23/538* (2006.01)
  *H01L 21/56* (2006.01)
(52) U.S. Cl.
  CPC ............ *H01L 2924/15313* (2013.01); *H01L 2924/181* (2013.01); *H01L 2924/18161* (2013.01); *H01L 2924/18162* (2013.01); *H01L 2924/19105* (2013.01); *H01L 2924/3511* (2013.01)

(56) References Cited

U.S. PATENT DOCUMENTS

| | | | |
|---|---|---|---|
| 6,608,259 B1* | 8/2003 | Norskov ..................... | 174/261 |
| 6,838,776 B2 | 1/2005 | Leal et al. | |
| 6,921,975 B2 | 7/2005 | Leal et al. | |
| 7,268,012 B2 | 9/2007 | Jiang et al. | |
| 7,759,212 B2 | 7/2010 | Lin et al. | |
| 7,790,503 B2 | 9/2010 | Lin et al. | |
| 8,004,089 B2* | 8/2011 | Jobetto ............. | H01L 23/49816 257/678 |
| 8,241,952 B2 | 8/2012 | Lin et al. | |
| 8,653,674 B1* | 2/2014 | Darveaux ............... | H01L 24/06 257/659 |
| 2007/0001293 A1 | 1/2007 | Jiang et al. | |
| 2008/0079157 A1* | 4/2008 | Kurita ................. | H01L 21/4857 257/753 |
| 2008/0079164 A1* | 4/2008 | Kurita ................. | H01L 21/4857 257/759 |
| 2008/0315372 A1* | 12/2008 | Kuan .................... | H01L 21/568 257/659 |
| 2009/0039510 A1* | 2/2009 | Jobetto ................ | H01L 21/568 257/738 |
| 2009/0294938 A1* | 12/2009 | Chen ..................... | H01L 21/563 257/676 |
| 2010/0013081 A1* | 1/2010 | Toh .................... | H01L 23/49816 257/692 |
| 2010/0230806 A1* | 9/2010 | Huang .................... | H01L 23/50 257/723 |
| 2010/0289133 A1* | 11/2010 | Chao ....................... | H01L 21/56 257/692 |
| 2011/0049726 A1* | 3/2011 | Chino .................. | H01L 21/565 257/773 |
| 2011/0133333 A1* | 6/2011 | Kwon et al. .................. | 257/737 |
| 2011/0215450 A1* | 9/2011 | Chi ......................... | H01L 23/48 257/660 |
| 2011/0215478 A1* | 9/2011 | Yamamichi ........... | H01L 23/522 257/773 |
| 2011/0291288 A1* | 12/2011 | Wu .................... | H01L 23/49827 257/774 |
| 2012/0032314 A1* | 2/2012 | Chen ..................... | H01L 21/563 257/666 |
| 2012/0161279 A1 | 6/2012 | Lin et al. | |
| 2012/0212917 A1* | 8/2012 | Shin ................... | H01L 25/0657 361/767 |
| 2012/0268899 A1 | 10/2012 | Haba et al. | |
| 2012/0282767 A1 | 11/2012 | Jin et al. | |
| 2012/0286419 A1* | 11/2012 | Kwon ................ | H01L 23/3107 257/737 |
| 2012/0287583 A1 | 11/2012 | Pressel et al. | |
| 2013/0056866 A1* | 3/2013 | Samoilov ........... | H01L 25/0652 257/737 |
| 2013/0056879 A1 | 3/2013 | Lin et al. | |
| 2013/0175686 A1* | 7/2013 | Meyer ................ | H01L 25/0655 257/738 |
| 2014/0110856 A1* | 4/2014 | Lin ........................ | H01L 24/19 257/774 |
| 2015/0359098 A1* | 12/2015 | Ock ....................... | H01L 25/16 361/782 |

* cited by examiner

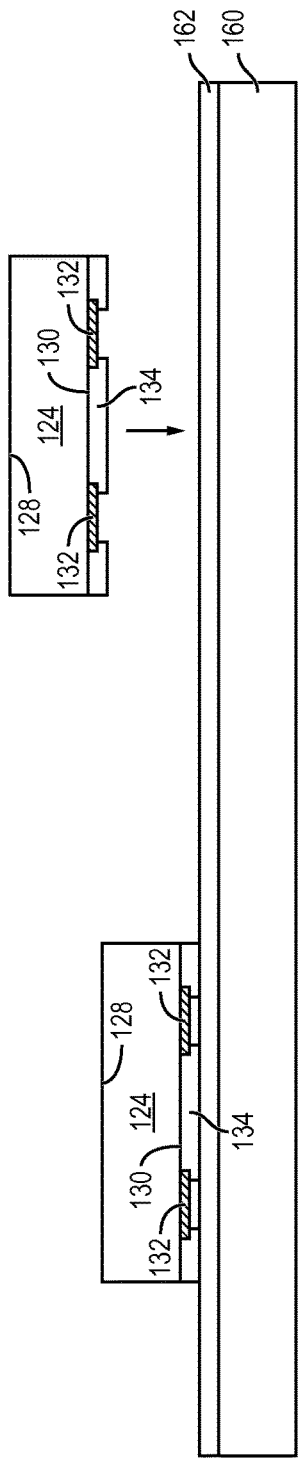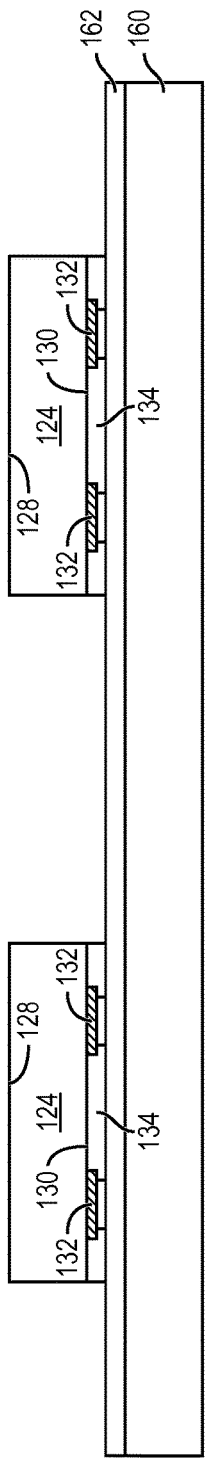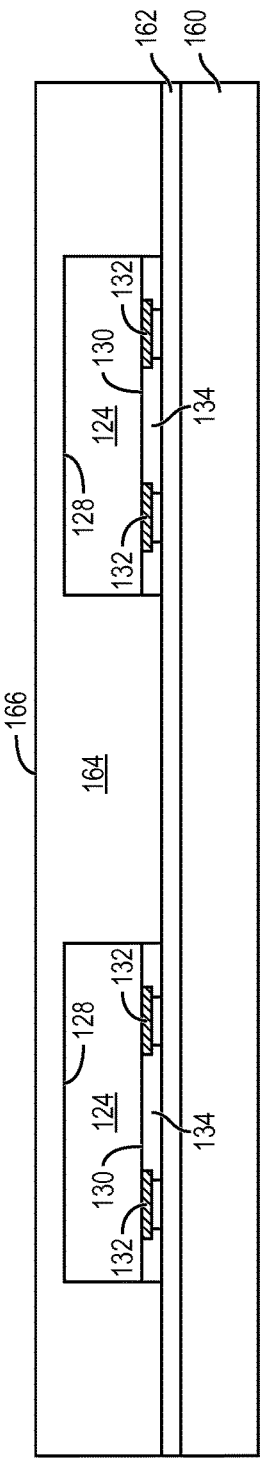

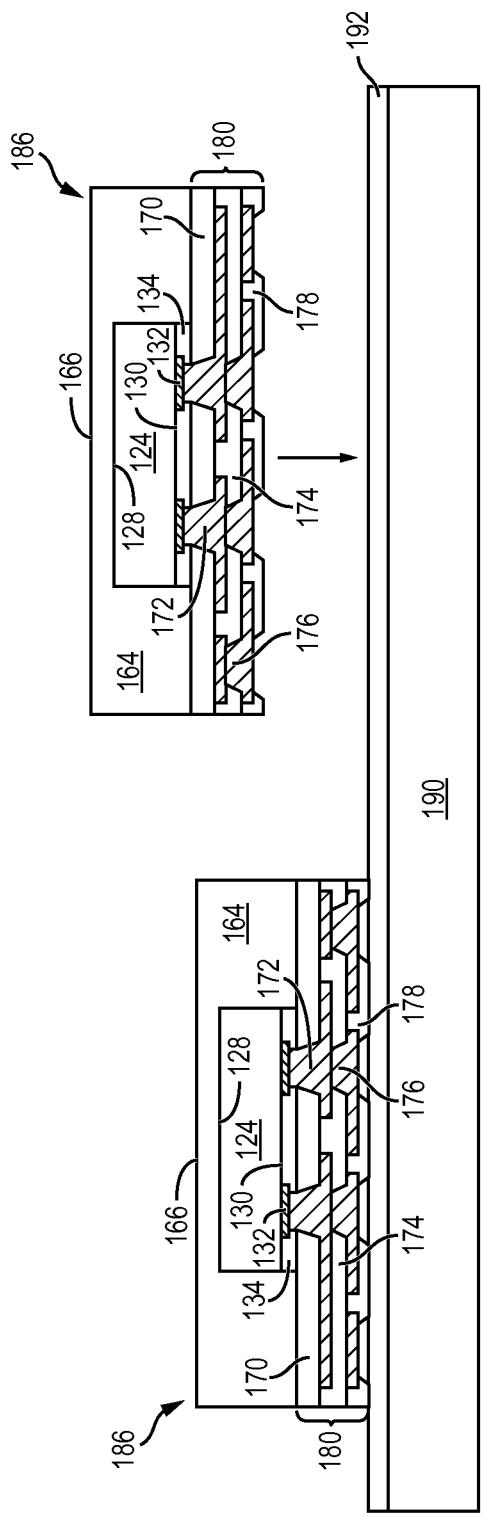
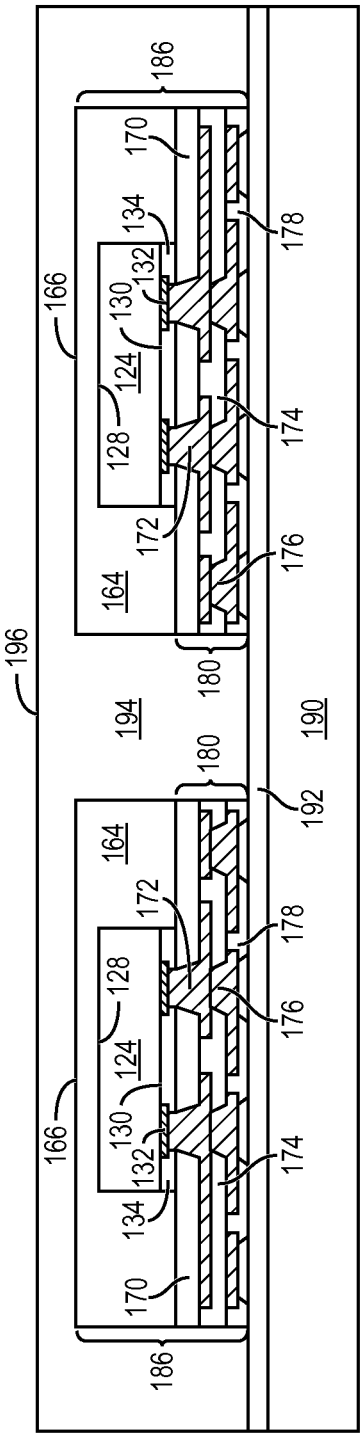
FIG. 5l
FIG. 5m

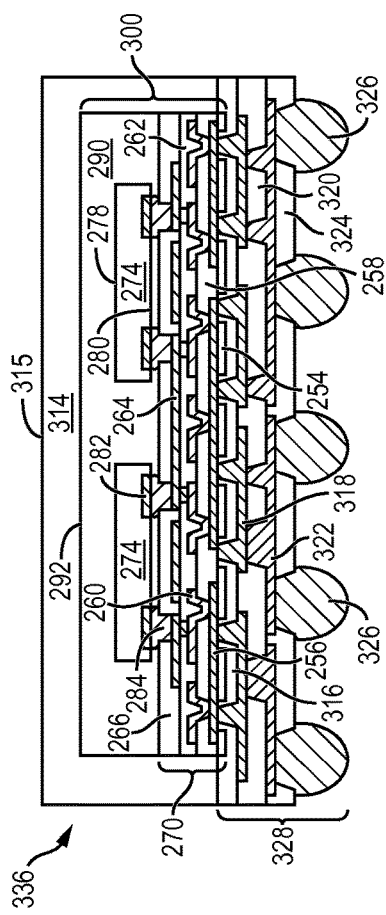
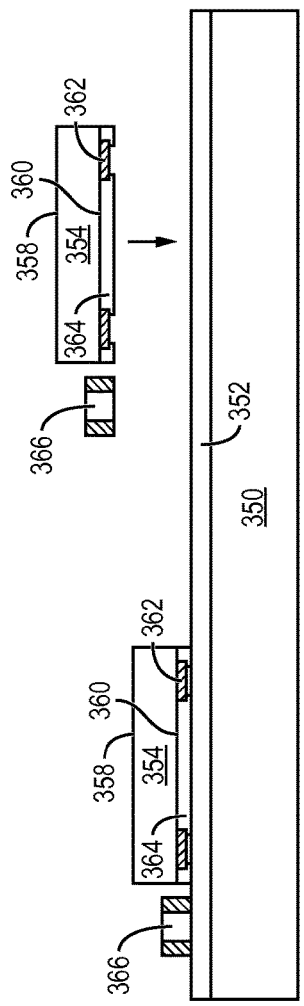
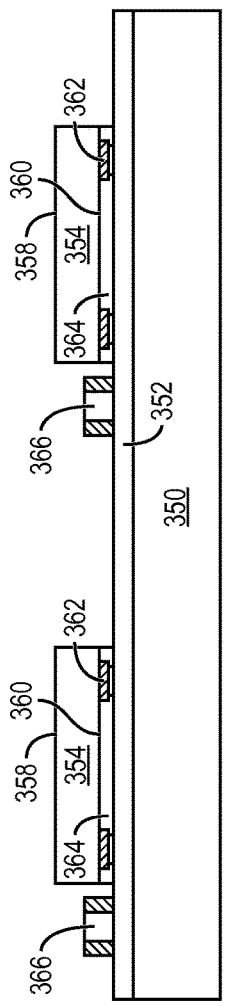
FIG. 8
FIG. 9a
FIG. 9b

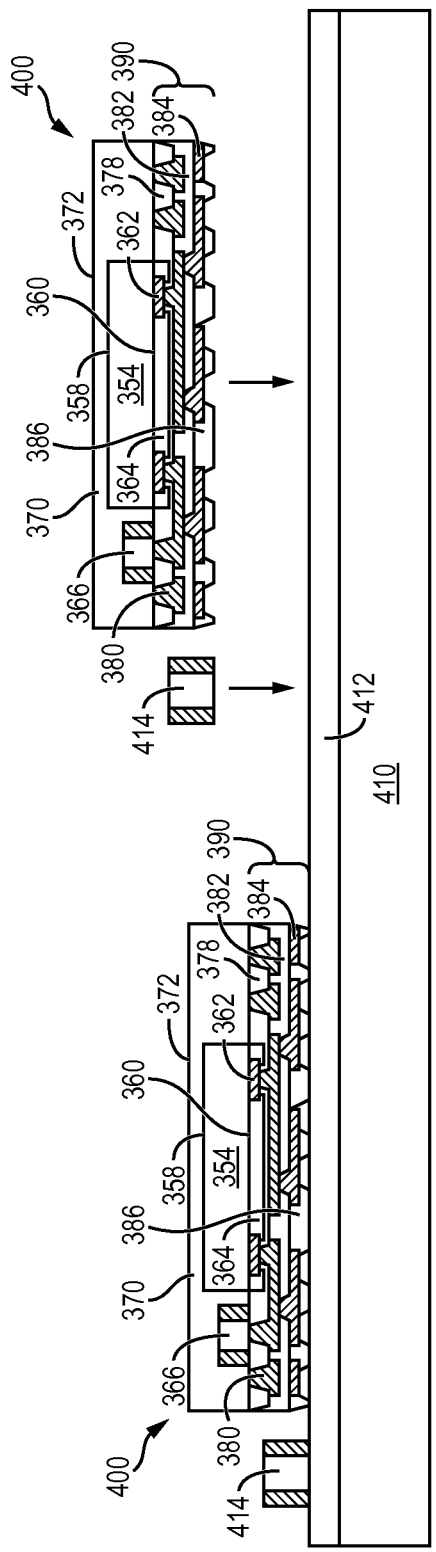
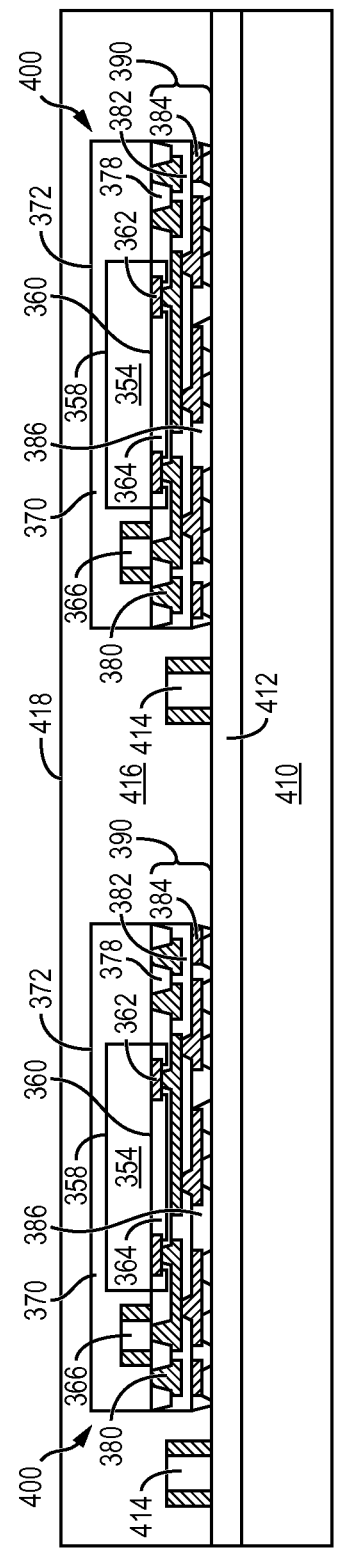
FIG. 9f
FIG. 9g

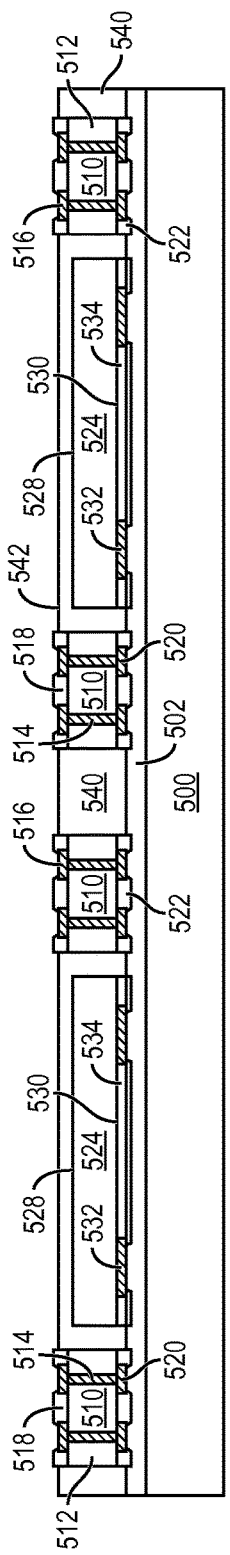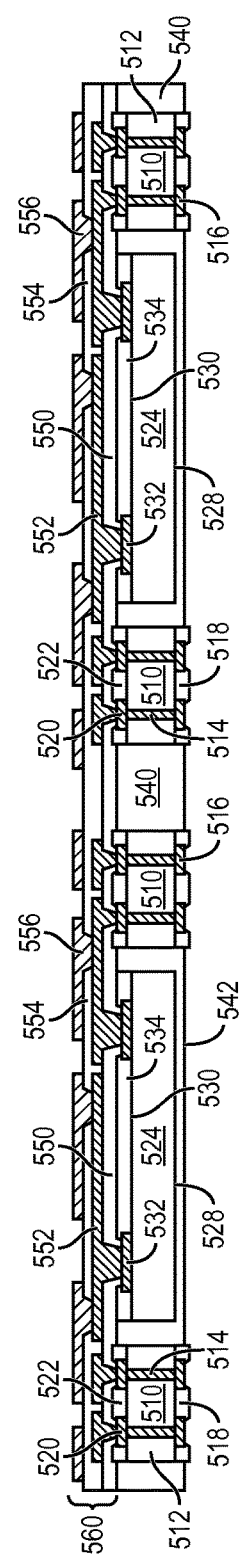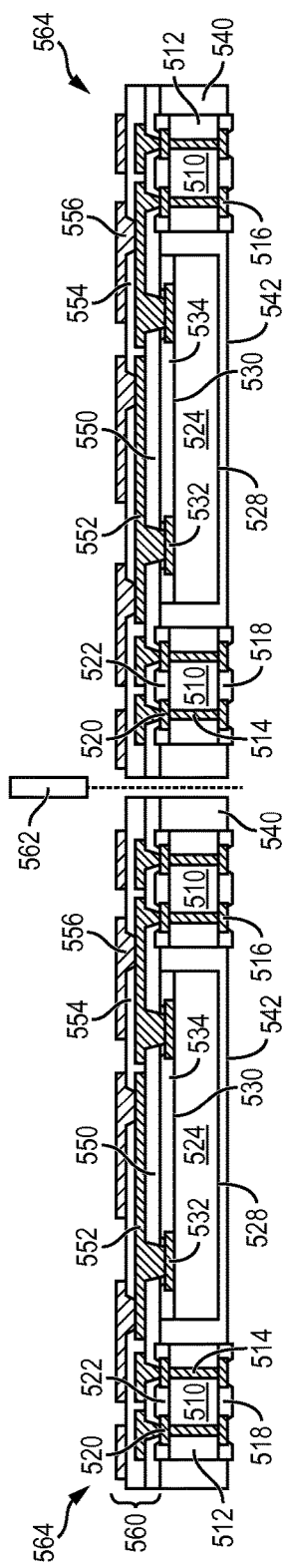

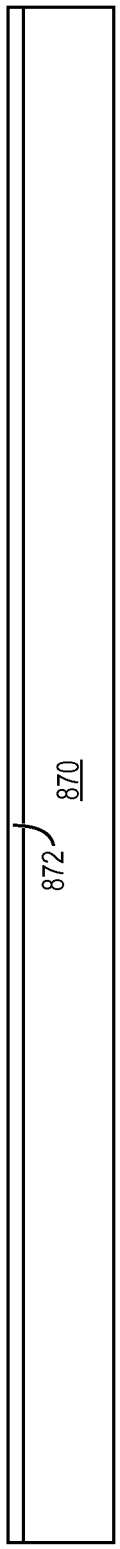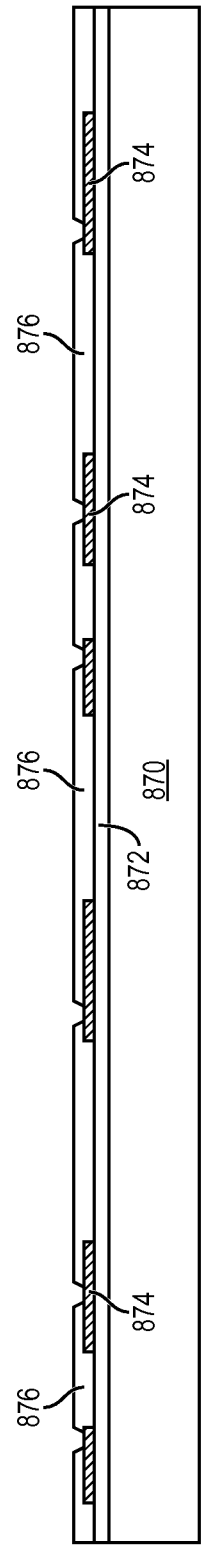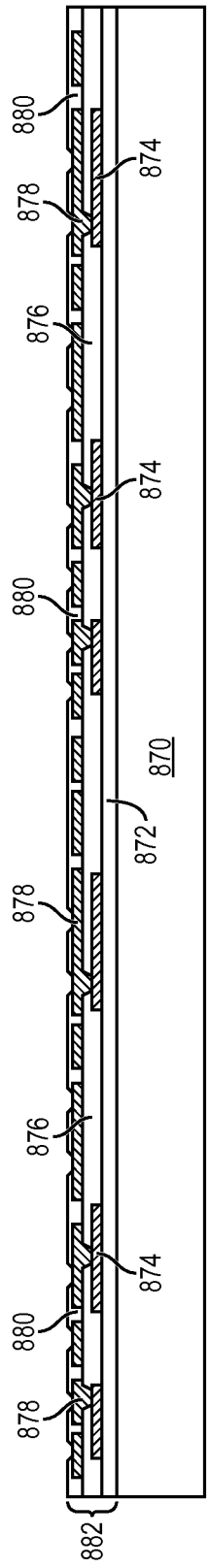

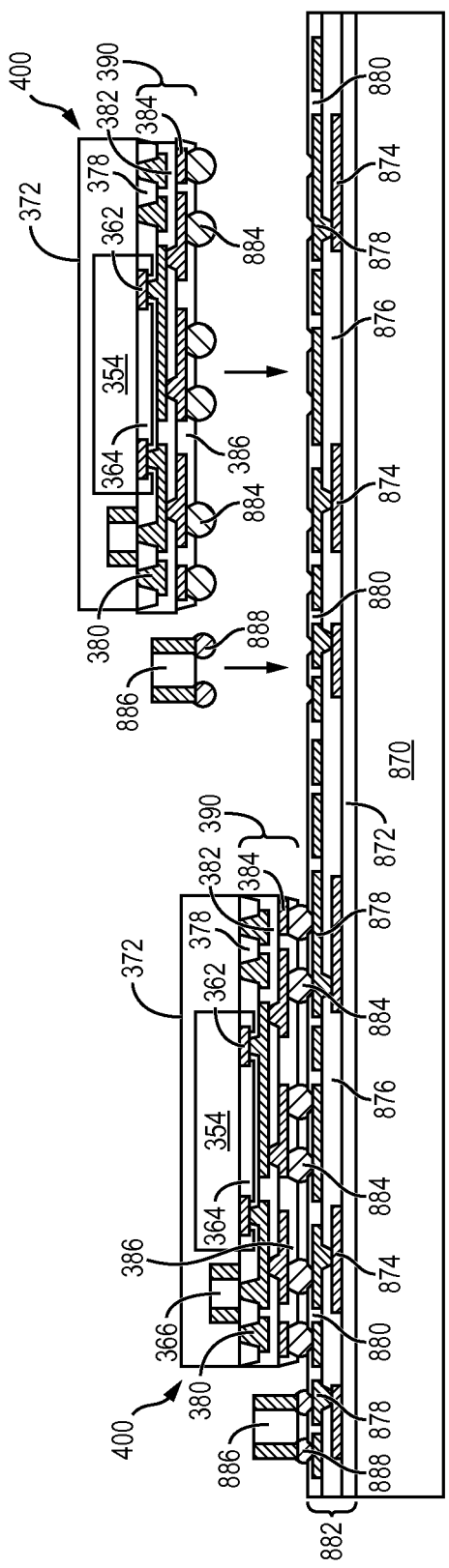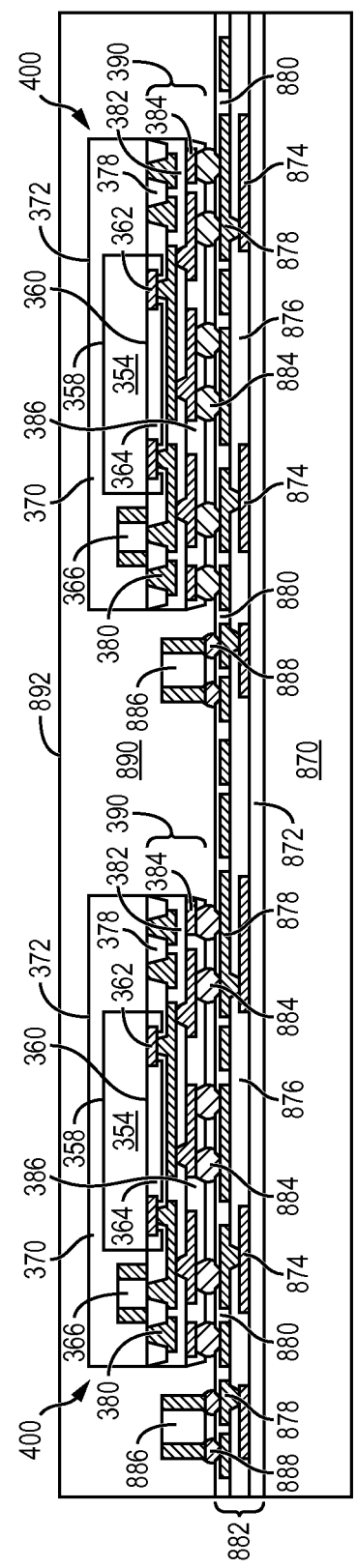

SEMICONDUCTOR DEVICE AND METHOD OF FORMING DUAL FAN-OUT SEMICONDUCTOR PACKAGE

FIELD OF THE INVENTION

The present invention relates in general to semiconductor devices and, more particularly, to a semiconductor device and method of forming a dual fan-out semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device includes active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and includes circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a fan-out wafer level chip scale package (Fo-WLCSP), an encapsulant is formed around a semiconductor die and a build-up interconnect structure is formed over the encapsulant and semiconductor die for electrical interconnect. A build-up interconnect structures with multiple redistribution layers (RDLs), e.g., three or more RDLs, is particularly susceptible to warpage. Warpage of the build-up interconnect structure can cause joint defects or failures, which reduce the reliability of the electrical connections across the Fo-WLCSP. Defects in a build-up interconnect structure lead to lower manufacturing yield and higher cost. Additionally, formation of a multilayer build-up interconnect structure including RDLs with narrow pitch and fine line spacing involves complex, expensive, and time-consuming manufacturing steps. Limiting the number of layers with narrow pitch and fine line spacing within a build-up interconnect structure can decrease manufacturing costs and reduce the potential for defects and warpage. However, forming less RDLs also reduces the number of possible interconnections and the input/output (I/O) count of the device. Additionally, a reduced number of RDLs within a build-up interconnect structure, e.g., two or less RDLs, eliminates the option of incorporating a ground plane into one of the layers.

The electrical interconnection between devices in a semiconductor package and external devices can also be accomplished by embedding a substrate containing conductive through silicon vias (TSV) or through hole vias (THV) within the semiconductor package. However, forming embedded substrates with narrow pitch and fine line spacing, e.g., less than or equal to 20 µm, is expensive and often times produces defects in the substrate, which lower manufacturing yield and increase cost. Additionally, embedded substrates experience routing difficulty when incorporating higher density semiconductor devices, e.g., semiconductor devices with a pad pitch of less than or equal to 50 µm or an array pad design. The increased pitch and wider line spacing within embedded substrates necessitates the formation of more conductive layers within the substrate to achieve the desired electrical performance. Additional conductive layers within the substrate increase overall manufacturing time and cost.

SUMMARY OF THE INVENTION

A need exists for a simple and cost-effective semiconductor package with fine line spacing, narrow pitch, and better warpage control. Accordingly, in one embodiment, the present invention is a method of making a semiconductor device comprising the steps of providing a semiconductor die, disposing a first encapsulant over the semiconductor die, forming a first conductive layer including a plurality of first conductive traces over the semiconductor die and the first encapsulant, disposing a second encapsulant over the semiconductor die, and forming a second conductive layer including a plurality of second conductive traces over the first conductive layer and the second encapsulant. A distance between the second conductive traces is greater than a distance between the first conductive traces.

In another embodiment, the present invention is a method of making a semiconductor device comprising the steps of providing a semiconductor die, forming a first conductive layer including a plurality of first conductive traces over the first semiconductor die, providing a build-up interconnect structure including a second conductive layer comprising a plurality of second conductive traces, and disposing the semiconductor die over the build-up interconnect structure. A distance between the second conductive traces is greater than or similar to a distance between the first conductive traces.

In another embodiment, the present invention is a semiconductor device comprising a first interconnect structure including a first conductive layer comprising a plurality of first conductive traces. A second interconnect structure including a second conductive layer comprising a plurality of second conductive traces is disposed over the first interconnect structure. A distance between the first conductive traces is greater than or similar to a distance between the second conductive traces. A first semiconductor die is disposed over the second interconnect structure.

In another embodiment, the present invention is a semiconductor device comprising a first substrate including a plurality of first conductive traces. A second substrate including a plurality of second conductive traces is disposed over the first substrate. A distance between the first conductive traces is greater than a distance between the second conductive traces.

BRIEF DESCRIPTION OF THE DRAWINGS

FIG. 8 illustrates the dual fan-out semiconductor device according to FIGS. 7a-7l;

FIGS. 9a-9i illustrate a process of forming a dual fan-out semiconductor device including embedded passive devices;

FIGS. 11a-11h illustrate a process of forming a dual fan-out semiconductor device including embedded 3D interconnect structures;

FIGS. 15a-15g illustrate another process of forming a dual fan-out semiconductor device;

DETAILED DESCRIPTION OF THE DRAWINGS

Figure 1:
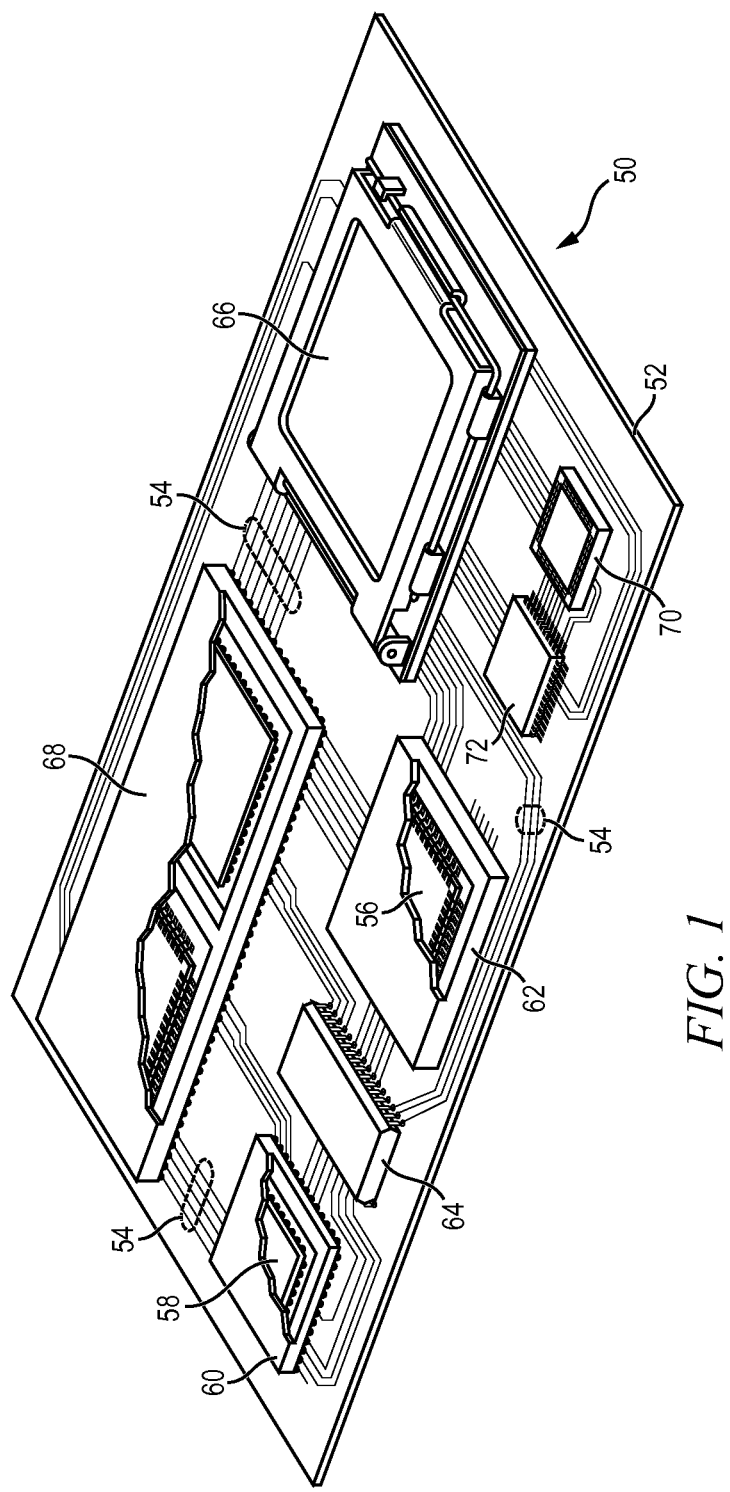
FIG. 1 illustrates a printed circuit board (PCB) with different types of packages mounted to the surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the disclosure is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate PCB 52 with a plurality of semiconductor packages mounted on the surface of the PCB. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
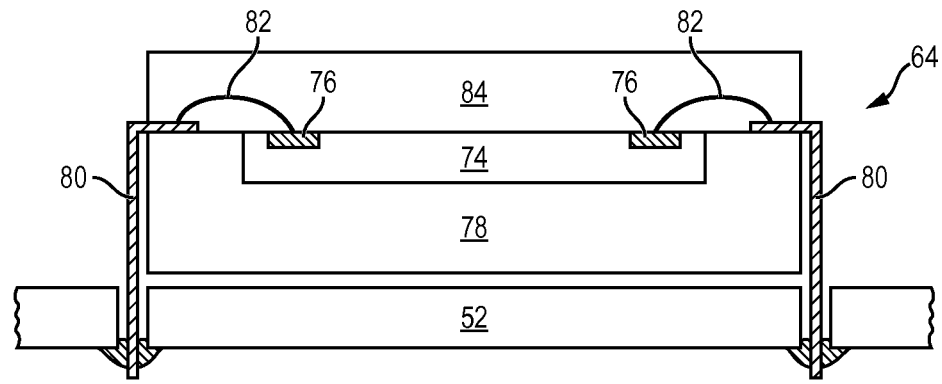
FIGS. 2a-2c illustrate further detail of the representative semiconductor packages mounted to the PCB.
Figure 2B:
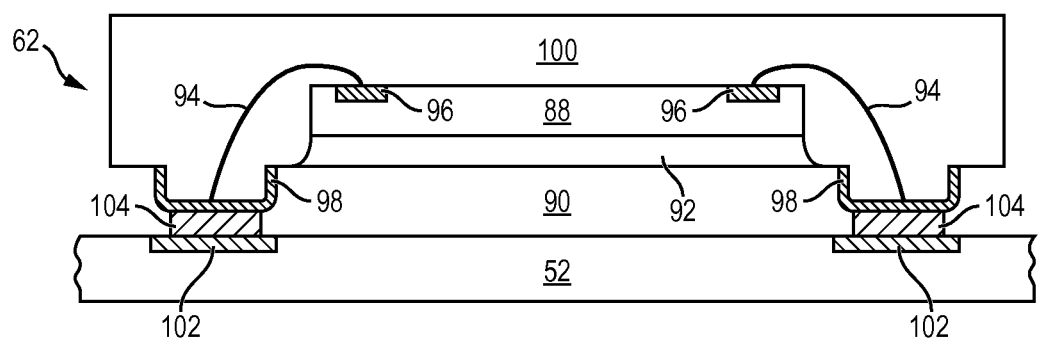
Figure 2C:
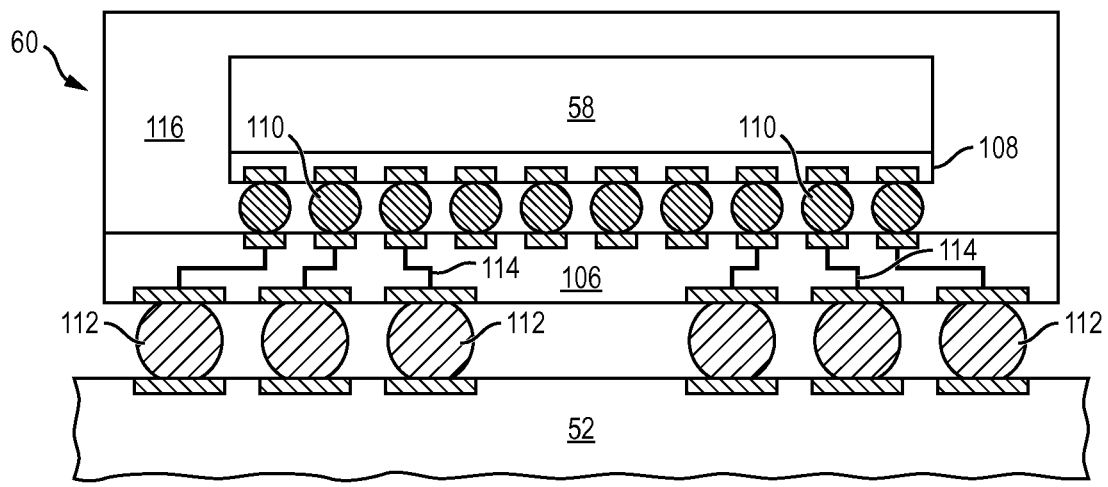

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
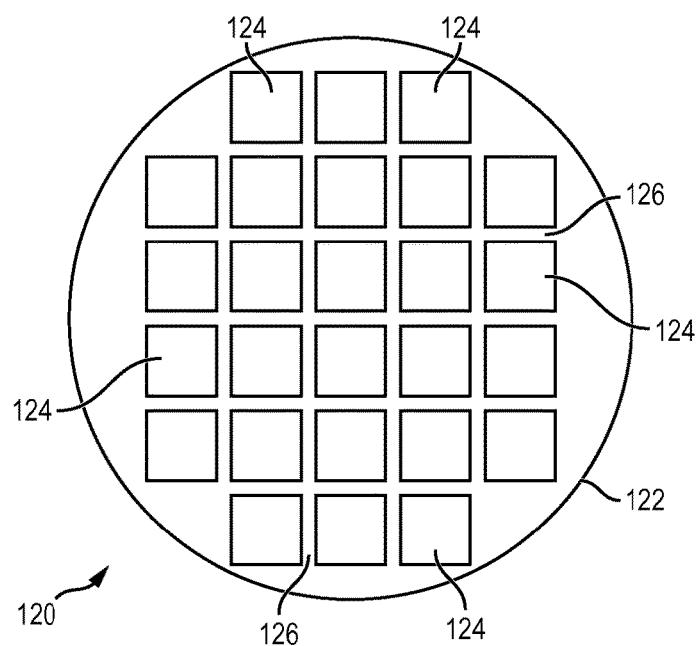
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 3B:
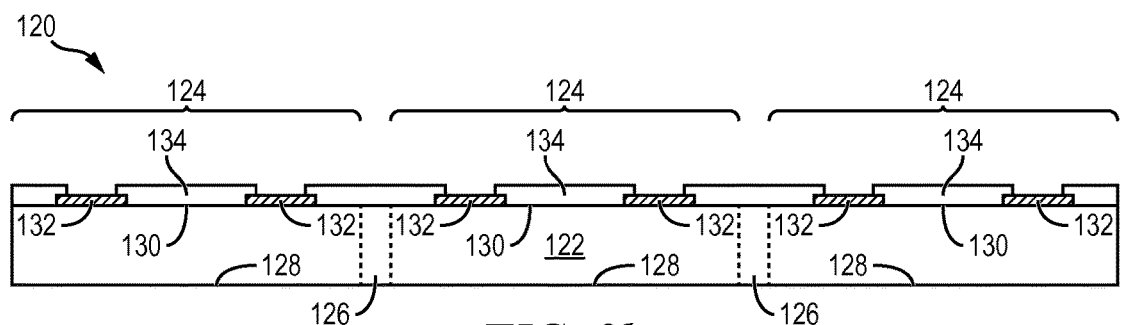

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 for electrical isolation using PVD, CVD, printing, spin coating, spray coating, sintering, or thermal oxidation. The insulating layer 134 contains one or more layers of solder resist, silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 134 can be removed by an etching process through a photoresist layer to expose conductive layer 132.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 132 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3C:
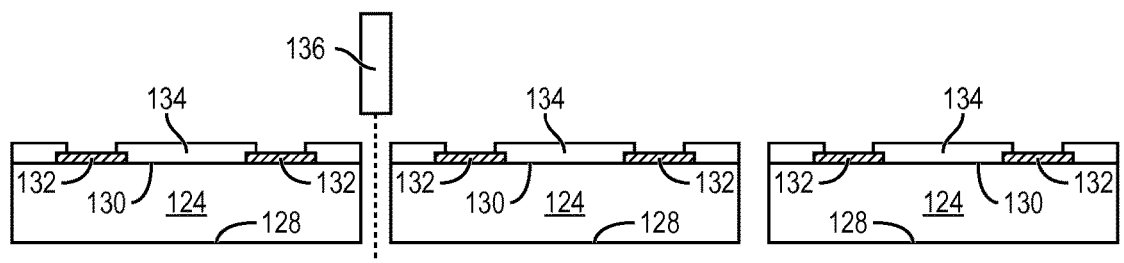

In FIG. 3c, semiconductor wafer 120 is singulated through saw street 126 using a saw blade or laser cutting tool 136 into individual semiconductor die 124. The individual semiconductor die 124 can be inspected and electrically tested for identification of KGD post singulation.

Figure 4A:
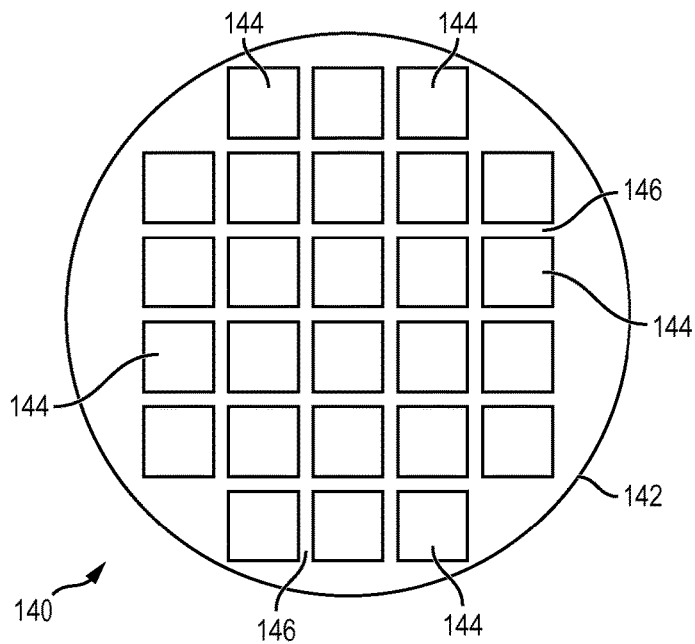
FIGS. 4a-4c illustrate a semiconductor wafer with a plurality of semiconductor die separated by a saw street.

FIG. 4a shows a semiconductor wafer 140 with a base substrate material 142, such as Si, Ge, GaAs, InP, or SiC, for structural support. A plurality of semiconductor die or components 144 is formed on wafer 140 separated by a non-active, inter-die wafer area or saw street 146 as described above. Saw street 146 provides cutting areas to singulate semiconductor wafer 140 into individual semiconductor die 144. In one embodiment, semiconductor wafer 140 has a width or diameter of 200-300 mm. In another embodiment, semiconductor wafer 140 has a width or diameter of 100-450 mm.

Figure 4B:
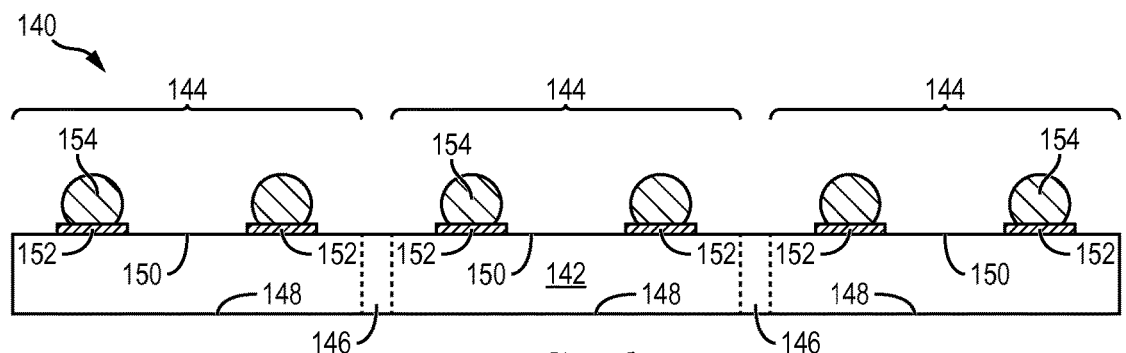

FIG. 4b shows a cross-sectional view of a portion of semiconductor wafer 140. Each semiconductor die 144 has a back or non-active surface 148 and active surface 150 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 150 to implement analog circuits or digital circuits, such as DSP, ASIC, memory, or other signal processing circuit. Semiconductor die 144 may also contain IPDs, such as inductors, capacitors, and resistors, for RF signal processing. In one embodiment, semiconductor die 144 is a flipchip type device.

An electrically conductive layer 152 is formed over active surface 150 using PVD, CVD, electrolytic plating, electroless plating process, or other suitable metal deposition process. Conductive layer 152 can be one or more layers of Al, Cu, Sn, Ni, Au, Ag, or other suitable electrically conductive material. Conductive layer 152 operates as contact pads electrically connected to the circuits on active surface 150. Conductive layer 152 can be formed as contact pads disposed side-by-side a first distance from the edge of semiconductor die 144, as shown in FIG. 4b. Alternatively, conductive layer 152 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over contact pads 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 152 using a suitable attachment or bonding process. In one embodiment, the bump material is reflowed by heating the material above the material's melting point to form balls or bumps 154. In some applications, bumps 154 are reflowed a second time to improve electrical contact to contact pads 152. Bumps 154 can also be compression bonded or thermocompression bonded to contact pads 152. Bumps 154 represent one type of interconnect structure that can be formed over contact pads 152. The interconnect structure can also use stud bump, micro bump, or other electrical interconnect.

Semiconductor wafer 140 undergoes electrical testing and inspection as part of a quality control process. Manual visual inspection and automated optical systems are used to perform inspections on semiconductor wafer 140. Software can be used in the automated optical analysis of semiconductor wafer 140. Visual inspection methods may employ equipment such as a scanning electron microscope, high-intensity or ultra-violet light, or metallurgical microscope. Semiconductor wafer 140 is inspected for structural characteristics including warpage, thickness variation, surface particulates, irregularities, cracks, delamination, and discoloration.

The active and passive components within semiconductor die 144 undergo testing at the wafer level for electrical performance and circuit function. Each semiconductor die 144 is tested for functionality and electrical parameters using a probe or other testing device. A probe is used to make electrical contact with nodes or contact pads 152 on each semiconductor die 144 and provides electrical stimuli to the contact pads. Semiconductor die 144 responds to the electrical stimuli, which is measured and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 140 enables semiconductor die 144 that pass to be designated as KGD for use in a semiconductor package.

Figure 4C:
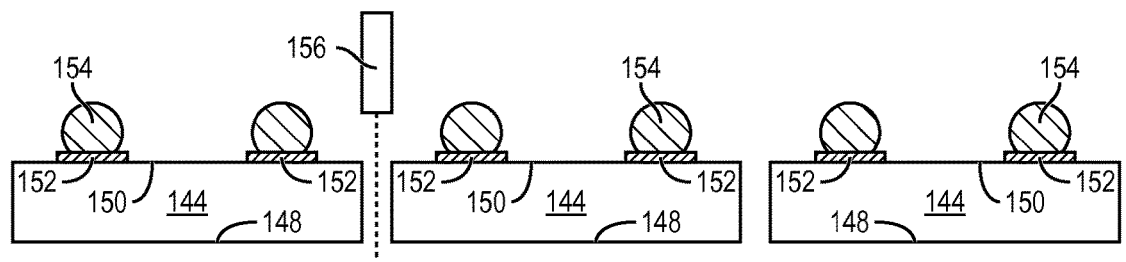

In FIG. 4c, semiconductor wafer 140 is singulated through saw street 146 using saw blade or laser cutting tool 156 into individual semiconductor die 144. Each semiconductor die 144 has bumps 154 formed over contact pads 152. The individual semiconductor die 144 can be inspected and electrically tested for identification of KGD post singulation.

Figure 5D:
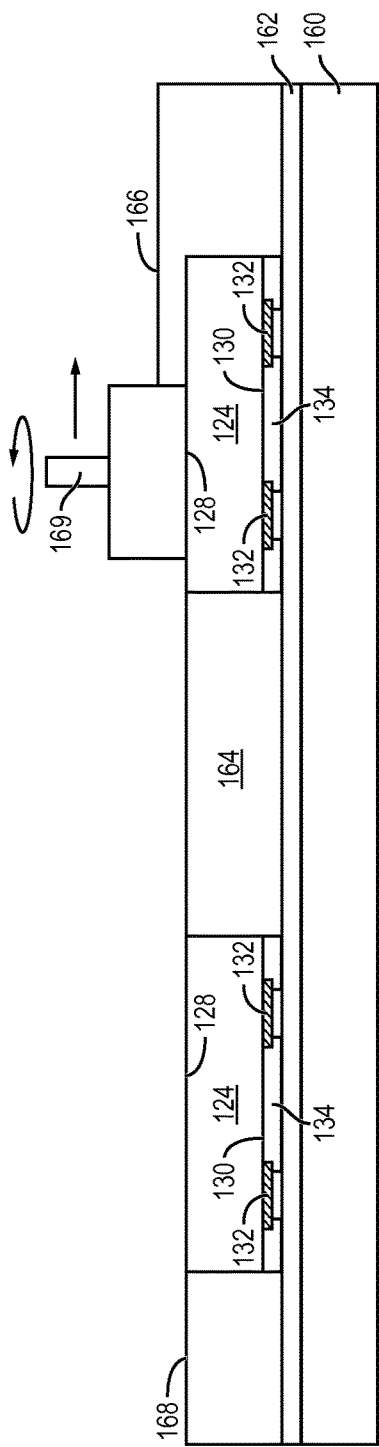
FIGS. 5a-5s illustrate a process of forming a dual fan-out semiconductor device.
Figure 5E:
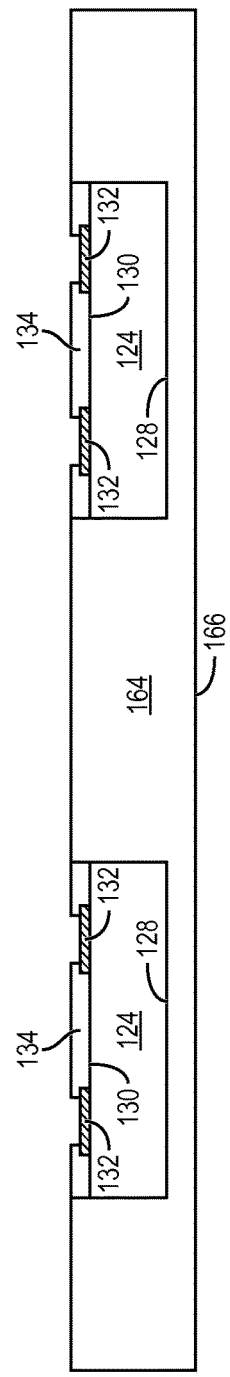
Figure 5F:
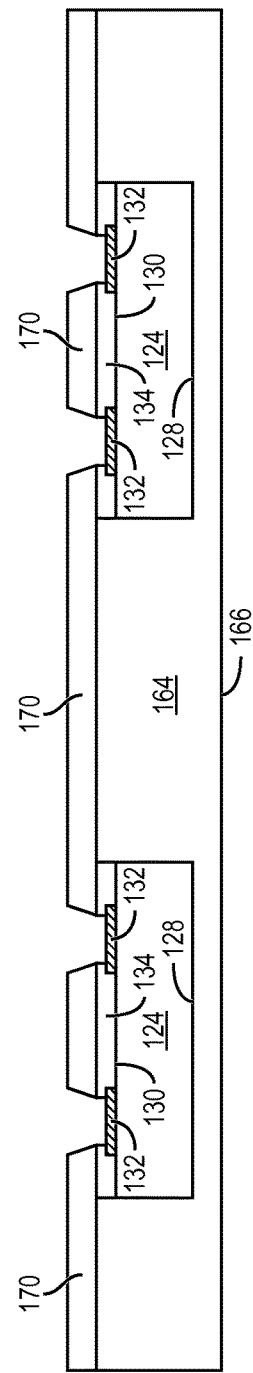
Figure 5G:
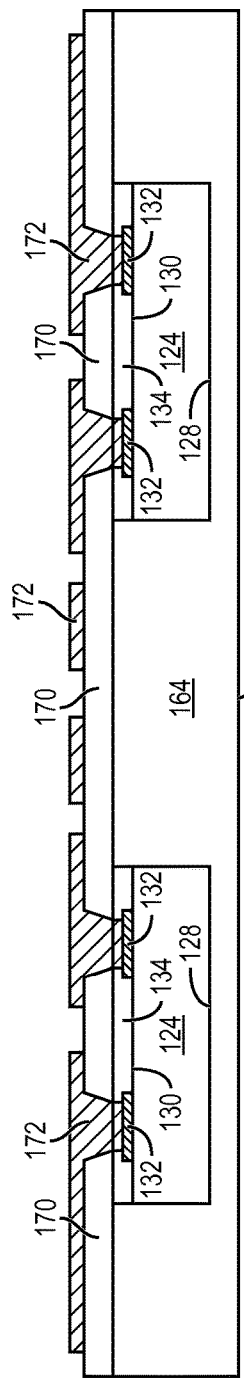
Figure 5H:
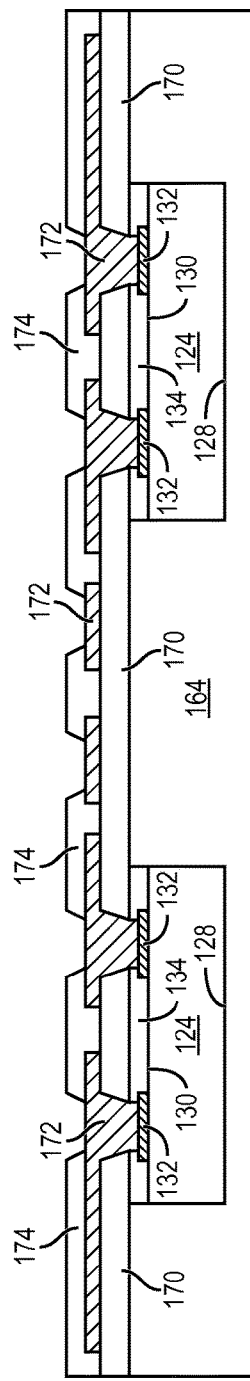
Figure 5I:
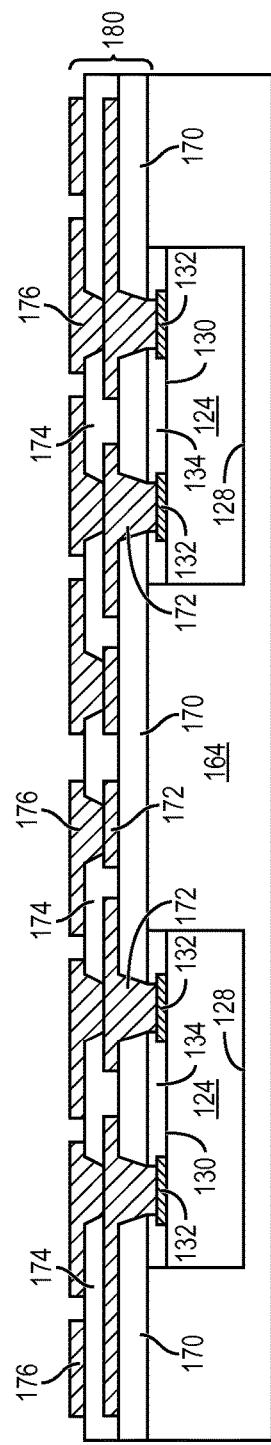
Figure 5J:
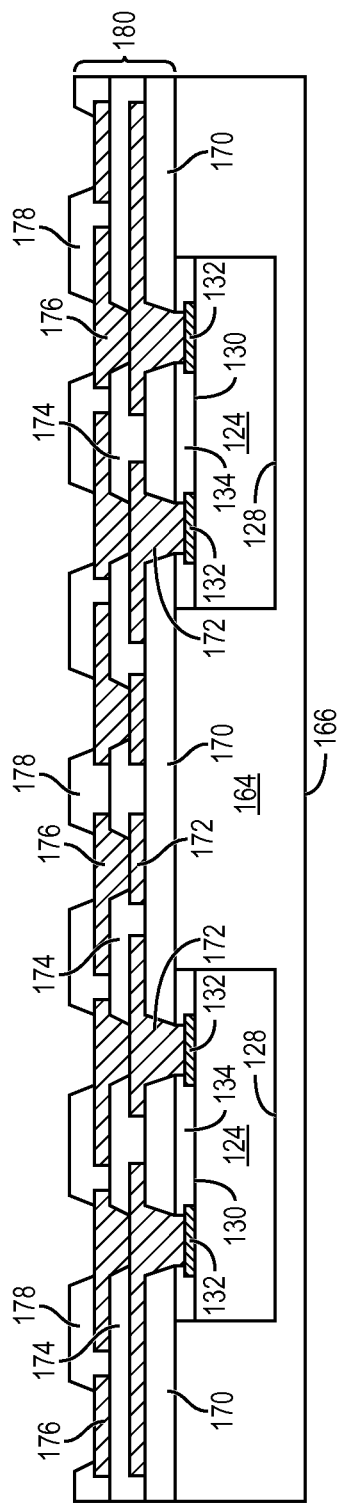
Figure 5K:
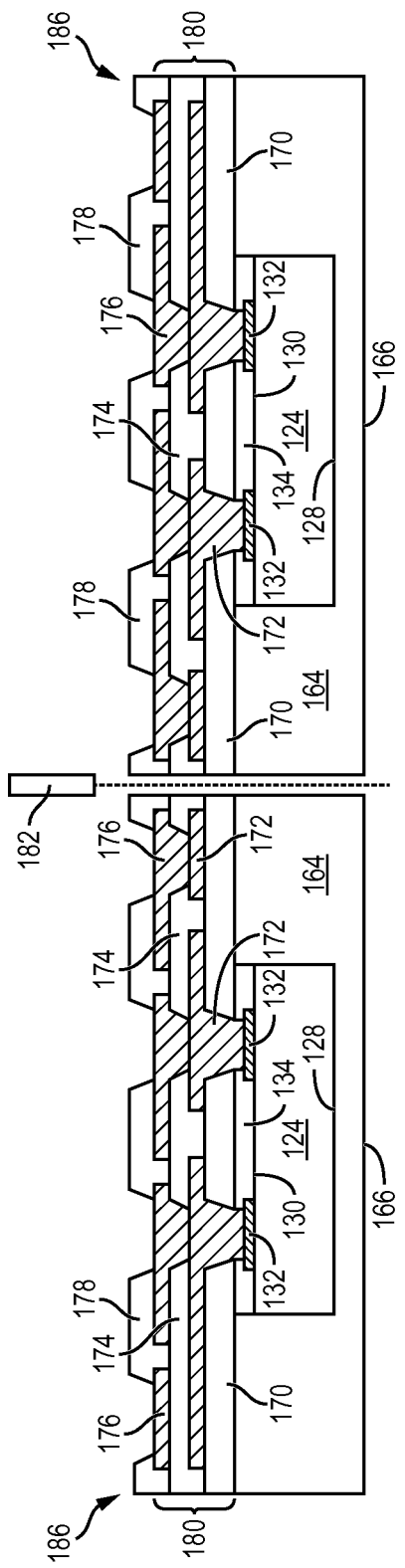
Figure 5N:
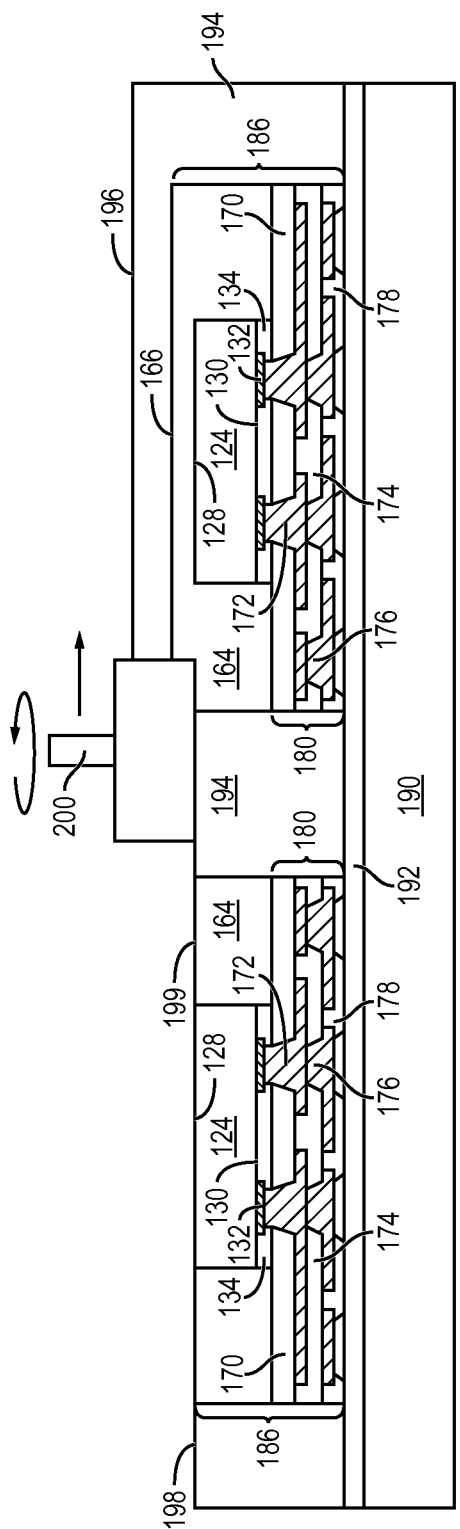
Figure 5O:
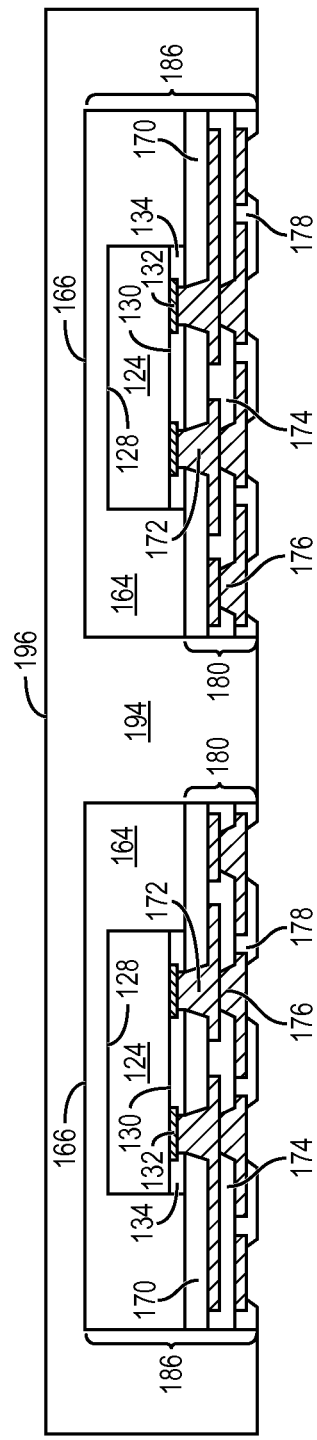
Figure 5P:
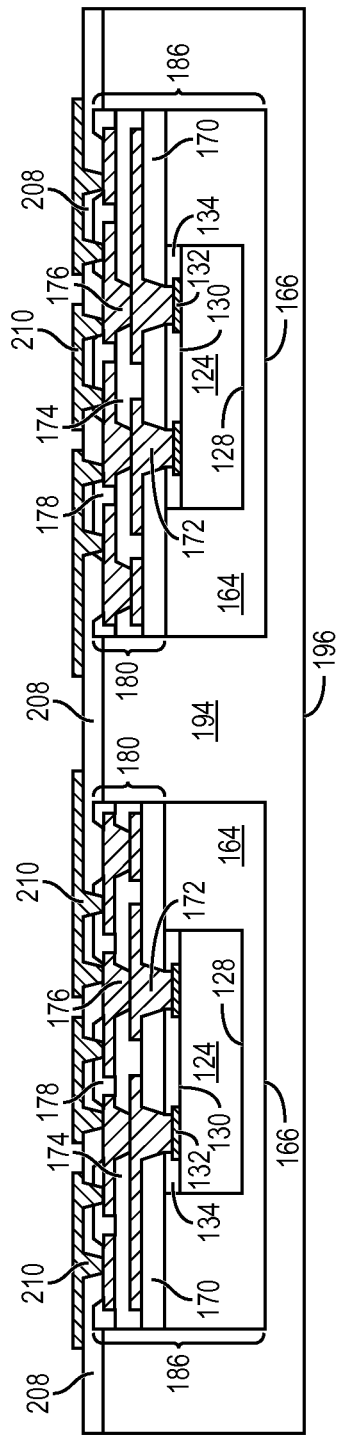
Figure 5Q:
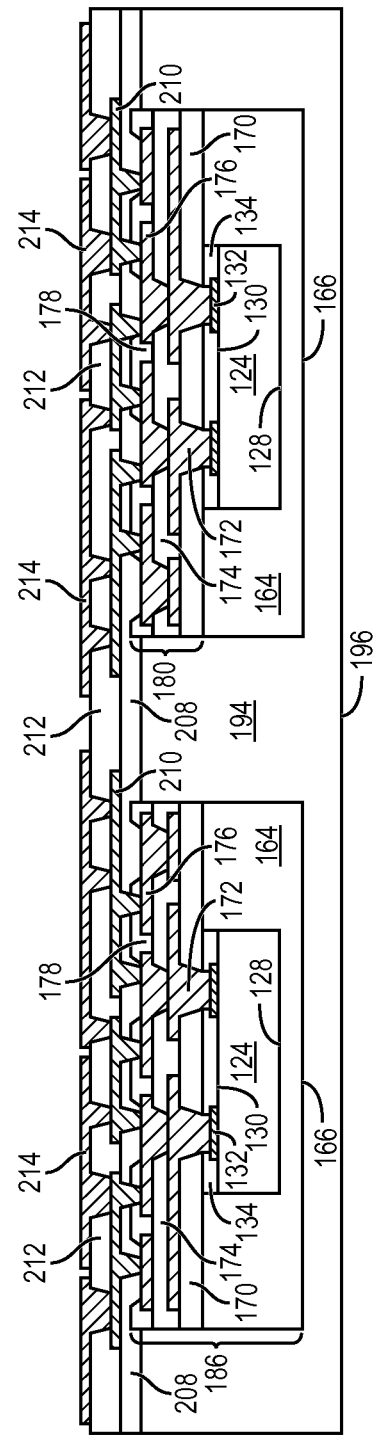
Figure 5R:
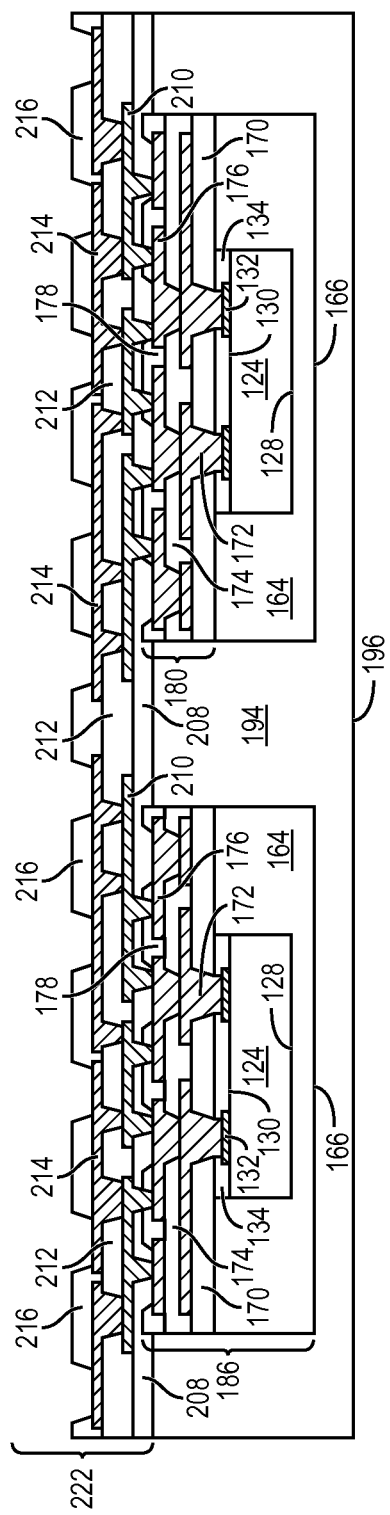
Figure 5S:
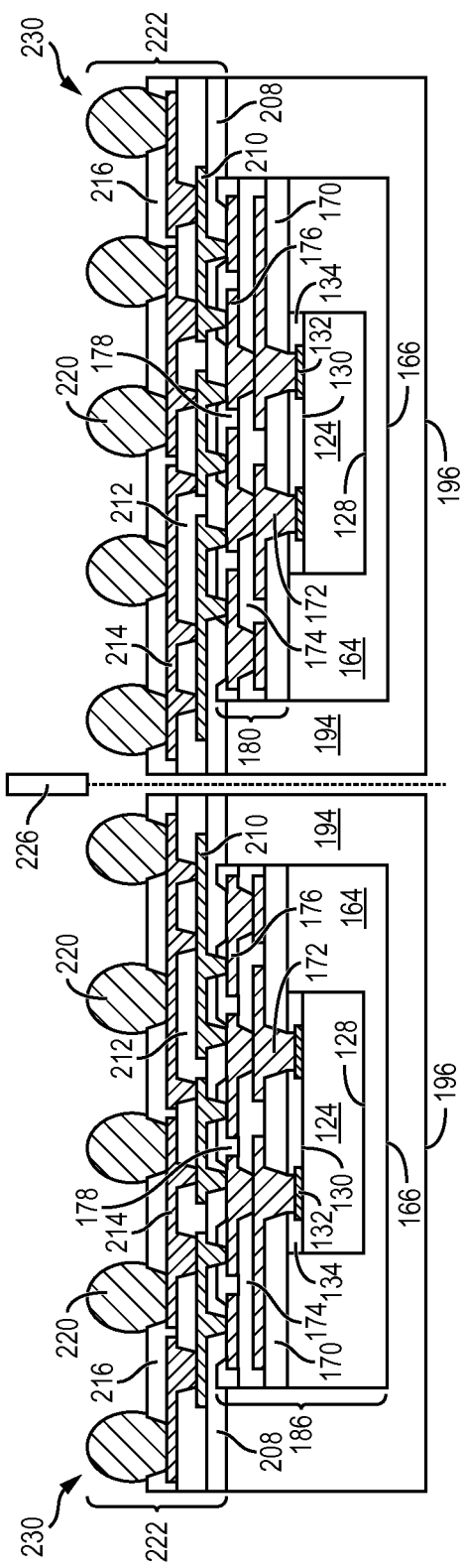

FIGS. 5a-5s illustrate, in relation to FIGS. 1 and 2a-2c, a process of forming a dual fan-out semiconductor device. FIG. 5a shows a cross-sectional view of a portion of a carrier or temporary substrate 160 containing sacrificial base material such as silicon, polymer, beryllium oxide, glass, or other suitable low-cost, rigid material for structural support. An interface layer or double-sided tape 162 is formed over carrier 160 as a temporary adhesive bonding film, etch-stop layer, or thermal release layer.

Carrier 160 can be a round or rectangular panel (greater than 300 mm) with capacity for multiple semiconductor die 124. Carrier 160 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 160 is selected independent of the size of semiconductor die 124 or size of semiconductor wafer 120. That is, carrier 160 has a fixed or standardized size, which can accommodate various size semiconductor die 124 singulated from one or more semiconductor wafers 120. In one embodiment, carrier 160 is circular with a diameter of 330 mm. In another embodiment, carrier 160 is rectangular with a width of 560 mm and length of 600 mm. Semiconductor die 124 may have dimensions of 10 mm by 10 mm, which are placed on the standardized carrier 160. Alternatively, semiconductor die 124 may have dimensions of 20 mm by 20 mm, which are placed on the same standardized carrier 160. Accordingly, standardized carrier 160 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 160 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

Semiconductor die 124 from FIG. 3c are mounted to carrier 160 and interface layer 162 using, for example, a pick and place operation with active surface 130 oriented toward the carrier. FIG. 5b shows semiconductor die 124 mounted to interface layer 162 of carrier 160.

In FIG. 5c, an encapsulant or molding compound 164 is deposited over and around semiconductor die 124 using a paste printing, compressive molding, transfer molding, liquid encapsulant molding, vacuum lamination, spin coating, or other suitable applicator. In particular, encapsulant 164 covers the four side surfaces and back surface 128 of semiconductor die 124. Encapsulant 164 can be polymer composite material, such as epoxy resin with filler, epoxy acrylate with filler, or polymer with proper filler. Encapsulant 164 is non-conductive and environmentally protects the semiconductor die from external elements and contaminants. Encapsulant 164 also protects semiconductor die 124 from degradation due to exposure to light. The filler and coefficient of thermal expansion (CTE) of encapsulant 164 is selected to aid with gap filling, warpage control, and reliability.

In FIG. 5d, a portion of back surface 166 of encapsulant 164 is removed by grinder 169 in an optional backgrinding operation. The backgrinding operation reduces a thickness of encapsulant 164 and may expose back surface 128 of semiconductor die 124. In FIG. 5d, surface 168 of encapsulant 164 is co-planar with surface 128 of semiconductor die 124 after backgrinding.

Continuing from FIG. 5c, carrier 160 and interface layer 162 are removed by chemical etching, mechanical peeling, chemical mechanical polishing (CMP), mechanical grinding, thermal bake, UV light, laser scanning, or wet stripping to expose conductive layer 132 and insulating layer 134 of semiconductor die 124, as shown in FIG. 5e.

In FIG. 5f, an insulating or passivation layer 170 is formed over encapsulant 164 and insulating layer 134 and conductive layer 132 of semiconductor die 124 using PVD, CVD, printing, lamination, spin coating, spray coating, sintering, or thermal oxidation. The insulating layer 170 contains one or more layers of SiO2, Si3N4, SiON, Ta2O5, Al2O3, low temperature (less than 250° C.) curing polymer dielectric materials, or other material having similar insulating and structural properties. A portion of insulating layer 170 is removed by an exposure and development process, laser direct ablation (LDA), etching, or other suitable process to expose conductive layer 132.

In FIG. 5g, an electrically conductive layer or RDL 172 is formed over conductive layer 132 and insulating layer 170 using PVD, CVD, electrolytic plating, electroless plating process, or other suitable metal deposition process. Conductive layer 172 can be one or more layers of Al, Ti, TiW, Cu, Sn, Ni, Au, Ag, or other suitable electrically conductive material. One portion of conductive layer 172 is electrically connected to conductive layer 132 of semiconductor die 124. Other portions of conductive layer 172 can be electrically common or electrically isolated depending on the design and function of semiconductor die 124. Conductive layer 172 includes a plurality of conductive traces. The conductive traces of conductive layer 172 are formed with narrow pitch and fine line spacing. For example, the conductive traces of conductive layer 172 are formed with a minimum line spacing of 5 micrometers (μm), i.e., the minimum distance between the edges of adjacent conductive traces within conductive layer 172 is 5 μm. In one embodiment, conductive layer 172 has a minimum line spacing or minimum distance between adjacent conductive traces of greater than or equal to 10 μm. The narrow pitch and fine line spacing of the conductive traces within conductive layer 172 creates space for more conductive traces over semiconductor die 124 and encapsulant 164.

In FIG. 5h, an insulating or passivation layer 174 is formed over insulating layer 170 and conductive layer 172 using PVD, CVD, printing, lamination, spin coating, spray coating, sintering, or thermal oxidation. The insulating layer 174 contains one or more layers of SiO2, Si3N4, SiON, Ta2O5, Al2O3, low temperature (less than 250° C.) curing polymer dielectric materials, or other material having similar insulating and structural properties. A portion of insulating layer 174 is removed by an exposure and development process, LDA, etching, or other suitable process to expose conductive layer 172.

In FIG. 5i, an electrically conductive layer or RDL 176 is formed over conductive layer 172 and insulating layer 174 using PVD, CVD, electrolytic plating, electroless plating process, or other suitable metal deposition process. Conductive layer 176 can be one or more layers of Al, Ti, TiW, Cu, Sn, Ni, Au, Ag, or other suitable electrically conductive material. One portion of conductive layer 176 is electrically connected to conductive layer 172. Other portions of conductive layer 176 can be electrically common or electrically isolated depending on the design and function of semiconductor die 124. Conductive layer 176 includes a plurality of conductive traces. The conductive traces of conductive layer 176 are formed with narrow pitch and fine line spacing. For example, the conductive traces of conductive layer 176 are formed with a minimum line spacing of 5 μm, i.e., the minimum distance between the edges of adjacent conductive traces within conductive layer 176 is 5 μm. In one embodiment, conductive layer 176 has a minimum line spacing or minimum distance between adjacent conductive traces of greater than or equal to 10 μm. The narrow pitch and fine line spacing of the conductive traces within conductive layer 176 creates space for more conductive traces over semiconductor die 124 and encapsulant 164.

In FIG. 5j, an optional insulating or passivation layer 178 is formed over insulating layer 174 and conductive layer 176 using PVD, CVD, printing, lamination, spin coating, spray coating, sintering, or thermal oxidation. The insulating layer 178 contains one or more layers of SiO2, Si3N4, SiON, Ta2O5, Al2O3, low temperature (less than 250° C.) curing polymer dielectric materials, or other material having similar insulating and structural properties. A portion of insulating layer 178 is removed by an exposure and development process, LDA, etching, or other suitable process to expose conductive layer 176.

The combination of insulating layer 170, conductive layer 172, insulating layer 174, conductive layer 176, and insulating layer 178 constitutes a build-up interconnect structure 180 formed over semiconductor die 124 and encapsulant 164. Conductive layers 172 and 176 and insulating layers 170, 174, and 178 may include an IPD, such as a capacitor, inductor, or resistor. Build-up interconnect structure 180 is formed using narrow pitch and fine line spacing technology, e.g., photosensitive dielectric resist and selectively plated Cu, and the conductive traces within build-up interconnect structure 180 can have a line spacing as narrow as 5 μm. In one embodiment, the minimum line spacing of the conductive traces in build-up interconnect structure 180 is greater than or equal to 10 μm. The narrow pitch and fine line spacing of the conductive traces of conductive layers 172 and 176 creates space for a higher number of conductive traces within build-up interconnect structure 180. The increased density of conductive traces increases the number of possible interconnections sites and I/O terminal count of build-up interconnect structure 180. Thus, build-up interconnect structure 180 can be formed over semiconductor die that require an increased number of electrical interconnection sites. The narrow pitch and fine line spacing of the conductive traces within build-up interconnect structure 180 increases the conductive trace density and I/O of build-up interconnect structure 180, without requiring the formation of additional RDLs. In one embodiment, build-up interconnect structure 180 includes three or less RDLs. The limited number of RDLs within build-up interconnect structure 180 allows for a smaller and thinner overall semiconductor package, reduces warpage, and increases the speed of the device.

Semiconductor die 124 and build-up interconnect structure 180 represent a Fo-WLCSP in reconstituted wafer form. In FIG. 5k, the reconstituted wafer is singulated through build-up interconnect structure 180 and encapsulant 164 using a saw blade or laser cutting tool 182 into individual Fo-WLCSP 186 containing semiconductor die 124.

In FIG. 5l Fo-WLCSP 186 from FIG. 5k are mounted to a carrier or temporary substrate 190 with conductive layer 176 of Fo-WLCSP 186 oriented toward the carrier. Carrier or temporary substrate 190 contains sacrificial base material such as silicon, polymer, beryllium oxide, glass, or other suitable low-cost, rigid material for structural support. An interface layer or double-sided tape 192 is formed over carrier 190 as a temporary adhesive bonding film, etch-stop layer, or thermal release layer.

Carrier 190 can be a round or rectangular panel (greater than 300 mm) with capacity for multiple Fo-WLCSP 186. Carrier 190 may have a larger surface area than the surface area of the reconstituted wafer containing semiconductor die 124 and build-up interconnect structure 180. A larger carrier reduces the manufacturing cost of the semiconductor package as more semiconductor packages can be processed on the larger carrier thereby reducing the cost per unit. Semiconductor packaging and processing equipment are designed and configured for the size of the wafer or carrier being processed.

To further reduce manufacturing costs, the size of carrier 190 is selected independent of the size of Fo-WLCSP 186 or the size of the reconstituted wafer containing semiconductor die 124 and build-up interconnect structure 180. That is, carrier 190 has a fixed or standardized size, which can accommodate various size semiconductor packages 186 singulated from one or more reconstituted wafers. In one embodiment, carrier 190 is circular with a diameter of 330 mm. In another embodiment, carrier 190 is rectangular with a width of 560 mm and length of 600 mm. Standardized carrier 190 can handle any size Fo-WLCSP 186, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 190 lowers manufacturing costs and capital risk by reducing or eliminating the need for specialized semiconductor processing lines based on die size or incoming wafer size. By selecting a predetermined carrier size to use for any size semiconductor package from all semiconductor wafer, a flexible manufacturing line can be implemented.

In FIG. 5m, an encapsulant or molding compound 194 is deposited over and around Fo-WLCSP 186 using a paste printing, compressive molding, transfer molding, liquid encapsulant molding, vacuum lamination, spin coating, or other suitable applicator. Encapsulant 194 can be polymer composite material, such as epoxy resin with filler, epoxy acrylate with filler, or polymer with proper filler. Encapsulant 194 is non-conductive and environmentally protects the semiconductor device from external elements and contaminants. Encapsulant 194 also protects semiconductor die 124 from degradation due to exposure to light. The filler and CTE of encapsulant 194 are selected to aid with gap filling, warpage control, and reliability. Prior to forming encapsulant 194, a backgrinding operation and/or an RF etching, plasma clean, solvent strip, or wet clean process is performed on Fo-WLCSP 186 to roughen the surfaces of encapsulant 164 and build-up interconnect structure 180 and improve adhesion of encapsulant 194. In one embodiment, encapsulant 164 and/or encapsulant 194 include a controlled stress-releasing agent to improve adhesion of encapsulant 194.

In FIG. 5n, a portion of back surface 196 of encapsulant 194 and a portion of back surface 166 of encapsulant 164 are removed by grinder 200 in an optional backgrinding operation. The backgrinding operation reduces a thickness of encapsulants 194 and 164 and may expose back surface 128 of semiconductor die 124. In FIG. 5n, surface 198 of encapsulant 194 and surface 199 of encapsulant 164 are co-planar with surface 128 of semiconductor die 124 after the backgrinding operation.

Continuing from FIG. 5m, carrier 190 and interface layer 192 are removed by chemical etching, mechanical peeling, CMP, mechanical grinding, thermal bake, UV light, laser scanning, or wet stripping leaving conductive layer 176 and insulating layer 178 of Fo-WLCSP 186 exposed from encapsulant 194, as shown in FIG. 5o.

In FIG. 5p, an insulating or passivation layer 208 is formed over insulating layer 178, conductive layer 176, and encapsulant 194 using PVD, CVD, printing, lamination, spin coating, spray coating, sintering, or thermal oxidation. The insulating layer 208 contains one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, the material of insulating layer 208 is selected to be the same as the material of insulating layer 178 of build-up interconnect structure 180. A portion of insulating layer 208 is removed by an exposure and development process, LDA, etching, or other suitable process to expose conductive layer 176 of Fo-WLCSP 186.

An electrically conductive layer or RDL 210 is formed over insulating layer 208 and conductive layer 176 using PVD, CVD, electrolytic plating, electroless plating process, or other suitable metal deposition process. Conductive layer 210 can be one or more layers of Al, Ti, TiW, Cu, Sn, Ni, Au, Ag, or other suitable electrically conductive material. One portion of conductive layer 210 is electrically connected to conductive layer 176 of Fo-WLCSP 186. Other portions of conductive layer 210 can be electrically common or electrically isolated depending on the design and function of semiconductor die 124. Conductive layer 210 includes a plurality of conductive traces. The conductive traces within conductive layer 210 are formed with a larger pitch and wider line spacing than the conductive traces within build-up interconnect structure 180, i.e., conductive traces within conductive layer 210 have a larger pitch than the conductive traces within build-up interconnect structure 180 and the distance between the edges of adjacent conductive traces within conductive layer 210 is greater than the distance between the edges of adjacent conductive traces within build-up interconnect structure 180. For example, the conductive traces within conductive layer 210 have a minimum line spacing, or distance between adjacent conductive traces, of 15 μm. In one embodiment, the minimum line spacing of the conductive traces within conductive layer 210 is greater than or equal to 30 μm and the minimum line spacing of the conductive traces within build-up interconnect structure 180 is greater than or equal to 10 μm.

In FIG. 5q, an insulating or passivation layer 212 is formed over insulating layer 208 and conductive layer 210 using PVD, CVD, printing, lamination, spin coating, spray coating, sintering, or thermal oxidation. The insulating layer 212 contains one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. A portion of insulating layer 212 is removed by an exposure and development process, LDA, etching, or other suitable process to expose conductive layer 210.

An electrically conductive layer or RDL 214 is formed over insulating layer 212 and conductive layer 210 using PVD, CVD, electrolytic plating, electroless plating process, or other suitable metal deposition process. Conductive layer 214 can be one or more layers of Al, Ti, TiW, Cu, Sn, Ni, Au, Ag, or other suitable electrically conductive material. One portion of conductive layer 214 is electrically connected to conductive layer 210. Other portions of conductive layer 214 can be electrically common or electrically isolated depending on the design and function of semiconductor die 124. Conductive layer 214 includes a plurality of conductive traces. The conductive traces within conductive layer 214 are formed with a larger pitch and wider line spacing than the conductive traces within build-up interconnect structure 180. For example, the conductive traces within conductive layer 214 have a minimum line spacing of 15 μm. In one embodiment, the minimum line spacing of the conductive traces within conductive layer 214 is greater than or equal to 30 μm and the minimum line spacing of the conductive traces within build-up interconnect structure 180 is greater than or equal to 10 μm.

In FIG. 5r, an insulating or passivation layer 216 is formed over insulating layer 212 and conductive layer 214 using PVD, CVD, printing, lamination, spin coating, spray coating, sintering, or thermal oxidation. The insulating layer 216 contains one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, insulating layer 216 is a solder resist. Alternatively, insulating layer 216 is a double layer in which a first layer is a composite material including fiber, e.g., woven glass fiber, and the second layer of the double layer is a solder resist. A portion of insulating layer 216 is removed by an exposure and development process, LDA, etching, or other suitable process to expose conductive layer 214.

In FIG. 5s, an electrically conductive bump material is deposited over conductive layer 214 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 214 using a suitable attachment or bonding process. In one embodiment, the bump material is reflowed by heating the material above the material's melting point to form balls or bumps 220. In some applications, bumps 220 are reflowed a second time to improve electrical contact to conductive layer 214. In one embodiment, bumps 220 are formed over an under bump metallization (UBM) layer. Bumps 220 can also be compression bonded or thermocompression bonded to conductive layer 214. Bumps 220 represent one type of interconnect structure that can be formed over conductive layer 214. The interconnect structure can also use bond wires, conductive paste, stud bump, micro bump, or other electrical interconnect.

The combination of insulating layer 208, conductive layer 210, insulating layer 212, conductive layer 214, insulating layer 216, and bumps 220 constitutes a build-up interconnect structure 222 formed over Fo-WLCSP 186 and encapsulant 194. Conductive layers 210 and 214 and insulating layers 208, 212, and 216 may include an IPD, such as a capacitor, inductor, or resistor. Build-up interconnect structure 222 may include as few as one RDL, such as conductive layer 210. In alternative embodiments, build-up interconnect structure 222 includes two or more RDL layers, such as conductive layers 210 and 214 and additional conductive layers similar to conductive layers 210 and 214. In one embodiment, at least one of the insulating layers of build-up interconnect structure 222 includes a glass cloth, glass cross, filler, or fiber, such as E-glass cloth, T-glass cloth, Al2O3, or silica filler, for enhanced bending strength. The line spacing of the build-up interconnect structure 222 is wider than the line spacing build-up interconnect structure 180, but may be as narrow as 15 µm. In one embodiment, the minimum line spacing of build-up interconnect structure 180 is greater than or equal to 10 µm and the minimum line spacing of build-up interconnect structure 222 is greater than or equal to 30 µm. The larger pitch and wider line spacing of build-up interconnect structure 222 allows greater flexibility in the materials and manufacturing techniques used in the fabrication of build-up interconnect structure 222 and reduces manufacturing costs. In one embodiment, a portion of build-up interconnect structure 222 includes a ground plane.

Fo-WLCSP 186 and build-up interconnect structure 222 represent a dual Fo-WLCSP in reconstituted wafer form. In FIG. 5s, the reconstituted wafer is singulated through build-up interconnect structure 222 and encapsulant 194 using a saw blade or laser cutting tool 226 into individual dual Fo-WLCSP 230.

Figure 6:
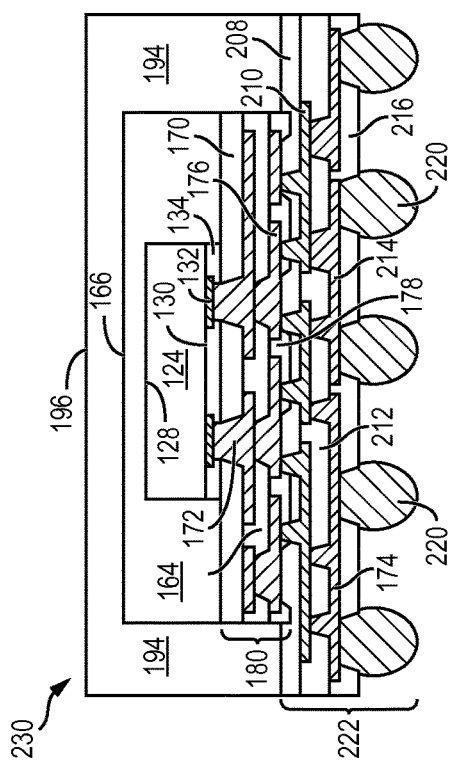
FIG. 6 illustrates the dual fan-out semiconductor device according to FIGS. 5a-5s.

FIG. 6 shows dual Fo-WLCSP 230 after singulation. Semiconductor die 124 is electrically connected through build-up interconnect structure 180 and build-up interconnect structure 222 to bumps 220 for connection to external devices. The conductive layers of build-up interconnect structure 180, for example, conductive layer 172 and conductive layer 176, are formed using narrow pitch and fine line spacing processes and technology, e.g., photosensitive dielectric resist with selectively plated Cu. Forming the conductive layers in build-up interconnect structure 180 with narrow pitch and fine line spacing allows the conductive traces within the conductive layers to be formed closer together. Forming the conductive traces closer together allows more conductive traces to be formed over a given area, for example, the area over semiconductor die 124. An increase in the number of conductive traces over semiconductor die 124 increases the number of possible interconnections that may be formed with semiconductor die 124. Increasing the number of potential interconnections within a conductive layer increases the I/O of build-up interconnect structure 180 without increasing the number of conductive layers. Accordingly, forming conductive layers 172 and 176 with narrow line spacing and an increased number of conductive traces increases the number of possible interconnect sites or I/O of build-up interconnect structure 180 without requiring additional conductive layers. Forming less conductive layers within build-up interconnect structure 180 allows for a thinner build-up interconnect structure 180. A thinner build-up interconnect structure 180 reduces the overall size of Fo-WLCSP 186 and the package profile dual Fo-WLCSP 230. Limiting the number of layers within build-up interconnect structure 180 also reduces the number of layers that could potentially warp. A decrease in warpage increases the manufacturing yield of dual Fo-WLCSP 230. Additionally, forming fewer conductive layers within build-up interconnect structure 180 reduces interconnect distance, i.e., the distance an electrical signal must travel, between semiconductor die 124 and bumps 220. Shorter interconnect distance increases the speed and electrical performance of dual Fo-WLCSP 230. The increased number of conductive traces, i.e., increased number of potential interconnections sites, within build-up interconnect structure 180 makes build-up interconnect structure 180 compatible with semiconductor devices that require an increased number of electrical interconnection sites. Accordingly, semiconductor die or devices with an increased I/O and interconnection requirement can be incorporated into dual Fo-WLCSP 230.

Dual Fo-WLCSP 230 also includes build-up interconnect structure 222. Build-up interconnect structure 222 provides additional conductive layers within dual Fo-WLCSP 230, which may be used as a ground plane and for connection to other internal or external devices. The conductive layers of build-up interconnect structure 222, for example conductive layer 210 and conductive layer 214, are formed with relaxed design rules, meaning the conductive traces within conductive layers 210 and 214 can be formed with a larger pitch and wider line spacing than the conductive traces of conductive layers 172 and 176 of build-up interconnect structure 180. Relaxing the design rules of build-up interconnect structure 222 allows for greater flexibility in the materials and manufacturing techniques used in the fabrication of build-up interconnect structure 222. Build-up interconnect structure 222 can be formed using standard equipment and materials, as opposed to materials specific to fabricating conductive layers with narrow pitch and fine line spacing. The use of standardized equipment and materials reduces the manufacturing time and cost of dual Fo-WLCSP 230 Additionally, the relaxed design rules for build-up interconnect structure 222 provide greater flexibility in the placement of bumps 220 and the spacing of the conductive traces within conductive layers 210 and 214. The placement of bumps 220 and the line spacing of the conductive layers with build-up interconnect structure 222, particularly the line spacing of the final conductive layer, i.e., conductive layer 214, can be selected to mirror industry standards. For example, bumps 220 are formed with the same spacing as the interconnection pads on a standard PCB. Spacing conductive traces within conductive layer 214 and/or forming bumps 220 according to industry standards makes dual Fo-WLCSP 230 compatible with an increased number of semiconductor devices and components.

As technology advances, the electrical interconnection requirement of semiconductor die and devices is increasing. Dual Fo-WLCSP 230 is able to incorporate semiconductor die with a high interconnection requirement due to the narrow pitch and fine line spacing of build-up interconnect structure 180, while remaining compatible with standard devices and cost efficient to manufacture due to larger pitch and wider line spacing of build-up interconnect structure 222.

Figure 7A:
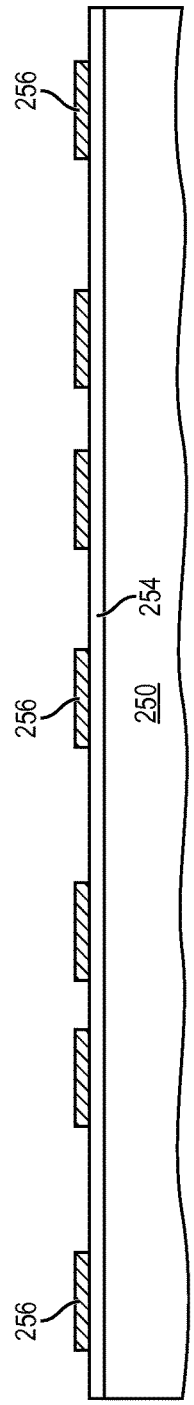
FIGS. 7a-7l illustrate another process of forming a dual fan-out semiconductor device.

FIGS. 7a-7l illustrate, in relation to FIGS. 1 and 2a-2c, another process of forming a dual fan-out semiconductor device. FIG. 7a shows a cross-sectional view of a portion of a carrier or temporary substrate 250 containing sacrificial base material such as silicon, polymer, beryllium oxide, glass, or other suitable low-cost, rigid material for structural support.

An insulating or passivation layer 254 is applied over carrier 250. Insulating layer 254 can be formed using PVD, CVD, printing, spin coating, spray coating, sintering, or thermal oxidation. Insulating layer 254 includes one or more layers of Si3N4, SiO2, SiON, SiO2/Si3N4, Ta2O5, Al2O3, polymer dielectric, or other material having similar insulating and structural properties. In one embodiment, insulating layer 254 includes a laminated dielectric film. In alternate embodiments, insulating layer 254 can be replaced by a conductive layer, such as Cu. Insulating layer 254 is chosen to have good selectivity as a silicon etchant and can act as an etch stop during later removal of the dummy substrate.

An electrically conductive layer or RDL 256 is formed over insulating layer 254 using a patterning and metal deposition process such as sputtering, electrolytic plating, and electroless plating. Conductive layer 256 includes a conductive material, such as Al, Cu, Sn, Ni, Au, Ag, or other electrically conductive material. Portions of conductive layer 256 can be electrically common or electrically isolated depending on a design and function of the later mounted semiconductor die. Conductive layer 256 includes a plurality of conductive traces. The conductive traces of conductive layer 256 are formed with narrow pitch and fine line spacing. For example, the conductive traces of conductive layer 256 are formed with a minimum line spacing of 2 µm, i.e., the minimum distance between the edges of adjacent conductive traces within conductive layer 256 is 2 µm. In one embodiment, a slurry polishing is performed to planarize the surfaces of conductive layer 256 and insulating layer 254 prior to forming additional layers.

Figure 7B:
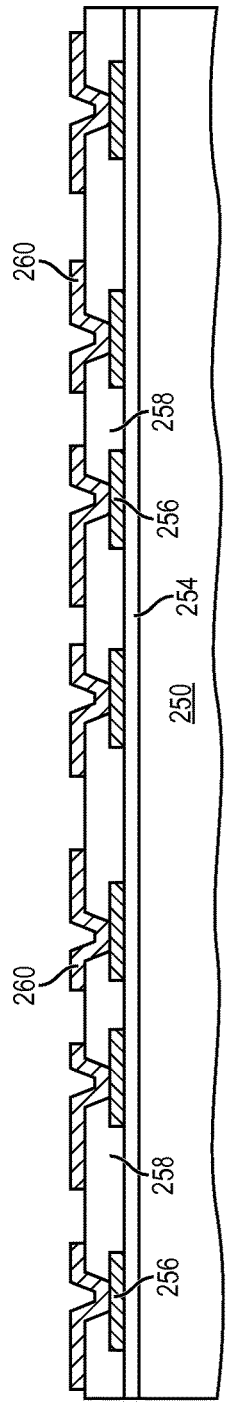

In FIG. 7b, an insulating or passivation layer 258 is applied over insulating layer 254 and conductive layer 256 for structural support and electrical isolation. Insulating layer 258 can be formed using PVD, CVD, printing, spin coating, spray coating, lamination, sintering, or thermal oxidation. Insulating layer 258 can have one or more layers of Si3N4, SiO2, SiON, PI, BCB, PBO, WPR, epoxy, or other material having similar insulating and structural properties. A portion of insulating layer 258 is removed by an exposure and development process, LDA, etching, or other suitable process to expose conductive layer 256.

An electrically conductive layer 260 is conformally deposited over insulating layer 258 using a PVD, CVD, electrolytic plating, or electroless plating process. Conductive layer 260 can be one or more layers of Al, Cu, Sn, Ni, Au, Ag, Ti, W, TiW/Cu, Ti/Cu, or other suitable electrically conductive material. One portion of conductive layer 260 is electrically connected to conductive layer 256. Other portions of conductive layer 260 can be electrically common or electrically isolated depending on the design and function of the later mounted semiconductor die. Conductive layer 260 includes a plurality of conductive traces. The conductive traces of conductive layer 260 are formed with narrow pitch and fine line spacing. For example, the conductive traces of conductive layer 256 are formed with a minimum line spacing of 2 µm. In one embodiment, a slurry polishing is performed to planarize the surfaces of conductive layer 260 and insulating layer 258 prior to forming additional layers.

Figure 7C:
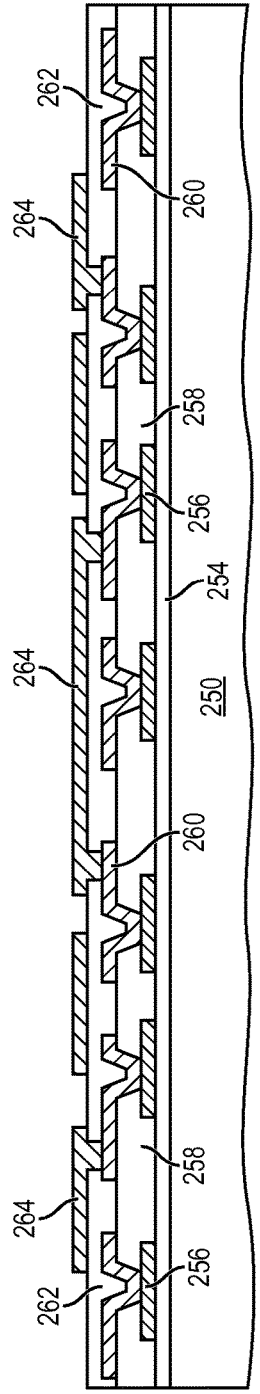

In FIG. 7c, an insulating or passivation layer 262 is applied over insulating layer 258 and conductive layer 260 for structural support and electrical isolation. Insulating layer 262 is formed using PVD, CVD, printing, spin coating, spray coating, lamination, sintering, or thermal oxidation. Insulating layer 262 includes one or more layers of Si3N4, SiO2, SiON, PI, BCB, PBO, WPR, epoxy, or other material having similar insulating and structural properties. A portion of insulating layer 262 is removed by an exposure and development process, LDA, etching, or other suitable process to expose conductive layer 260.

An electrically conductive layer 264 is conformally deposited over insulating layer 262 using a PVD, CVD, electrolytic plating, or electroless plating process. Conductive layer 262 can be one or more layers of Al, Cu, Sn, Ni, Au, Ag, Ti, W, TiW/Cu, Ti/Cu, or other suitable electrically conductive material. One portion of conductive layer 264 is electrically connected to conductive layer 260. Other portions of conductive layer 264 can be electrically common or electrically isolated depending on the design and function of the later mounted semiconductor die. Conductive layer 264 includes a plurality of conductive traces. The conductive traces of conductive layer 264 are formed with narrow pitch and fine line spacing. For example, the conductive traces of conductive layer 264 are formed with a minimum line spacing of 2 µm. In one embodiment, a slurry polishing is performed to planarize the surfaces of conductive layer 264 and insulating layer 262 prior to forming additional layers.

Figure 7D:
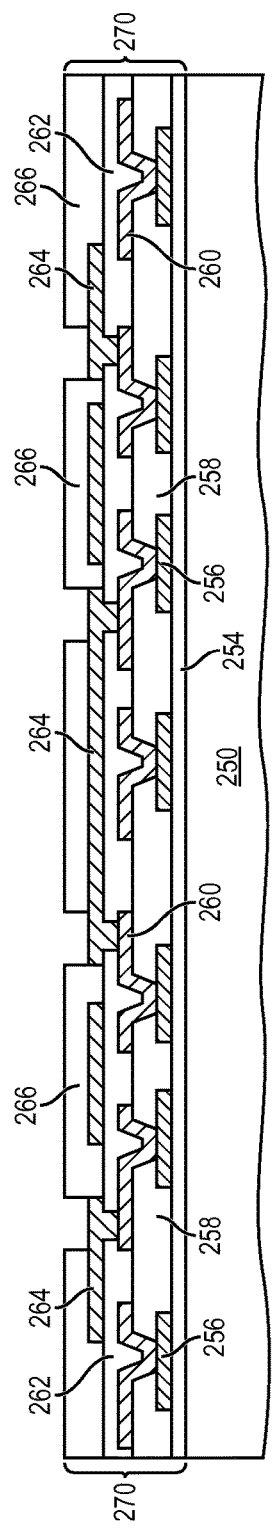

In FIG. 7d, an optional insulating or passivation layer 266 is applied over insulating layer 262 and conductive layer 264 for structural support and electrical isolation. Insulating layer 266 is formed using PVD, CVD, printing, spin coating, spray coating, lamination, sintering, or thermal oxidation. Insulating layer 266 includes one or more layers of Si3N4, SiO2, SiON, PI, BCB, PBO, WPR, epoxy, or other material having similar insulating and structural properties. A portion of insulating layer 266 is removed by an exposure and development process, LDA, etching, or other suitable process to expose conductive layer 264.

Insulating layer 254, conductive layer 256, insulating layer 258, conductive layer 260, insulating layer 262, conductive layer 264, and insulating layer 266 constitute a wafer level redistribution layer (WL RDL) or build-up interconnect structure 270. Conductive layer 256, conductive layer 260, conductive layer 264, insulating layer 254, insulating layer 258, insulating layer 262, and insulating layer 266 may include an IPD, such as a capacitor, inductor, or resistor. Build-up interconnect structure 270 is formed using fine pitch and line spacing technology, e.g., photosensitive dielectric resist and selectively plated Cu, and includes a minimum line spacing of 2 µm. The narrow pitch and fine line spacing of conductive layers 256, 260, and 264 creates space for a higher number of conductive traces within build-up interconnect structure 270. The increased density of conductive traces increases the number of possible interconnections sites and I/O terminal count of build-up interconnect structure 270. Thus, semiconductor die that require an increased number of electrical interconnection sites can be mounted to build-up interconnect structure 270. The narrow pitch and fine line spacing of the conductive layers within build-up interconnect structure 270 increases the conductive trace density and I/O of build-up interconnect structure 270, without requiring the formation of additional conductive layers. In one embodiment, interconnect structure 270 includes three or less conductive layers. The limited number of conductive layers within build-up interconnect structure 270 allows for a smaller and thinner overall semiconductor package, reduces warpage, and increases the speed of the device.

Figure 7E:
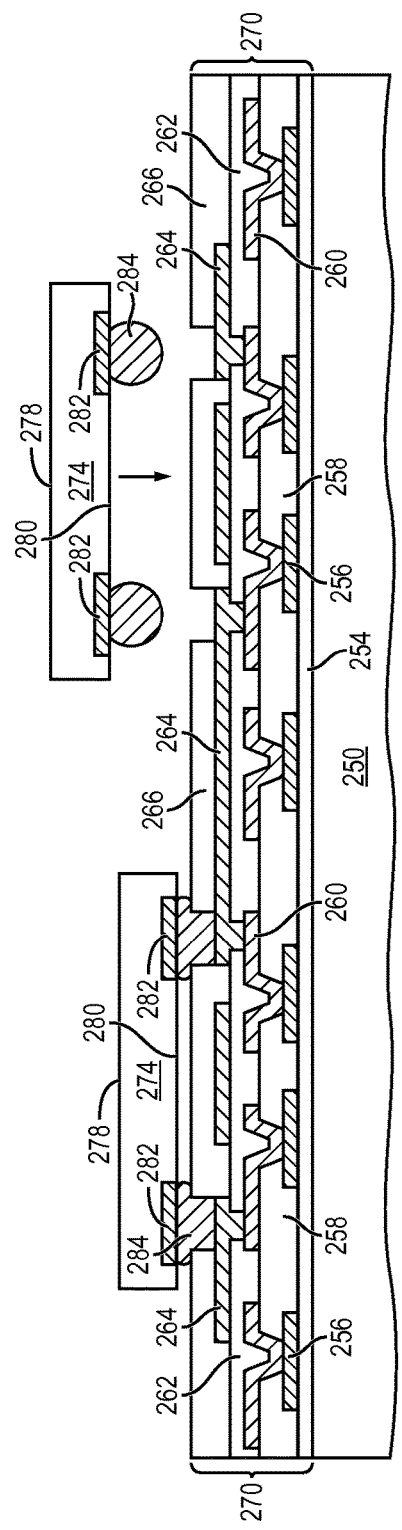

In FIG. 7e, semiconductor die 274, similar to semiconductor die 144 in FIG. 4c, are disposed over build-up interconnect structure 270. Semiconductor die 274 include contact pads 282 formed on active surfaces 280. Conductive bumps 284 are formed on contact pads 282. Semiconductor die 274 are mounted to build-up interconnect structure 270 using a pick-and-place operation. Bumps 284 are reflowed to metallurgically and electrically connect bumps 284 to conductive layer 264. Semiconductor die 274 are KGD having been tested prior to mounting semiconductor die 274 to build-up interconnect structure 270. In some applications, bumps 284 are reflowed a second time to improve electrical contact to conductive layer 264. Bumps 284 can also be compression bonded or thermocompression bonded to conductive layer 264. Bumps 284 represent one type of interconnect structure that can be formed between semiconductor die 274 and conductive layer 264. The interconnect structure can also include stud bump, micro bump, or other electrical interconnect. In one embodiment, an underfill material is disposed between semiconductor die 274 and build-up interconnect structure 270.

Semiconductor die 274 represent various IC dies and discrete components that can be mounted to build-up interconnect structure 270. Semiconductor die 274 each include active and passive devices, conductive layers, and dielectric layers on the active surface according to the electrical design of the die. The discrete components can be filters, discrete passive devices, such as inductors, resistors, or capacitors, or other discrete devices.

Figure 7F:
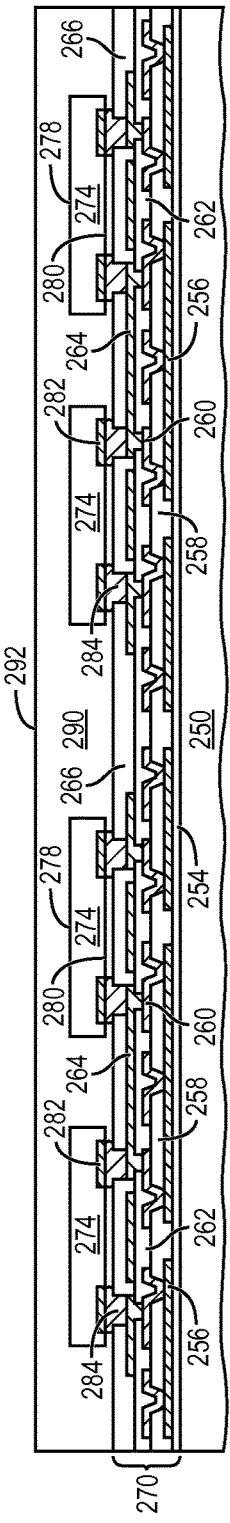

In FIG. 7f, an encapsulant or molding compound 290 is deposited over build-up interconnect structure 270 and semiconductor die 274 using a paste printing, compressive molding, transfer molding, liquid encapsulant molding, vacuum lamination, or other suitable applicator. Encapsulant 290 can be polymer composite material, such as epoxy resin with filler, epoxy acrylate with filler, or polymer with proper filler. Encapsulant 290 is non-conductive, provides physical support, and environmentally protects the semiconductor device from external elements and contaminants. Encapsulant 290 also protects semiconductor die 274 from degradation due to exposure to light. The filler and CTE of encapsulant 290 are selected to aid with gap filling, warpage control, and reliability. In one embodiment, a portion of back surface 292 of encapsulant 290 is removed in a backgrinding operation. The backgrinding operation exposes back surface 278 of semiconductor die 274 and planarizes the surface of encapsulant 290 with the surface of semiconductor die 274. The backgrinding operation reduces a thickness of the semiconductor device.

Figure 7G:
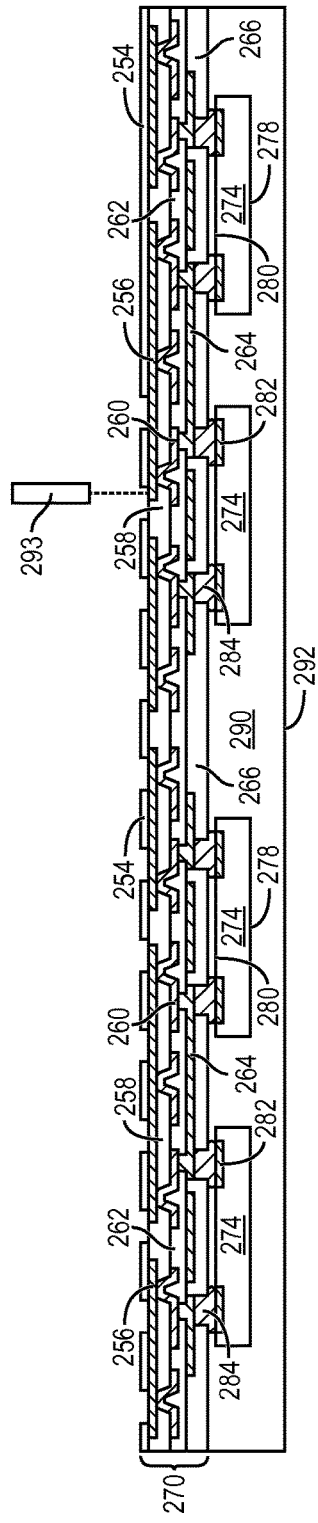

Continuing from FIG. 7f, carrier 250 is removed by chemical etching, mechanical peeling, CMP, mechanical grinding, thermal bake, UV light, laser scanning, or wet stripping leaving insulating layer 254 exposed from encapsulant 290. In FIG. 7g, a portion of insulating layer 254 is removed by LDA using laser 293 to expose conductive layer 256. Alternatively, insulating layer 254 is patterned by an exposure and development process, etching, or other suitable process to expose conductive layer 256. In one embodiment, insulating layer 254 is patterned and etched before conductive layer 256 is formed on substrate 250.

Figure 7H:
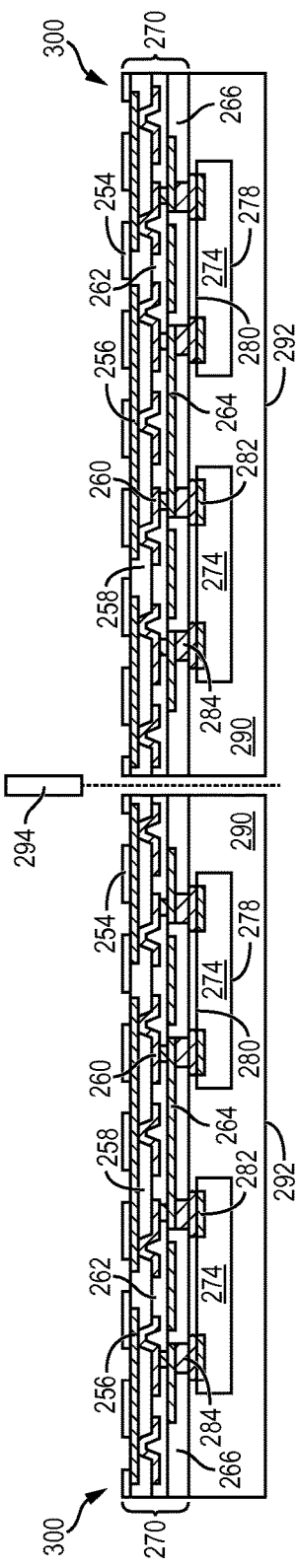

Semiconductor die 274 and build-up interconnect structure 270 represent a Fo-WLCSP in reconstituted wafer form. In FIG. 7h, the reconstituted wafer is singulated through build-up interconnect structure 270 and encapsulant 290 using a saw blade or laser cutting tool 294 into individual Fo-WLCSP 300 containing semiconductor die 274.

Figure 7I:
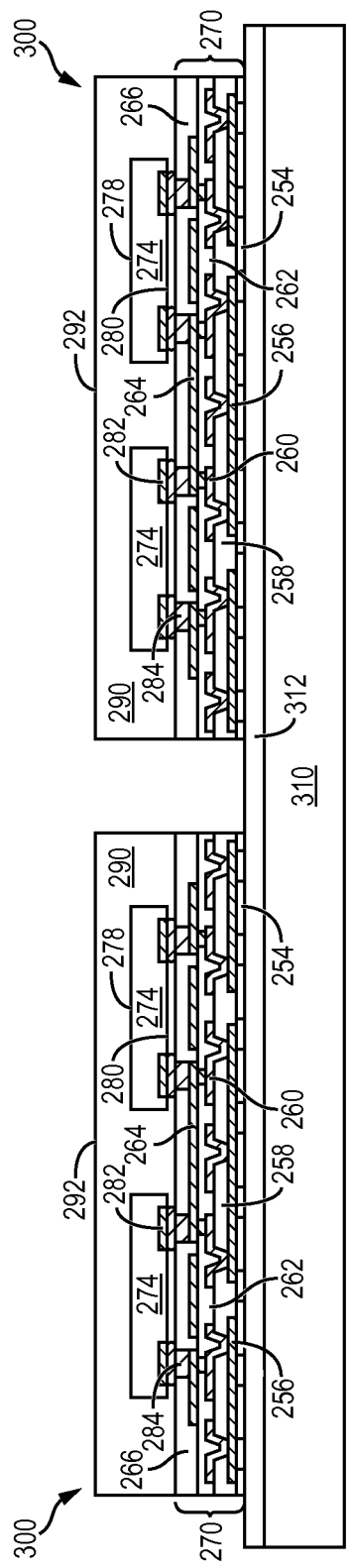

In FIG. 7i, Fo-WLCSPs 300 from FIG. 7h are aligned with and mounted to a carrier 310 with insulating layer 254 of Fo-WLCSP 300 oriented toward carrier 310. Carrier or temporary substrate 310 contains sacrificial base material such as silicon, polymer, beryllium oxide, glass, or other suitable low-cost, rigid material for structural support. An interface layer or double-sided tape 312 is formed over carrier 310 as a temporary adhesive bonding film, etch-stop layer, or thermal release layer.

Figure 7J:
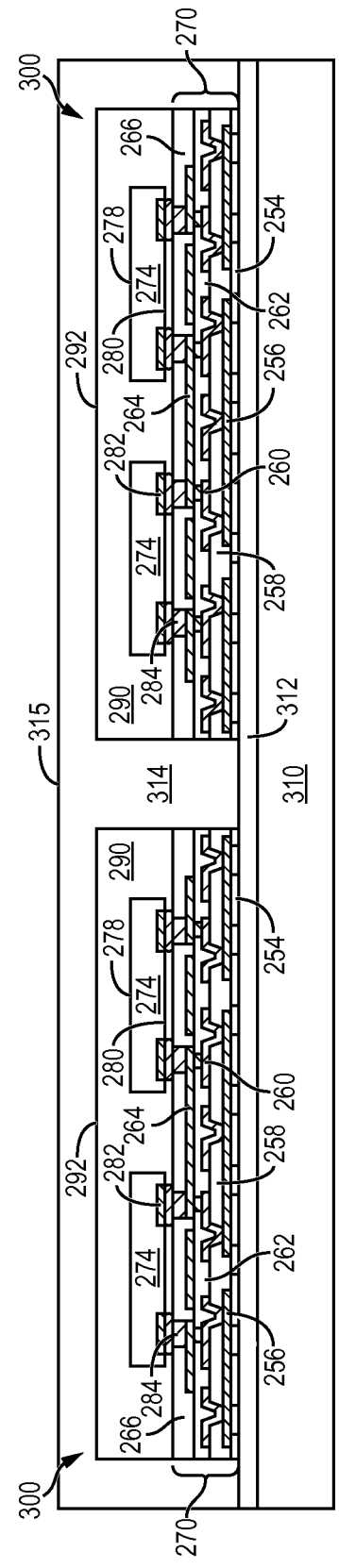

In FIG. 7j, an encapsulant or molding compound 314 is deposited over and around Fo-WLCSP 300 using a paste printing, compressive molding, transfer molding, liquid encapsulant molding, vacuum lamination, spin coating, or other suitable applicator. Encapsulant 314 can be polymer composite material, such as epoxy resin with filler, epoxy acrylate with filler, or polymer with proper filler. Encapsulant 314 is non-conductive and environmentally protects the semiconductor device from external elements and contaminants. Encapsulant 314 also protects semiconductor die 274 from degradation due to exposure to light. The filler and CTE of encapsulant 314 are selected to aid with gap filling, warpage control, and reliability. Prior to forming encapsulant 314, a backgrinding operation and/or an RF etching, plasma clean, solvent strip, or wet clean process is performed on Fo-WLCSP 300 to roughen the surfaces of encapsulant 290 and build-up interconnect structure 270 and improve adhesion of encapsulant 314. Encapsulant 314 and/or encapsulant 290 include a controlled stress-releasing agent to improve adhesion of encapsulant 314. In one embodiment, a portion of back surface 315 of encapsulant 314 and back surface 292 of encapsulant 290 is removed in a backgrinding operation. The backgrinding operation planarizes the surface of encapsulant 314 and encapsulant 290, and exposes back surface 278 of semiconductor die 274. The backgrinding operation reduces an overall thickness of the semiconductor package.

Continuing from FIG. 7j, carrier 310 and interface layer 312 are removed by chemical etching, mechanical peeling, CMP, mechanical grinding, thermal bake, UV light, laser scanning, or wet stripping leaving conductive layer 256 and insulating layer 254 of Fo-WLCSP 300 exposed from encapsulant 314.

Figure 7K:
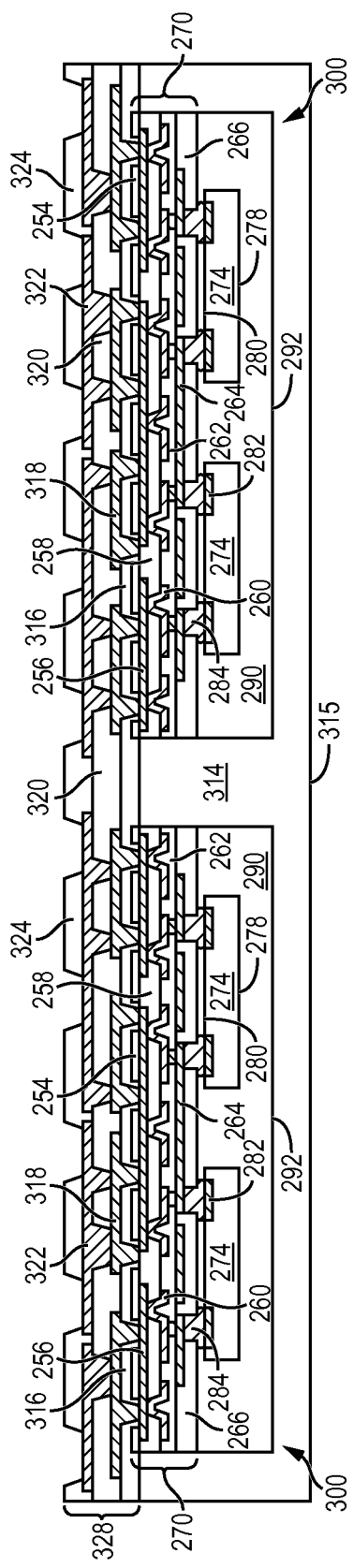

In FIG. 7k, a build-up interconnect structure 328 is formed over conductive layer 256 and insulating layer 254 of Fo-WLCSP 300 and encapsulant 314. An insulating or passivation layer 316 is formed over insulating layer 254, conductive layer 256, and encapsulant 314 using PVD, CVD, printing, lamination, spin coating, spray coating, sintering, or thermal oxidation. The insulating layer 316 contains one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, the material selected for insulating layer 316 is the same as the material selected for insulating layer 254 of Fo-WLCSP 300. A portion of insulating layer 316 is removed by an exposure and development process, LDA, etching, or other suitable process to expose conductive layer 256 of Fo-WLCSP 300.

An electrically conductive layer or RDL 318 is formed over insulating layer 316 and conductive layer 256 of Fo-WLCSP 300 using PVD, CVD, electrolytic plating, electroless plating process, or other suitable metal deposition process. Conductive layer 318 can be one or more layers of Al, Ti, TiW, Cu, Sn, Ni, Au, Ag, or other suitable electrically conductive material. One portion of conductive layer 318 is electrically connected to conductive layer 256 of Fo-WLCSP 300. Other portions of conductive layer 318 can be electrically common or electrically isolated depending on the design and function of semiconductor die 274. Conductive layer 318 includes a plurality of conductive traces. The conductive traces within conductive layer 318 are formed with a larger pitch and wider line spacing than the conductive traces within build-up interconnect structure 270, i.e., conductive traces within conductive layer 318 have a larger pitch than the conductive traces within build-up interconnect structure 270 and the distance between the edges of adjacent conductive traces within conductive layer 318 is greater than the distance between the edges of adjacent conductive traces within build-up interconnect structure 270. In one embodiment, the minimum line spacing, i.e., distance between adjacent conductive traces, of conductive layer 318 is greater than or equal to 5 µm and the minimum line spacing of build-up interconnect structure 270 is greater than or equal to 2 µm.

An insulating or passivation layer 320 is formed over insulating layer 316 and conductive layer 318 using PVD, CVD, screen printing, spin coating, spray coating, lamination, sintering, or thermal oxidation. Insulating layer 320 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. A portion of insulating layer 320 is removed by LDA, etching, or other suitable process to expose conductive layer 318.

An electrically conductive layer or RDL 322 is formed over insulating layer 320 and conductive layer 318 using PVD, CVD, electrolytic plating, electroless plating process, or other suitable metal deposition process. Conductive layer 322 can be one or more layers of Al, Ti, TiW, Cu, Sn, Ni, Au, Ag, or other suitable electrically conductive material. One portion of conductive layer 322 is electrically connected to conductive layer 318. Other portions of conductive layer 322 can be electrically common or electrically isolated depending on the design and function of semiconductor die 274. Conductive layer 322 has a larger pitch and wider line spacing than build-up interconnect structure 270, i.e., conductive traces within conductive layer 322 have a larger pitch than the conductive traces within build-up interconnect structure 270 and the distance between the edges of adjacent conductive traces within conductive layer 322 is greater than the distance between the edges of adjacent conductive traces within build-up interconnect structure 270. In one embodiment, the minimum line spacing of adjacent conductive traces within conductive layer 322 is greater than or equal to 5 µm and the minimum line spacing of the conductive traces within build-up interconnect structure 270 is greater than or equal to 2 µm.

An insulating or passivation layer 324 is formed over insulating layer 320 and conductive layer 322 using PVD, CVD, printing, lamination, spin coating, spray coating, sintering, or thermal oxidation. The insulating layer 324 contains one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. Alternatively, insulating layer 324 is a double layer in which a first layer is a composite material including fiber, e.g., woven glass fiber, and the second layer of the double layer is a solder resist. A portion of insulating layer 324 is removed by an exposure and development process, LDA, etching, or other suitable process to expose conductive layer 322.

Figure 7L:
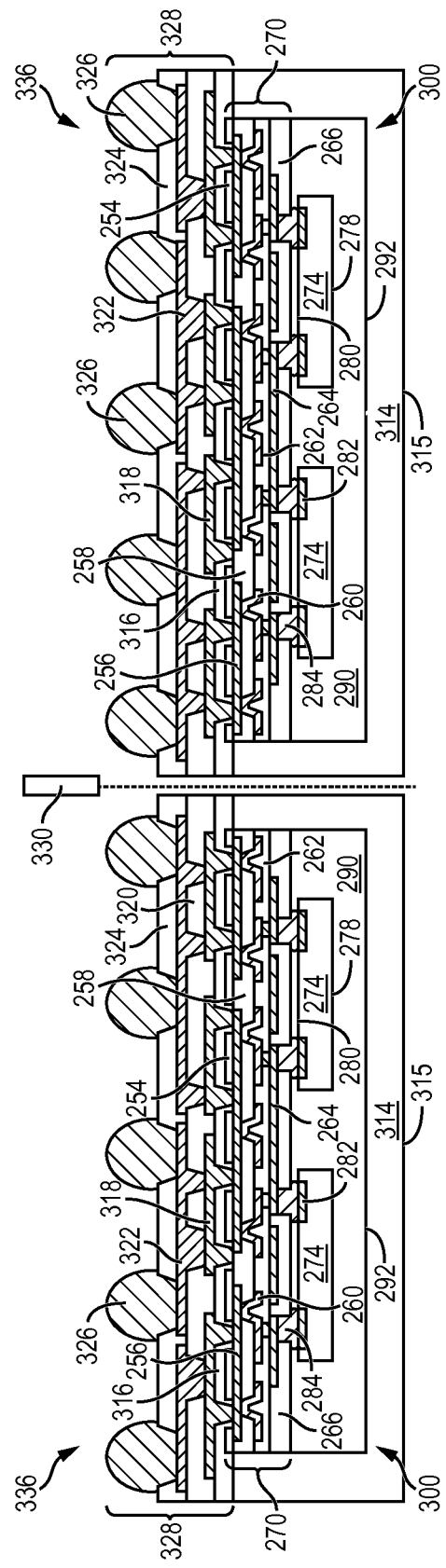

In FIG. 7l, an electrically conductive bump material is deposited over conductive layer 322 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 322 using a suitable attachment or bonding process. In one embodiment, the bump material is reflowed by heating the material above the material's melting point to form balls or bumps 326. In some applications, bumps 326 are reflowed a second time to improve electrical contact to conductive layer 322. In one embodiment, bumps 326 are formed over a UBM layer. Bumps 326 can also be compression bonded or thermocompression bonded to conductive layer 322. Bumps 326 represent one type of interconnect structure that can be formed over conductive layer 322. The interconnect structure can also use bond wires, conductive paste, stud bump, micro bump, or other electrical interconnect.

The combination of insulating layer 316, conductive layer 318, insulating layer 320, conductive layer 322, insulating layer 324, and bumps 326 constitutes a build-up interconnect structure 328 formed over Fo-WLCSP 300 and encapsulant 314. Conductive layers 318 and 322 and insulating layers 316, 320, and 324 may include an IPD, such as a capacitor, inductor, or resistor. Build-up interconnect structure 328 may include as few as one RDL, such as conductive layer 318. In alternative embodiments, build-up interconnect structure 328 includes two or more RDL layers, such as conductive layers 318 and 322 and additional conductive layers similar to conductive layers 318 and 322. In one embodiment, at least one of the insulating layers of build-up interconnect structure 328 includes a glass cloth, glass cross, filler, or fiber, such as E-glass cloth, T-glass cloth, Al2O3, or silica filler, for enhanced bending strength. Build-up interconnect structure 328 has larger pitch and wider line spacing than build-up interconnect structure 270. In one embodiment, the minimum line spacing of build-up interconnect structure 328 is greater than or equal to 5 µm and the minimum line spacing of build-up interconnect structure 270 is greater than or equal to 2 µm. The larger pitch and wider line spacing of build-up interconnect structure 328 allows greater flexibility in the materials and manufacturing techniques used in the fabrication of build-up interconnect structure 328 and reduces manufacturing costs. In one embodiment, a portion of build-up interconnect structure 328 includes a ground plane.

Fo-WLCSP 300 and build-up interconnect structure 328 represent a dual Fo-WLCSP in reconstituted wafer form. In FIG. 7l, the reconstituted wafer is singulated through build-up interconnect structure 328 and encapsulant 314 using a saw blade or laser cutting tool 330 into individual dual Fo-WLCSP 336.

FIG. 8 shows dual Fo-WLCSP 336 after singulation. Semiconductor die 274 are electrically connected through build-up interconnect structure 270 and build-up interconnect structure 328 to bumps 326 for connection to external devices. The conductive layers of build-up interconnect structure 270, for example, conductive layer 256, conductive layer 260, and conductive layer 264, are formed using narrow pitch and fine line spacing processes and technology, e.g., photosensitive dielectric resist with selectively plated Cu. Forming the conductive layers in build-up interconnect structure 270 with narrow pitch and fine line spacing allows the conductive traces within the conductive layers to be formed closer together. Forming the conductive traces closer together allows more conductive traces to be formed over a given area, for example, the area over semiconductor die 274. An increase in the number of conductive traces over semiconductor die 274 increases the number of possible interconnections that may be formed with semiconductor die 274. Increasing the number of potential interconnections within a conductive layer increases the I/O of build-up interconnect structure 270 without increasing the number of conductive layers. Accordingly, forming conductive layers 256, 260, and 264 with narrow line spacing and an increased number of conductive traces increases the number of possible interconnect sites or I/O of build-up interconnect structure 270 without requiring additional conductive layers. Forming less conductive layers within build-up interconnect structure 270 allows for a thinner build-up interconnect structure 270. A thinner build-up interconnect structure 270 reduces the overall size of Fo-WLCSP 300 and the package profile dual Fo-WLCSP 336. Limiting the number of layers within build-up interconnect structure 270 also reduces the number of layers that could potentially warp. A decrease in warpage increases the manufacturing yield of dual Fo-WLCSP 336. Additionally, forming fewer conductive layers within build-up interconnect structure 270 reduces interconnect distance, i.e., the distance an electrical signal must travel, between semiconductor die 274 and between semiconductor die 274 and bumps 326. Shorter interconnect distance increases the speed and electrical performance of dual Fo-WLCSP 336. The increased number of conductive traces, i.e., increased number of potential interconnections sites, within build-up interconnect structure 270 makes build-up interconnect structure 270 compatible with semiconductor devices that require an increased number of electrical interconnection sites. Accordingly, semiconductor die or devices with an increased I/O and interconnection requirement can be incorporated into dual Fo-WLCSP 336. Forming build-up interconnect structure 270 independent of semiconductor die 274 allows build-up interconnect structure 270 to accommodate a variety of semiconductor die or packages with varying I/O and interconnection density. Forming build-up interconnect structure 270 prior to attaching semiconductor die 274 also allows build-up interconnect structure 270 to be tested prior to attaching semiconductor die 274. Semiconductor die 274 are thus only mounted to known good build-up interconnect structures 270. Accordingly, the yield of dual Fo-WLCSP 336 is increased. In addition, by mounting only KGD to only known good build-up interconnect structures 270, manufacturing steps and materials are not wasted making defective packages and the overall cost of dual Fo-WLCSP 336 is reduced.

Dual Fo-WLCSP 336 also includes build-up interconnect structure 328. Build-up interconnect structure 328 provides additional conductive layers within dual Fo-WLCSP 336, which may be used as a ground plane and for connection to other internal or external devices. The conductive layers of build-up interconnect structure 328, for example conductive layer 318 and conductive layer 322, are formed with relaxed design rules, meaning the conductive traces within conductive layers 318 and 322 can be formed with a larger pitch and wider line spacing than the conductive traces of conductive layers 256, 260, and 264 of build-up interconnect structure 270. Relaxing the design rules of build-up interconnect structure 328 allows for greater flexibility in the materials and manufacturing techniques used in the fabrication of build-up interconnect structure 328. Build-up interconnect structure 328 can be formed using standard equipment and materials, as opposed to materials specific to fabricating conductive layers with fine line spacing. The use of standardized equipment and materials reduces the manufacturing time and cost of dual Fo-WLCSP 336. Additionally, the relaxed design rules for build-up interconnect structure 328 provide greater flexibility in the placement of bumps 326 and the spacing of the conductive traces within conductive layers 318 and 322. The placement of bumps 326 and the line spacing of the conductive layers with build-up interconnect structure 328, particularly the line spacing of the final conductive layer, i.e., conductive layer 322, can be selected to mirror industry standards. For example, bumps 326 are formed with the same spacing as the interconnection pads on a standard PCB. Spacing the conductive traces within conductive layer 322 and/or forming bumps 326 according to industry standards makes dual Fo-WLCSP 336 compatible with an increased number of semiconductor devices and components.

As technology advances, the interconnection requirement of semiconductor die and devices is increasing. Dual Fo-WLCSP 336 is able to incorporate semiconductor die with a high interconnection requirement due to the narrow pitch and fine line spacing of build-up interconnect structure 270, while remaining compatible with standard devices and cost efficient to manufacture due to the larger pitch and wider line spacing of build-up interconnect structure 328.

Figure 9C:
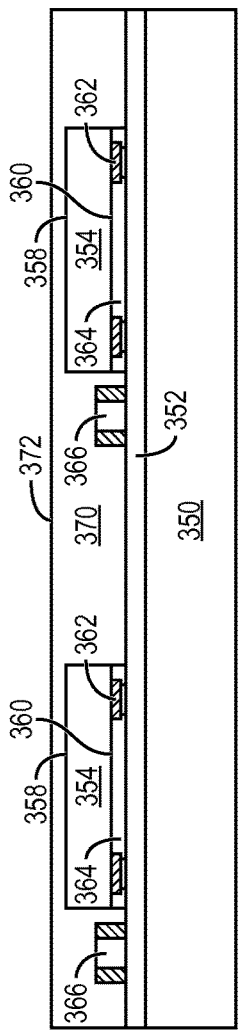

FIGS. 9a-9i illustrate, in relation to FIGS. 1 and 2a-2c, a process of forming a dual fan-out semiconductor device including embedded passive devices. FIG. 9a shows a cross-sectional view of a portion of a carrier or temporary substrate 350 containing sacrificial base material such as silicon, polymer, beryllium oxide, glass, or other suitable low-cost, rigid material for structural support. An interface layer or double-sided tape 352 is formed over carrier 350 as a temporary adhesive bonding film, etch-stop layer, or thermal release layer.

Semiconductor die 354, similar to semiconductor die 124 from FIG. 3c, are mounted to carrier 350 and interface layer 352 using, for example, a pick and place operation with active surface 360 oriented toward the carrier. A plurality of other semiconductor components or passive devices 366 are mounted to carrier 350 adjacent to semiconductor die 354. FIG. 9b shows semiconductor die 354 and passive devices 366 mounted to carrier 350.

In FIG. 9c, an encapsulant or molding compound 370 is deposited over semiconductor die 354 and carrier 350 using a paste printing, compressive molding, transfer molding, liquid encapsulant molding, vacuum lamination, spin coating, or other suitable applicator. In particular, encapsulant 370 covers the four side surfaces and back surface 358 of semiconductor die 354. Encapsulant 370 can be polymer composite material, such as epoxy resin with filler, epoxy acrylate with filler, or polymer with proper filler. Encapsulant 370 is non-conductive and environmentally protects the semiconductor device from external elements and contaminants. Encapsulant 370 also protects semiconductor die 354 from degradation due to exposure to light. The filler and CTE of encapsulant 370 are selected to aid with gap filling, warpage control, and reliability. In one embodiment, a portion of surface 372 of encapsulant 370 is removed in a backgrinding operation. The backgrinding operation planarizes and reduces a thickness of encapsulant 370 and exposes back surface 358 of semiconductor die 354.

Continuing from FIG. 9c, carrier 350 and interface layer 352 are removed by chemical etching, mechanical peeling, CMP, mechanical grinding, thermal bake, UV light, laser scanning, or wet stripping leaving conductive layer 362 and insulating layer 364 of semiconductor die 354 and passive devices 366 exposed from encapsulant 370.

Figure 9D:
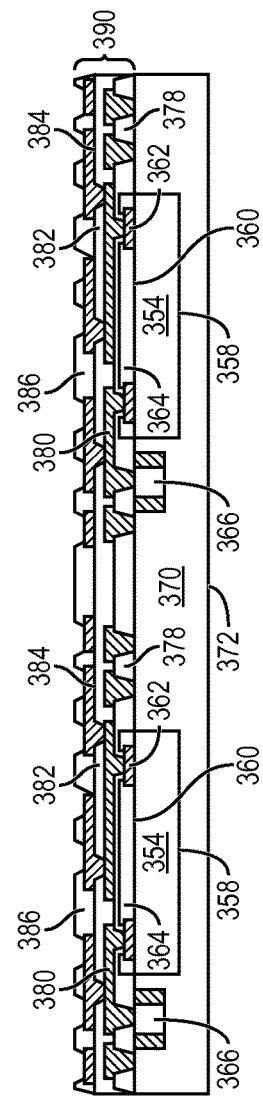

In FIG. 9d, a build-up interconnect structure 390 is formed over insulating layer 364 and conductive layer 362 of semiconductor die 354, passive device 366, and encapsulant 370. Build-up interconnect structure 390 includes an insulating layer 378, a conductive layer 380, an insulating layer 382, a conductive layer 384, and an optional insulating layer 386. Insulating or passivation layer 378 is formed over passive device 366, insulating layer 364 and conductive layer 362 of semiconductor die 354, and encapsulant 370 using PVD, CVD, printing, lamination, spin coating, spray coating, sintering, or thermal oxidation. The insulating layer 378 contains one or more layers of SiO2, Si3N4, SiON, Ta2O5, Al2O3, low temperature (less than 250° C.) curing polymer dielectric materials, or other material having similar insulating and structural properties. A portion of insulating layer 378 is removed by an exposure and development process, LDA, etching, or other suitable process to expose conductive layer 362 and passive device 366.

Electrically conductive layer or RDL 380 is formed over passive device 366, conductive layer 362, and insulating layer 378 using PVD, CVD, electrolytic plating, electroless plating process, or other suitable metal deposition process. Conductive layer 380 can be one or more layers of Al, Ti, TiW, Cu, Sn, Ni, Au, Ag, or other suitable electrically conductive material. One portion of conductive layer 380 is electrically connected to conductive layer 362 of semiconductor die 354. One portion of conductive layer 380 is electrically connected to passive device 366. Other portions of conductive layer 380 can be electrically common or electrically isolated depending on the design and function of semiconductor die 354. Conductive layer 380 includes a plurality of conductive traces. The conductive traces of conductive layer 380 are formed with narrow pitch and fine line spacing. For example, the conductive traces within conductive layer 380 are formed with a minimum line spacing of 5 µm, i.e., the minimum distance between the edges of adjacent conductive traces within conductive layer 380 is 5 µm. In one embodiment, conductive layer 380 has a minimum line spacing or distance between adjacent conductive traces of greater than or equal to 10 µm. The narrow pitch and fine line spacing of the conductive traces within conductive layer 380 creates space for more conductive traces over semiconductor die 354 and encapsulant 370.

An insulating or passivation layer 382 is formed over insulating layer 378 and conductive layer 380 using PVD, CVD, printing, lamination, spin coating, spray coating, sintering, or thermal oxidation. The insulating layer 382 contains one or more layers of SiO2, Si3N4, SiON, Ta2O5, Al2O3, low temperature (less than 250° C.) curing polymer dielectric materials, or other material having similar insulating and structural properties. A portion of insulating layer 382 is removed by an exposure and development process, LDA, etching, or other suitable process to expose conductive layer 380.

Electrically conductive layer or RDL 384 is formed over conductive layer 380 and insulating layer 382 using PVD, CVD, electrolytic plating, electroless plating process, or other suitable metal deposition process. Conductive layer 384 can be one or more layers of Al, Ti, TiW, Cu, Sn, Ni, Au, Ag, or other suitable electrically conductive material. One portion of conductive layer 384 is electrically connected to conductive layer 380. Other portions of conductive layer 384 can be electrically common or electrically isolated depending on the design and function of semiconductor die 354. Conductive layer 384 includes a plurality of conductive traces. The conductive traces of conductive layer 384 are formed with narrow pitch and fine line spacing. For example, the conductive traces within conductive layer 384 are formed with a minimum line spacing of 5 µm. In one embodiment, conductive layer 384 has a minimum line spacing of greater than or equal to 10 µm. The narrow pitch and fine line spacing of the conductive traces within conductive layer 384 creates space for more conductive traces over semiconductor die 354 and encapsulant 370.

An optional insulating or passivation layer 386 is formed over insulating layer 382 and conductive layer 384 using PVD, CVD, printing, lamination, spin coating, spray coating, sintering, or thermal oxidation. The insulating layer 386 contains one or more layers of SiO2, Si3N4, SiON, Ta2O5, Al2O3, low temperature (less than 250° C.) curing polymer dielectric materials, or other material having similar insulating and structural properties. A portion of insulating layer 386 is removed by an exposure and development process, LDA, etching, or other suitable process to expose conductive layer 384.

The combination of insulating layer 378, conductive layer 380, insulating layer 382, conductive layer 384, and insulating layer 386 constitutes a build-up interconnect structure 390 formed over passive device 366, semiconductor die 354, and encapsulant 370. Conductive layers 380 and 384 and insulating layers 378, 382, and 386 may include an IPD, such as a capacitor, inductor, or resistor. Build-up interconnect structure 390 is formed using narrow pitch and fine line spacing technology, e.g., photosensitive dielectric resist and selectively plated Cu, and can have a line spacing as narrow as 5 µm. In one embodiment, the minimum line spacing of build-up interconnect structure 390 is greater than or equal to 10 µm. The narrow pitch and fine line spacing of conductive layers 380 and 384 creates space for a higher number of conductive traces within build-up interconnect structure 390. The increased density of conductive traces increases the number of possible interconnections sites and I/O terminal count of build-up interconnect structure 390. Thus, build-up interconnect structure 390 can be formed over semiconductor die that require an increased number of electrical interconnection sites. The narrow pitch and fine line spacing of the conductive layers within build-up interconnect structure 390 increases the conductive trace density and I/O of build-up interconnect structure 390, without requiring the formation of additional RDLs. In one embodiment, interconnect structure 390 includes three or less RDLs. The limited number of RDLs within build-up interconnect structure 390 allows for a smaller and thinner overall semiconductor package, reduces warpage, and increases the speed of the device.

Figure 9E:
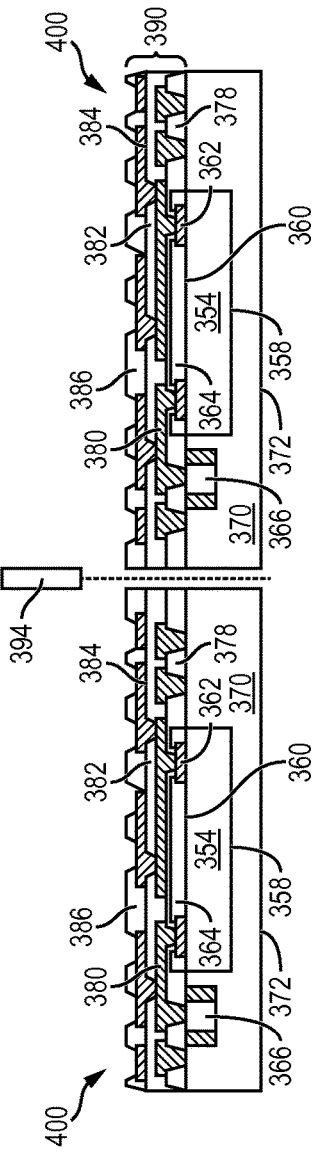

Semiconductor die 354, passive device 366, and build-up interconnect structure 390 represent a Fo-WLCSP in reconstituted wafer form. In FIG. 9e, the reconstituted wafer is singulated through build-up interconnect structure 390 and encapsulant 370 using a saw blade or laser cutting tool 394 into individual Fo-WLCSP 400 containing semiconductor die 354 and passive device 366.

In FIG. 9f, Fo-WLCSP 400 from FIG. 9e and additional semiconductor components or passive devices 414 are aligned with and mounted to substrate or carrier 410 with insulating layer 386 of Fo-WLCSP 400 oriented toward carrier 410. Carrier or temporary substrate 410 contains a sacrificial base material such as silicon, polymer, beryllium oxide, glass, or other suitable low-cost, rigid material for structural support. An interface layer or double-sided tape 412 is formed over carrier 410 as a temporary adhesive bonding film, etch-stop layer, or thermal release layer.

In FIG. 9g, an encapsulant or molding compound 416 is deposited over and around Fo-WLCSP 400 and passive device 414 using a paste printing, compressive molding, transfer molding, liquid encapsulant molding, vacuum lamination, spin coating, or other suitable applicator. Encapsulant 416 can be polymer composite material, such as epoxy resin with filler, epoxy acrylate with filler, or polymer with proper filler. Encapsulant 416 is non-conductive and environmentally protects the semiconductor device from external elements and contaminants. Encapsulant 416 also protects semiconductor die 354 from degradation due to exposure to light. The filler and CTE of encapsulant 416 are selected to aid with gap filling, warpage control, and reliability. Prior to forming encapsulant 416, a backgrinding operation and/or an RF etching, plasma clean, solvent strip, or wet clean process is performed on Fo-WLCSP 400 to roughen the surfaces of encapsulant 370 and build-up interconnect structure 390 and improve adhesion of encapsulant 416. Encapsulant 416 and/or encapsulant 370 include a controlled stress-releasing agent to improve adhesion of encapsulant 416. In one embodiment, a portion of back surface 418 of encapsulant 416 and a portion of back surface 372 of encapsulant 370 are removed in a backgrinding operation. The backgrinding operation planarizes encapsulant 416 and encapsulant 370, and exposes back surface 358 of semiconductor die 354. The backgrinding operation reduces an overall thickness of the semiconductor package.

Continuing from FIG. 9g, carrier 410 and interface layer 412 are removed by chemical etching, mechanical peeling, CMP, mechanical grinding, thermal bake, UV light, laser scanning, or wet stripping leaving passive device 414 and conductive layer 384 and insulating layer 386 of Fo-WLCSP 400 exposed from encapsulant 416.

Figure 9H:
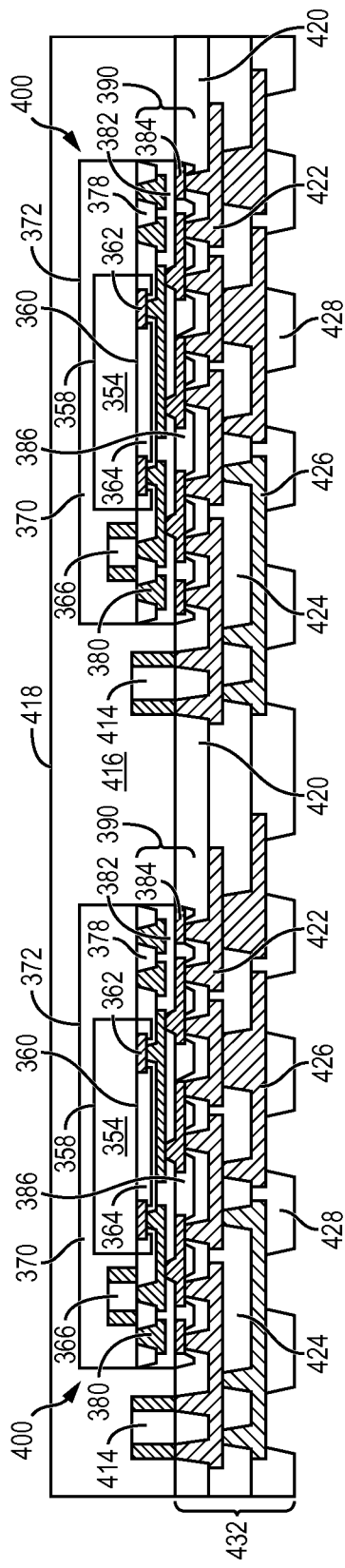

In FIG. 9h, a build-up interconnect structure 432 is formed over passive device 414, insulating layer 386 and conductive layer 384 of Fo-WLCSP 400, and encapsulant 416. An insulating or passivation layer 420 is formed over passive device 414, insulating layer 386, conductive layer 384, and encapsulant 416 using PVD, CVD, printing, lamination, spin coating, spray coating, sintering, or thermal oxidation. The insulating layer 420 contains one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, the material selected for insulating layer 420 is the same as the material selected for insulating layer 386 of Fo-WLCSP 400. A portion of insulating layer 420 is removed by an exposure and development process, LDA, etching, or other suitable process to expose conductive layer 384 of Fo-WLCSP 400 and passive device 414.

An electrically conductive layer or RDL 422 is formed over insulating layer 420, conductive layer 384 of Fo-WLCSP 400, and passive device 414 using PVD, CVD, electrolytic plating, electroless plating process, or other suitable metal deposition process. Conductive layer 422 can be one or more layers of Al, Ti, TiW, Cu, Sn, Ni, Au, Ag, or other suitable electrically conductive material. One portion of conductive layer 422 is electrically connected to conductive layer 384 of Fo-WLCSP 400. One portion of conductive layer 422 is electrically connected to passive device 414. Other portions of conductive layer 422 can be electrically common or electrically isolated depending on the design and function of semiconductor die 354. Conductive layer 422 includes a plurality of conductive traces. Conductive layer 422 is formed with a larger pitch and wider line spacing than build-up interconnect structure 390, i.e., the conductive traces within conductive layer 422 have a larger pitch than the conductive traces within build-up interconnect structure 390 and the distance between the edges of adjacent conductive traces within conductive layer 422 is greater than the distance between the edges of adjacent conductive traces within build-up interconnect structure 390. For example, conductive layer 422 has a minimum line spacing or distance between adjacent conductive traces of 15 µm. In one embodiment, the minimum line spacing of conductive layer 422 is greater than or equal to 30 µm and the minimum line spacing of build-up interconnect structure 390 is greater than or equal to 10 µm.

An insulating or passivation layer 424 is formed over insulating layer 420 and conductive layer 422 using PVD, CVD, screen printing, spin coating, spray coating, lamination, sintering, or thermal oxidation. Insulating layer 424 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. A portion of insulating layer 424 is removed by an exposure and development process, LDA, etching, or other suitable process to expose conductive layer 422.

An electrically conductive layer or RDL 426 is formed over insulating layer 424 and conductive layer 422 using a patterning and metal deposition process such as sputtering, electrolytic plating, and electroless plating. Conductive layer 426 includes one or more layers of Al, Cu, Sn, Ni, Au, Ag, Ti, W, TiW/Cu, Ti/Cu, or other suitable electrically conductive material. One portion of conductive layer 426 is electrically connected to conductive layer 422. Other portions of conductive layer 426 can be electrically common or electrically isolated depending on the design and function of semiconductor die 354. Conductive layer 426 includes a plurality of conductive traces. Conductive layer 426 is formed with a larger pitch and wider line spacing than build-up interconnect structure 390. For example, conductive layer 426 has a minimum line spacing of 15 µm. In one embodiment, the minimum line spacing of conductive layer 422 is greater than or equal to 30 µm and the minimum line spacing of build-up interconnect structure 390 is greater than or equal to 10 µm.

An insulating or passivation layer 428 is formed over insulating layer 424 and conductive layer 426 using PVD, CVD, printing, lamination, spin coating, spray coating, sintering, or thermal oxidation. The insulating layer 428 contains one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, insulating layer 428 is a solder resist. Alternatively, insulating layer 428 is a double layer in which a first layer is a composite material including fiber, e.g., woven glass fiber, and the second layer of the double layer is a solder resist. A portion of insulating layer 428 is removed by an exposure and development process, LDA, etching, or other suitable process to expose conductive layer 426.

Figure 9I:
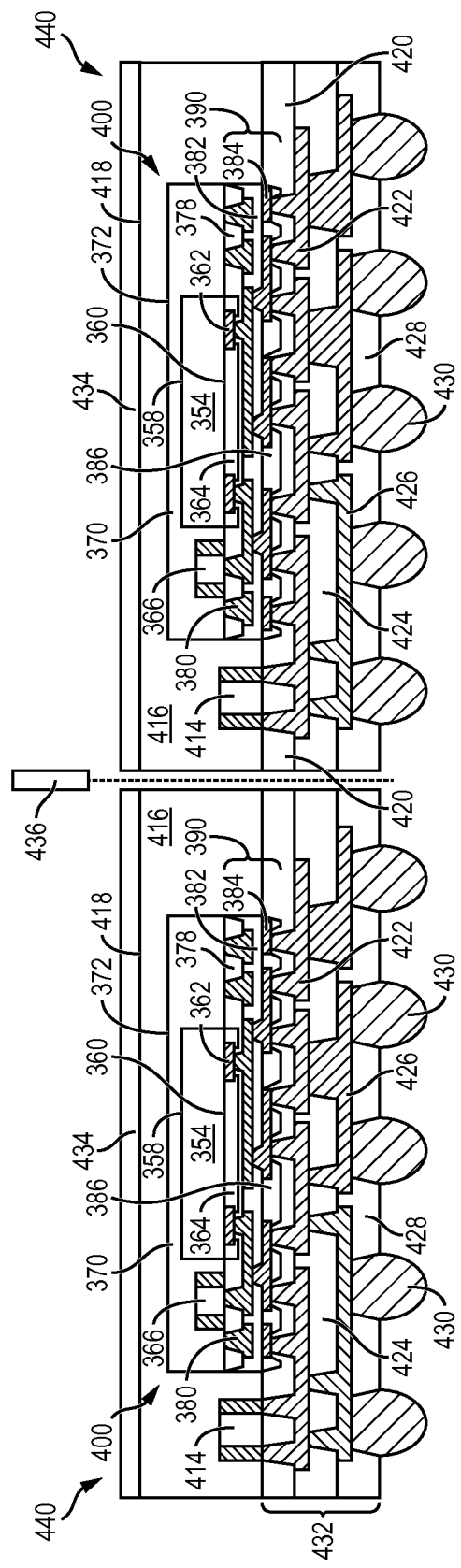

In FIG. 9i, an electrically conductive bump material is deposited over conductive layer 426 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 426 using a suitable attachment or bonding process. In one embodiment, the bump material is reflowed by heating the material above the material's melting point to form balls or bumps 430. In some applications, bumps 430 are reflowed a second time to improve electrical contact to conductive layer 426. In one embodiment, bumps 430 are formed over a UBM layer.

Bumps 430 can also be compression bonded or thermocompression bonded to conductive layer 426. Bumps 430 represent one type of interconnect structure that can be formed over conductive layer 426. The interconnect structure can also use bond wires, conductive paste, stud bump, micro bump, or other electrical interconnect.

The combination of insulating layer 420, conductive layer 422, insulating layer 424, conductive layer 426, insulating layer 428, and bumps 430 constitutes a build-up interconnect structure 432 formed over Fo-WLCSP 400, passive device 414, and encapsulant 416. Conductive layer 422, conductive layer 426, insulating layer 420, insulating layer 424, and insulating layer 428 may include an IPD, such as a capacitor, inductor, or resistor. Build-up interconnect structure 432 may include as few as one RDL, such as conductive layer 422. In alternative embodiments, build-up interconnect structure 432 includes two or more RDL layers, such as conductive layers 422 and 426 and additional conductive layers similar to conductive layers 422 and 426. In one embodiment, at least one of the insulating layers of build-up interconnect structure 432 includes a glass cloth, glass cross, filler, or fiber, such as E-glass cloth, T-glass cloth, Al2O3, or silica filler, for enhanced bending strength. Build-up interconnect structure 432 has a wider pitch and finer line spicing than build-up interconnect structure 390. In one embodiment, the minimum line spacing of build-up interconnect structure 390 is greater than or equal to 10 μm and the minimum line spacing of build-up interconnect structure 432 is greater than or equal to 30 μm. The larger pitch and wider line spacing of build-up interconnect structure 432 allows greater flexibility in the materials and manufacturing techniques used in the fabrication of build-up interconnect structure 432 and reduces manufacturing costs. In one embodiment, a portion of build-up interconnect structure 432 includes a ground plane.

A heat sink or heat spreader 434 is formed over surface 418 of encapsulant 416 to enhance thermal dissipation from semiconductor die 354. Heat sink 434 can be Al, Cu, or other material with high thermal conductivity to provide heat dissipation for semiconductor die 354. In one embodiment, heat sink 434 acts as a shielding layer for blocking or absorbing EMI, RFI, harmonic distortion, and other interference.

Fo-WLCSP 400, passive device 414, heat sink 434, and build-up interconnect structure 432 represent a dual Fo-WLCSP including embedded passive devices in reconstituted wafer form. In FIG. 9i, the reconstituted wafer is singulated through build-up interconnect structure 432, heat sink 434, and encapsulant 416 using a saw blade or laser cutting tool 436 into individual dual Fo-WLCSP 440 containing semiconductor die 354, passive device 366, and passive device 414.

Figure 10:
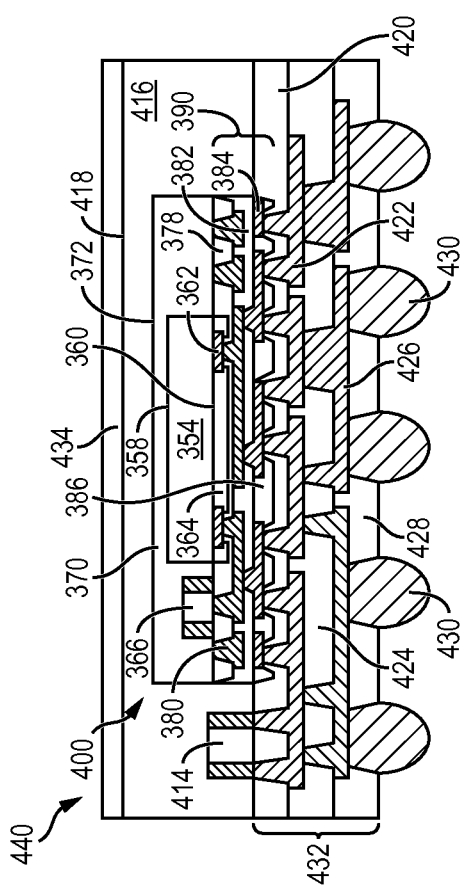
FIG. 10 illustrates the dual fan-out semiconductor device including embedded passive devices according to FIGS. 9a-9i.

FIG. 10 shows dual Fo-WLCSP 440 after singulation. Semiconductor die 354 is electrically connected through build-up interconnect structure 390 and build-up interconnect structure 432 to bumps 430 for connection to external devices. The conductive layers of build-up interconnect structure 390, for example, conductive layer 380 and conductive layer 384, are formed using narrow pitch and fine line spacing processes and technology, e.g., photosensitive dielectric resist with selectively plated Cu. Forming the conductive layers in build-up interconnect structure 390 using narrow pitch and fine line spacing processes allows the conductive traces within the conductive layers to be formed closer together. Forming the conductive traces closer together allows more conductive traces to be formed over a given area, for example, the area over semiconductor die 354. An increase in the number of conductive traces over semiconductor die 354 increases the number of possible interconnection that may be formed with semiconductor die 354. Increasing the number of potential interconnections within a single conductive layer increases the I/O of build-up interconnect structure 390 without increasing the number of conductive layers. Accordingly, forming conductive layers 380 and 384 with narrow line spacing and an increased number of conductive traces increases the number of possible interconnect sites or I/O of build-up interconnect structure 390 without requiring additional conductive layers. Forming less conductive layers within build-up interconnect structure 390 allows for a thinner build-up interconnect structure 390. A thinner build-up interconnect structure 390 reduces the overall size of Fo-WLCSP 400 and the package profile dual Fo-WLCSP 440. Limiting the number of layers within build-up interconnect structure 390 also reduces the number of layers that could potentially warp. A decrease in warpage increases the manufacturing yield of dual Fo-WLCSPs 440. Additionally, forming fewer conductive layers within build-up interconnect structure 390 reduces interconnect distance, i.e., the distance an electrical signal must travel, between semiconductor die 354 and bumps 430. Shorter interconnect distance increases the speed and electrical performance of dual Fo-WLCSP 440. The increased number of conductive traces, i.e., increased number of potential interconnections sites, within build-up interconnect structure 390 makes build-up interconnect structure 390 compatible with semiconductor devices that require an increased number of electrical interconnection sites. Accordingly, semiconductor die or devices with an increased I/O and interconnection requirement can be incorporated into dual Fo-WLCSP 440.

Dual Fo-WLCSP 440 also includes build-up interconnect structure 432. Build-up interconnect structure 432 provides additional conductive layers within dual Fo-WLCSP 440, which may be used as a ground plane and for connection to other internal, e.g., passive device 414, or external devices. Embedding passive devices 366 and 414 within dual Fo-WLCSP 440 increases the electrical performance and functionality of dual Fo-WLCSP 440 without increasing the package profile. The conductive layers of build-up interconnect structure 432, for example conductive layer 422 and conductive layer 426, are formed with relaxed design rules, meaning the conductive traces within conductive layers 422 and 426 can be formed with a larger pitch and wider line spacing than the conductive traces of conductive layers 380 and 384 of build-up interconnect structure 390. Relaxing the design rules of build-up interconnect structure 432 allows for greater flexibility in the materials and manufacturing techniques used in the fabrication of build-up interconnect structure 432. Build-up interconnect structure 432 can be formed using standard equipment and materials, as opposed to materials specific to fabricating conductive layers with fine line spacing. The use of standardized equipment and materials reduces the manufacturing time and cost of dual Fo-WLCSP 440. Additionally, the relaxed design rules for build-up interconnect structure 432 provide greater flexibility in the placement of bumps 430 and the spacing of the conductive traces within conductive layers 422 and 426. The placement of bumps 430 and the line spacing of the conductive layers with build-up interconnect structure 432, particularly the line spacing of the final conductive layer, i.e., conductive layer 426, can be selected to mirror industry standards. For example, bumps 430 are formed with the same spacing as the interconnection pads on a standard PCB. Spacing the conductive traces of conductive layer 426 and/or forming bumps 430 according to industry standards makes dual Fo-WLCSP 440 compatible with an increased number of semiconductor devices and components.

As technology advances, the electrical interconnection requirement of semiconductor die and devices is increasing. Dual Fo-WLCSP 440 is able to incorporate semiconductor die with a high interconnection requirement due to the narrow pitch and fine line spacing of build-up interconnect structure 390, while remaining compatible with standard devices and cost efficient to manufacture due to the larger pitch and wider line spacing of build-up interconnect structure 432.

Figure 11A:
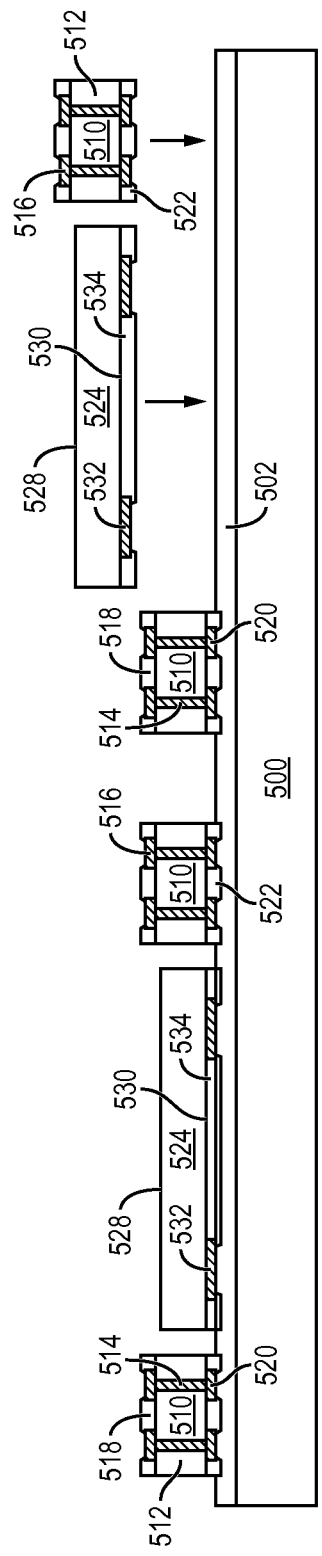

FIGS. 11a-11h illustrate, in relation to FIGS. 1 and 2a-2c, a process of forming a dual fan-out semiconductor device including embedded 3D interconnect structures. FIG. 11a shows a cross-sectional view of a portion of a carrier or temporary substrate 500 containing sacrificial base material such as silicon, polymer, beryllium oxide, glass, or other suitable low-cost, rigid material for structural support. An interface layer or double-sided tape 502 is formed over carrier 500 as a temporary adhesive bonding film, etch-stop layer, or thermal release layer.

Semiconductor die 524, similar to semiconductor die 124 from FIG. 3c, are mounted to carrier 500 and interface layer 502 using, for example, a pick and place operation with active surface 530 oriented toward the carrier. A plurality of 3D interconnect structures 510 are mounted to carrier 500 adjacent to semiconductor die 524.

3D interconnect structure or interposer 510 is prefabricated, i.e., interposer 510 is formed prior to mounting interposer 510 to carrier 500. Interposer 510 includes a core substrate 512. Substrate 512 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 512 includes one or more insulating or passivation layers.

A plurality of through vias is formed through core substrate 512 using laser drilling, mechanical drilling, or deep reactive ion etching (DRIE). The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 514. In one embodiment, Cu is deposited over the sidewall of the through vias by electroless plating and electroplating. The through vias are filled with conductive paste or plugging resin with fillers.

An electrically conductive layer or RDL 516 is formed over the surface of core substrate 512 and conductive vias 514 using a patterning and metal deposition process such as printing, PVD, CVD, sputtering, electrolytic plating, and electroless plating. Conductive layer 516 includes one or more layers of Al, Cu, Sn, Ni, Au, Ag, or other suitable electrically conductive material. Conductive layer 516 is electrically connected to conductive vias 514. Conductive layer 516 operates as contact pads electrically connected to conductive vias 514.

An insulating or passivation layer 518 is formed over the surface of core substrate 512 and conductive layer 516 using PVD, CVD, printing, spin coating, spray coating, slit coating, rolling coating, lamination, sintering, or thermal oxidation. Insulating layer 518 includes one or more layers of SiO2, Si3N4, SiON, Ta2O5, Al2O3, hafnium oxide (HfO2), benzocyclobutene (BCB), polyimide (PI), polybenzoxazoles (PBO), polymer dielectric resist with or without fillers or fibers, or other material having similar structural and dielectric properties. A portion of insulating layer 518 is removed by LDA, etching, or other suitable process to expose portions of conductive layer 516. In one embodiment, insulating layer 518 is a masking layer.

An electrically conductive layer or RDL 520 is formed over a surface of core substrate 512 opposite conductive layer 516 using a patterning and metal deposition process such as printing, PVD, CVD, sputtering, electrolytic plating, and electroless plating. Conductive layer 520 includes one or more layers of Al, Cu, Sn, Ni, Au, Ag, or other suitable electrically conductive material. Conductive layer 520 is electrically connected to conductive vias 514 and conductive layer 516. Conductive layer 520 operates as contact pads electrically connected to conductive vias 514. Alternatively, conductive vias 514 are formed through core substrate 512 after forming conductive layer 516 and/or conductive layer 520.

An insulating or passivation layer 522 is formed over the surface of core substrate 512 and conductive layer 520 using PVD, CVD, printing, spin coating, spray coating, slit coating, rolling coating, lamination, sintering, or thermal oxidation. Insulating layer 522 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 522 is removed by LDA, etching, or other suitable process to expose portions of conductive layer 520. In one embodiment, insulating layer 522 is a masking layer. Substrate 512 is then singulated into individual 3D interconnect units or interposers 510. Interposer 510 is known good having been inspected and tested by open/short probe or auto-scope inspection at an interim stage, i.e., prior to mounting semiconductor die 524. Portions of conductive layer 516, conductive layer 520, and conductive vias 514 are electrically common or electrically isolated according to the design and function of semiconductor die 524 and later mounted semiconductor die or devices.

In FIG. 11b, an encapsulant or molding compound 540 is deposited over semiconductor die 524 and carrier 500 and around interposers 510 using a paste printing, compressive molding, transfer molding, liquid encapsulant molding, vacuum lamination, spin coating, or other suitable applicator. Encapsulant 540 can be polymer composite material, such as epoxy resin with filler, epoxy acrylate with filler, or polymer with proper filler. Encapsulant 540 is non-conductive and environmentally protects the semiconductor device from external elements and contaminants. Encapsulant 540 also protects semiconductor die 524 from degradation due to exposure to light. The filler and CTE of encapsulant 540 are selected to aid with gap filling, warpage control, and reliability. A backgrinding operation may be performed to expose conductive layer 516 of interposer 510 and/or surface 528 of semiconductor die 524. In an alternate embodiment, conductive vias 514 are formed directly through encapsulant 540.

Continuing from FIG. 11b, carrier 500 and interface layer 502 are removed by chemical etching, mechanical peeling, CMP, mechanical grinding, thermal bake, UV light, laser scanning, or wet stripping to leaving conductive layer 532 and insulating layer 534 of semiconductor die 524 and conductive layer 520 and insulating layer 522 of interposer 510 exposed from encapsulant 540.

In FIG. 11c, a build-up interconnect structure 560 is formed over conductive layer 532 and insulating layer 534 of semiconductor die 524, conductive layer 520 and insulating layer 522 of interposer 510, and encapsulant 540. Build-up interconnect structure 560 includes insulating layer 550, conductive layer 552, insulating layer 554, and conductive layer 556. Insulating or passivation layer 550 is formed over conductive layer 532, insulating layer 534, conductive layer 520, insulating layer 522, and encapsulant 540 using PVD, CVD, printing, slit coating, spin coating, spray coating, injection coating, lamination, sintering, or thermal oxidation. The insulating layer 550 contains one or more layers of SiO2, Si3N4, SiON, Ta2O5, Al2O3, low temperature (less than 250° C.) curing polymer dielectric materials, or other material having similar insulating and structural properties. A portion of insulating layer 550 is removed by an exposure and development process, LDA, etching, or other suitable process to expose conductive layer 520 of interposer 510 and conductive layer 532 of semiconductor die 524.

Electrically conductive layer or RDL 552 is formed over insulating layer 550 using PVD, CVD, electrolytic plating, electroless plating process, or other suitable metal deposition process. Conductive layer 552 can be one or more layers of Al, Ti, TiW, Cu, Sn, Ni, Au, Ag, or other suitable electrically conductive material. One portion of conductive layer 552 is electrically connected to conductive layer 532 of semiconductor die 524. One portion of conductive layer 552 is electrically connected to conductive layer 520 of interposer 510. Other portions of conductive layer 552 can be electrically common or electrically isolated depending on the design and function of semiconductor die 524. Conductive layer 552 includes a plurality of conductive traces. The conductive traces of conductive layer 552 are formed with narrow pitch and fine line spacing. For example, the conductive traces within conductive layer 552 are formed with a minimum line spacing of 5 μm, i.e., the minimum distance between the edges of adjacent conductive traces within conductive layer 552 is 5 μm. In one embodiment, conductive layer 552 has a minimum line spacing or distance between adjacent conductive traces of greater than or equal to 10 μm. The narrow pitch and fine line spacing of the conductive traces within conductive layer 552 creates space for more conductive traces over semiconductor die 524 and encapsulant 540.

Insulating or passivation layer 554 is formed over insulating layer 550 and conductive layer 552 using PVD, CVD, printing, slit coating, spin coating, spray coating, injection coating, lamination, sintering, or thermal oxidation. Insulating layer 554 includes one or more layers of SiO2, Si3N4, SiON, Ta2O5, Al2O3, low temperature (less than 250° C.) curing polymer dielectric materials, or other material having similar insulating and structural properties. A portion of insulating layer 554 is removed by an exposure and development process, LDA, etching, or other suitable process to expose conductive layer 552.

Electrically conductive layer or RDL 556 is formed over conductive layer 552 and insulating layer 554 using PVD, CVD, electrolytic plating, electroless plating process, or other suitable metal deposition process. Conductive layer 556 can be one or more layers of Al, Ti, TiW, Cu, Sn, Ni, Au, Ag, or other suitable electrically conductive material. One portion of conductive layer 556 is electrically connected to conductive layer 552. Other portions of conductive layer 556 can be electrically common or electrically isolated depending on the design and function of semiconductor die 524. Conductive layer 556 includes a plurality of conductive traces. The conductive traces of conductive layer 556 are formed with narrow pitch and fine line spacing. For example, the conductive traces within conductive layer 556 are formed with a minimum line spacing of 5 μm. In one embodiment, conductive layer 556 has a minimum line spacing of greater than or equal to 10 μm. The narrow pitch and fine line spacing of the conductive traces within conductive layer 556 creates space for more conductive traces over semiconductor die 524 and encapsulant 540.

In one embodiment, an additional insulating or passivation layer, similar to layer 178 in FIG. 5j, is formed over insulating layer 554 and conductive layer 556 using PVD, CVD, printing, slit coating, spin coating, spray coating, injection coating, lamination, sintering, or thermal oxidation. The additional insulating layer includes one or more layers of low temperature (less than 250° C.) curing polymer dielectric materials, SiO2, Si3N4, SiON, Ta2O5, Al2O3, polymer dielectric resist with or without fillers or fibers, or other material having similar structural and insulating properties. A portion of the additional insulating layer is removed by an exposure and development process, LDA, etching, or other suitable process to expose conductive layer 556.

Continuing from FIG. 11c, the combination of insulating layer 550, conductive layer 552, insulating layer 554, and conductive layer 556 constitutes a build-up interconnect structure 560 formed over semiconductor die 524, interposer 510, and encapsulant 540. Conductive layer 552, conductive layer 556, insulating layer 550, and insulating layer 554 may include an IPD, such as a capacitor, inductor, or resistor. Build-up interconnect structure 560 is formed using fine pitch and line spacing technology, e.g., photosensitive dielectric resist and selectively plated Cu, and can have a line spacing as narrow as 5 μm. In one embodiment, the minimum line spacing of build-up interconnect structure 560 is greater than or equal to 10 μm. The narrow pitch and fine line spacing of conductive layers 552 and 556 creates space for a higher number of conductive traces within build-up interconnect structure 560. The increased density of conductive traces increases the number of possible interconnections sites and I/O terminal count of build-up interconnect structure 560. Thus, build-up interconnect structure 560 can be formed over semiconductor die that require an increased number of electrical interconnection sites. The narrow pitch and fine line spacing of the conductive layers within build-up interconnect structure 560 increases the conductive trace density and I/O of build-up interconnect structure 560, without requiring the formation of additional RDLs. In one embodiment, interconnect structure 560 includes three or less RDLs. The limited number of RDLs within build-up interconnect structure 560 allows for a smaller and thinner overall semiconductor package, reduces warpage, and increases the speed of the device.

Semiconductor die 524, interposer 510, and build-up interconnect structure 560 represent a Fo-WLCSP in reconstituted wafer form. In FIG. 11d, the reconstituted wafer is singulated through build-up interconnect structure 560 and encapsulant 540 using a saw blade or laser cutting tool 562 into individual Fo-WLCSP 564 containing semiconductor die 524 and interposer 510.

Figure 11E:
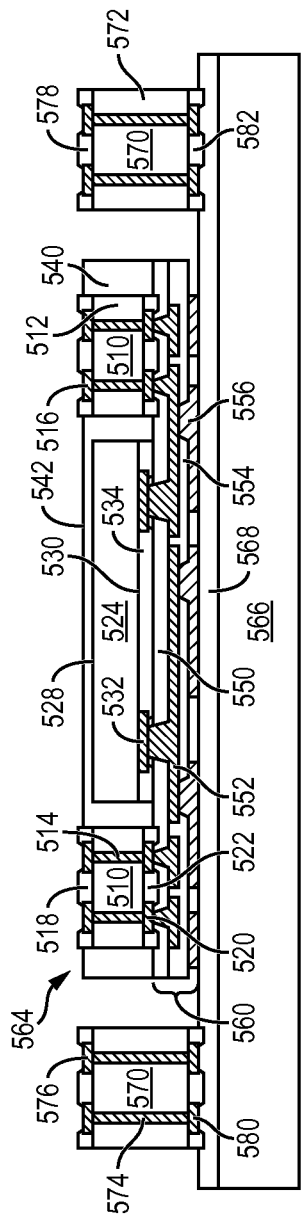

In FIG. 11e, Fo-WLCSP 564 from FIG. 11d, and 3D interconnect structures or interposers 570 are aligned with and mounted to temporary substrate or carrier 566 with conductive layer 556 of Fo-WLCSP 564 and insulating layer 582 and conductive layer 580 of interposer 570 oriented toward carrier 566.

3D interconnect structure or interposer 570 is prefabricated, i.e., interposer 570 is formed prior to mounting interposer 570 to carrier 566. Interposer 570 includes a core substrate 572. Substrate 572 includes one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Alternatively, core substrate 572 includes one or more insulating or dielectric layers.

A plurality of through vias is formed through core substrate 572 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 574. In one embodiment, Cu is deposited over the sidewall of the through vias by electroless plating and electroplating. The through vias are filled with conductive paste or plugging resin with fillers.

An electrically conductive layer or RDL 576 is formed over a surface of core substrate 572 and conductive vias 574 using a patterning and metal deposition process such as printing, PVD, CVD, sputtering, electrolytic plating, and electroless plating. Conductive layer 576 includes one or more layers of Al, Cu, Sn, Ni, Au, Ag, or other suitable electrically conductive material. Conductive layer 576 is electrically connected to conductive vias 574. Conductive layer 576 operates as contact pads electrically connected to conductive vias 574.

An insulating or passivation layer 578 is formed over the surface of core substrate 572 and conductive layer 576 using PVD, CVD, printing, spin coating, spray coating, slit coating, rolling coating, lamination, sintering, or thermal oxidation. Insulating layer 578 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 578 is removed by LDA, etching, or other suitable process to expose portions of conductive layer 576. In one embodiment, insulating layer 578 is a masking layer.

An electrically conductive layer or RDL 580 is formed over a surface of core substrate 572 opposite the conductive layer 576 using a patterning and metal deposition process such as printing, PVD, CVD, sputtering, electrolytic plating, and electroless plating. Conductive layer 580 includes one or more layers of Al, Cu, Sn, Ni, Au, Ag, or other suitable electrically conductive material. Conductive layer 580 is electrically connected to conductive vias 574 and conductive layer 576. Alternatively, conductive vias 574 are formed through core substrate 572 after forming conductive layer 576 and/or conductive layer 580.

An insulating or passivation layer 582 is formed over conductive layer 580 using PVD, CVD, printing, spin coating, spray coating, slit coating, rolling coating, lamination, sintering, or thermal oxidation. The insulating layer 582 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 582 is removed by an exposure and development process, LDA, etching, or other suitable process to expose portions of conductive layer 580. In one embodiment, insulating layer 582 is a masking layer. Substrate 572 is then singulated into individual 3D interconnect units or interposers 570. Interposer 570 provides electrical interconnect vertically across the substrate through conductive vias 574 according to the electrical function of semiconductor die 524 and later mounted semiconductor die or devices. Interposer 570 is known good having been inspected and tested by open/short probe or auto-scope inspection at an interim stage, i.e., prior to mounting Fo-WLCSP 564.

Figure 11F:
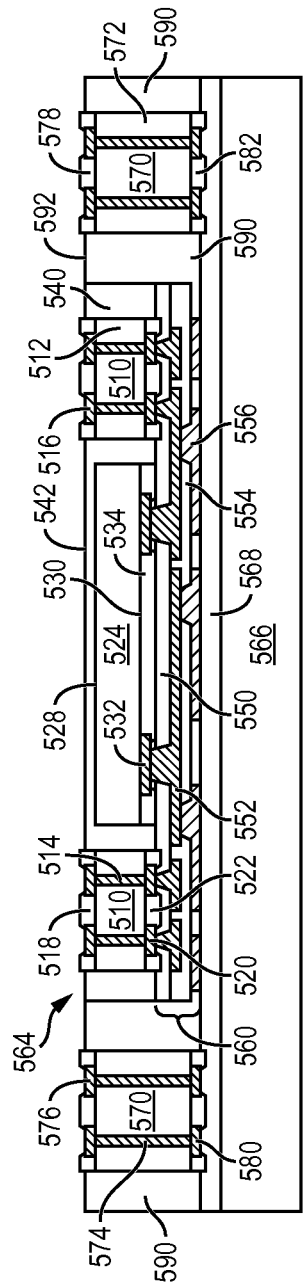

In FIG. 11f, an encapsulant or molding compound 590 is deposited over Fo-WLCSP 564 and around interposer 570 using a paste printing, compressive molding, transfer molding, liquid encapsulant molding, vacuum lamination, spin coating, or other suitable applicator. Encapsulant 590 can be polymer composite material, such as epoxy resin with filler, epoxy acrylate with filler, or polymer with proper filler. Encapsulant 590 is non-conductive and environmentally protects the semiconductor device from external elements and contaminants. Encapsulant 590 also protects semiconductor die 524 from degradation due to exposure to light. The filler and CTE of encapsulant 590 are selected to aid with gap filling, warpage control, and reliability. Prior to forming encapsulant 590, a backgrinding operation and/or an RF etching, plasma clean, solvent strip, or wet clean process is performed on Fo-WLCSP 564 to roughen the surfaces of encapsulant 540 and build-up interconnect structure 560 and improve adhesion of encapsulant 590. Encapsulant 590 and/or encapsulant 540 include a controlled stress-releasing agent to improve adhesion of encapsulant 590. In one embodiment, a backgrinding operation is performed to remove a portion of encapsulants 590 and 540 and expose conductive layer 576 of interposer 570, conductive layer 516 of interposer 510, and surface 528 of semiconductor die 524. Alternatively, conductive vias 574 are formed directly through encapsulant 590.

Continuing from FIG. 11f, carrier 566 and interface layer 568 are removed by chemical etching, mechanical peeling, CMP, mechanical grinding, thermal bake, UV light, laser scanning, or wet stripping leaving conductive layer 556 and insulating layer 554 of Fo-WLCSP 564 and conductive layer 580 and insulating layer 582 of interposer 570 exposed from encapsulant 590.

Figure 11G:
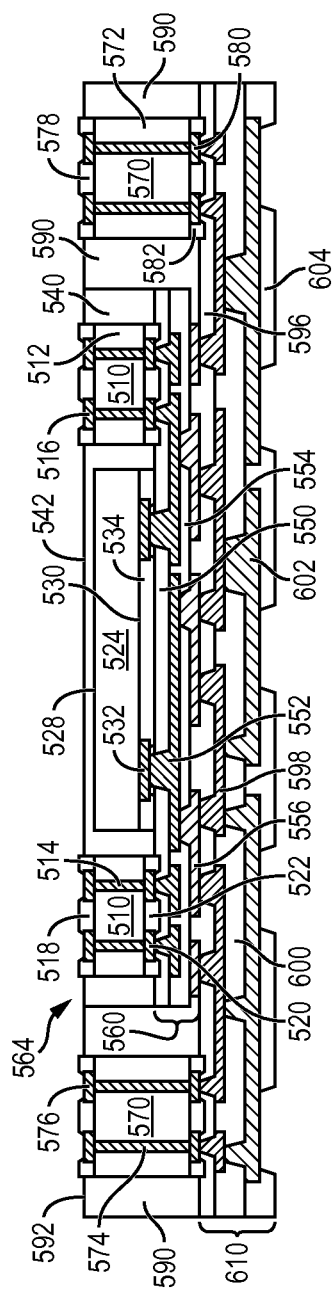

In FIG. 11g, a build-up interconnect structure 610 is formed over conductive layer 556 and insulating layer 554 of Fo-WLCSP 564, conductive layer 580 and insulating layer 582 of interposer 570, and encapsulant 590. Build-up interconnect structure 610 includes insulating layer 596, conductive layer 598, insulating layer 600, conductive layer 602, insulating layer 604, and bumps 606.

Insulating or passivation layer 596 is formed over conductive layer 556, insulating layer 554, conductive layer 580, insulating layer 582, and encapsulant 590 using PVD, CVD, printing, slit coating, spin coating, spray coating, injection coating, lamination, sintering, or thermal oxidation. Insulating layer 596 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, the material selected for insulating layer 596 is the same as the material selected for insulating layer 554 of build-up interconnect structure 560. A portion of insulating layer 596 is removed by an exposure and development process, LDA, etching, or other suitable process to expose conductive layer 556 of Fo-WLCSP 564 and conductive layer 580 of interposer 570.

An electrically conductive layer or RDL 598 is formed over insulating layer 596. Conductive layer 598 can be one or more layers of Al, Ti, TiW, Cu, Sn, Ni, Au, Ag, or other suitable electrically conductive material. One portion of conductive layer 598 is electrically connected to conductive layer 556 of Fo-WLCSP 564. One portion of conductive layer 598 is electrically connected to conductive layer 580 of interposer 570. Other portions of conductive layer 598 can be electrically common or electrically isolated depending on the design and function of semiconductor die 524. Conductive layer 598 includes a plurality of conductive traces. Conductive layer 598 is formed with a larger pitch and wider line spacing than build-up interconnect structure 560, i.e., the conductive traces within conductive layer 598 have a larger pitch than the conductive traces within build-up interconnect structure 560 and the distance between the edges of adjacent conductive traces within conductive layer 598 is greater than the distance between the edges of adjacent conductive traces within build-up interconnect structure 560. For example, conductive layer 598 has a minimum line spacing or distance between adjacent conductive traces of 15 μm. In one embodiment, the minimum line spacing of conductive layer 598 is greater than or equal to 30 μm and the minimum line spacing of build-up interconnect structure 560 is greater than or equal to 10 μm.

An insulating or passivation layer 600 is formed over insulating layer 596 and conductive layer 598 using PVD, CVD, printing, slit coating, spin coating, spray coating, injection coating, lamination, sintering, or thermal oxidation. Insulating layer 600 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. A portion of insulating layer 600 is removed by an exposure and development process, LDA, etching, or other suitable process to expose conductive layer 598.

An electrically conductive layer or RDL 602 is formed over conductive layer 598 and insulating layer 600 using PVD, CVD, electrolytic plating, electroless plating process, or other suitable metal deposition process. Conductive layer 602 can be one or more layers of Al, Ti, TiW, Cu, Sn, Ni, Au, Ag, or other suitable electrically conductive material. One portion of conductive layer 602 is electrically connected to conductive layer 598. Other portions of conductive layer 602 can be electrically common or electrically isolated depending on the design and function of semiconductor die 524. Conductive layer 602 includes a plurality of conductive traces. Conductive layer 602 is formed with a larger pitch and wider line spacing than build-up interconnect structure 560. For example, conductive layer 602 has a minimum line spacing of 15 μm. In one embodiment, the minimum line spacing of conductive layer 602 is greater than or equal to 30 μm and the minimum line spacing of build-up interconnect structure 560 is greater than or equal to 10 μm.

An insulating or passivation layer 604 is formed over insulating layer 600 and conductive layer 602 using PVD, CVD, printing, slit coating, spin coating, spray coating, injection coating, lamination, sintering, or thermal oxidation. Insulating layer 604 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, insulating layer 604 is a solder resist. Alternatively, insulating layer 604 is a double layer in which a first layer is a composite material including fiber, e.g., woven glass fiber, and the second layer of the double layer is a solder resist. A portion of insulating layer 604 is removed by an exposure and development process, LDA, etching, or other suitable process to expose conductive layer 602.

Figure 11H:
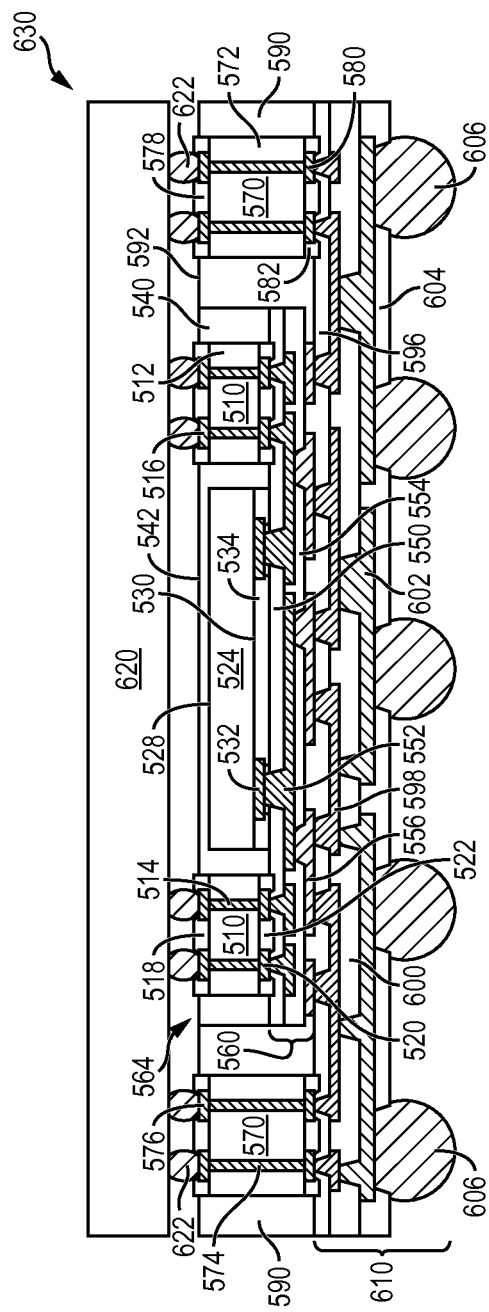

In FIG. 11h, an electrically conductive bump material is deposited over conductive layer 602 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 602 using a suitable attachment or bonding process. In one embodiment, the bump material is reflowed by heating the material above the material's melting point to form balls or bumps 606. In some applications, bumps 606 are reflowed a second time to improve electrical contact to conductive layer 602. In one embodiment, bumps 606 are formed over a UBM layer. Bumps 606 can also be compression bonded or thermocompression bonded to conductive layer 602. Bumps 606 represent one type of interconnect structure that can be formed over conductive layer 602. The interconnect structure can also use bond wires, conductive paste, stud bump, micro bump, or other electrical interconnect.

The combination of insulating layer 596, conductive layer 598, insulating layer 600, conductive layer 602, insulating layer 604, and bumps 606 constitutes a build-up interconnect structure 610 formed over Fo-WLCSP 564, interposer 570, and encapsulant 590. Conductive layer 598, conductive layer 602, insulating layer 596, insulating layer 600, and insulating layer 604 may include an IPD, such as a capacitor, inductor, or resistor. Build-up interconnect structure 610 may include as few as one RDL, such as conductive layer 598. In alternative embodiments, build-up interconnect structure 610 includes two or more RDL layers, such as conductive layers 598 and 602 and additional conductive layers similar to conductive layers 598 and 602. In one embodiment, at least one of the insulating layers of build-up interconnect structure 610 includes a glass cloth, glass cross, filler, or fiber, such as E-glass cloth, T-glass cloth, Al2O3, or silica filler, for enhanced bending strength. Build-up interconnect structure 610 has larger pitch and wider line spacing than build-up interconnect structure 560. In one embodiment, the minimum line spacing of build-up interconnect structure 560 is greater than or equal to 10 μm and the minimum line spacing of build-up interconnect structure 610 is greater than or equal to 30 μm. The larger pitch and wider line spacing of build-up interconnect structure 610 allows greater flexibility in the materials and manufacturing techniques used in the fabrication of build-up interconnect structure 610, which reduces manufacturing costs. In one embodiment, a portion of build-up interconnect structure 610 includes a ground plane.

A semiconductor device or component 620 is mounted to conductive layer 576 of interposer 570 and conductive layer 516 of interposer 510 with bumps 622 at the wafer level, i.e., before singulation. Semiconductor device 620 may include filter, memory and other IC chips, processors, microcontrollers, known-good packages, or any other packaged device containing semiconductor die or other electronic devices or circuitry. Bumps 622 are Al, Sn, Ni, Au, Ag, Pb, Bi, Cu, solder, and combinations thereof. Bumps 622 can be eutectic Sn/Pb, high-lead solder, or lead-free solder. Bumps 622 represent one type of interconnect structure that can be formed between semiconductor device 620 and conductive layers 576 and 516. The interconnect structure can also use bond wires, conductive paste, stud bump, micro bump, or other electrical interconnect. Semiconductor device 620 is mounted using pick and place or other suitable operation. Semiconductor device 620 is electrically connected to build-up interconnect structure 560 through conductive vias 514. Semiconductor device 620 is electrically connected to build-up interconnect structure 610 through conductive vias 574.

Fo-WLCSP 594, interposer 570, semiconductor device 620, and build-up interconnect structure 610 represent a dual fan-out package-on-package (Fo-PoP) in reconstituted wafer form. The reconstituted wafer is singulated through build-up interconnect structure 610, semiconductor device 620, and encapsulant 590 using a saw blade or laser cutting tool into individual dual Fo-PoP 630 containing semiconductor die 524, interposer 510, interposer 570, and semiconductor device 620. Alternatively, semiconductor device 620 is mounted after singulation. Interposers 510 and 570 provide electrical interconnect vertically through dual Fo-PoP 630 according to the design and function of semiconductor die 524 and semiconductor device 620. Interposers 510 and 570 can be made with low cost manufacturing technology, such as substrate manufacturing, and provide a cost effective process for forming vertical interconnection in dual Fo-PoP 630. Interposers 510 and 570 allow integration of additional packages or devices, e.g., device 620, within dual Fo-PoP 630. Incorporating additional devices in a stacked or "package-on-package" orientation increases the electrical performance and functionality of dual Fo-PoP 630 without increasing the package footprint.

Figure 12:
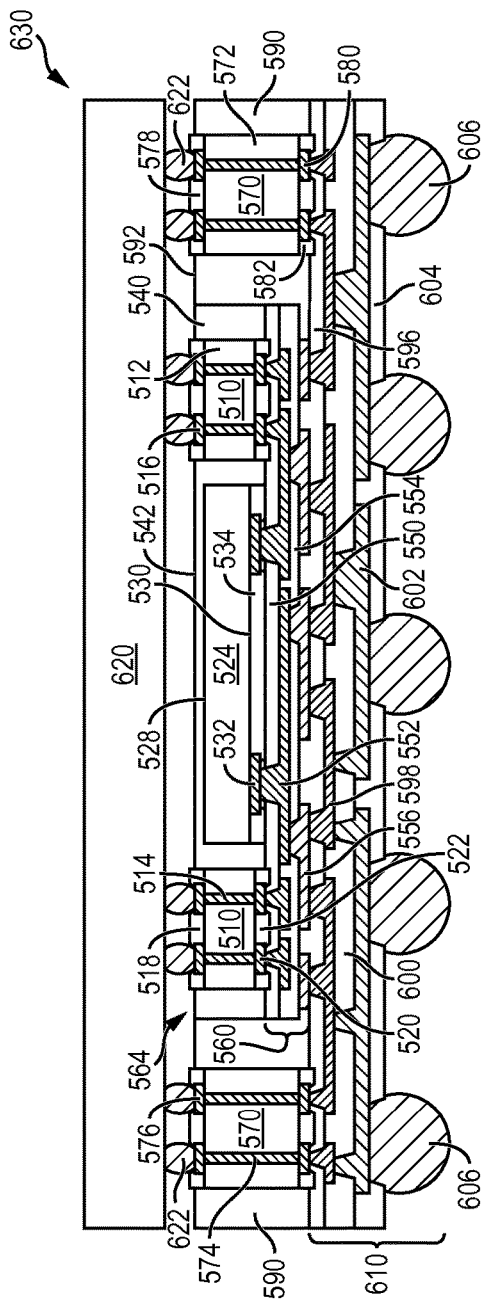
FIG. 12 illustrates the dual fan-out semiconductor device including embedded 3D interconnect structures according to FIGS. 11a-11h.

FIG. 12 shows dual Fo-PoP 630 after singulation. Semiconductor die 524 is electrically connected through build-up interconnect structure 560 and build-up interconnect structure 610 to bumps 606 for connection to external devices. The conductive layers of build-up interconnect structure 560, for example, conductive layer 552 and conductive layer 556, are formed using narrow pitch and fine line spacing processes and technology, e.g., photosensitive dielectric resist with selectively plated Cu. Forming the conductive layers in build-up interconnect structure 560 using narrow pitch and fine line spacing processes allows the conductive traces within the conductive layers to be formed closer together. Forming the conductive traces closer together allows more conductive traces to be formed over a given area, for example, the area over semiconductor die 524. An increase in the number of conductive traces over semiconductor die 524 increases the number of possible interconnections that may be formed with semiconductor die 524. Increasing the number of potential interconnections within a single conductive layer increases the I/O of build-up interconnect structure 560 without increasing the number of conductive layers. Accordingly, forming conductive layers 552 and 556 with narrow pitch, fine line spacing, and an increased number of conductive traces increases the number of possible interconnect sites and I/O of build-up interconnect structure 560 without requiring additional conductive layers. Forming less conductive layers within build-up interconnect structure 560 allows for a thinner build-up interconnect structure 560. A thinner build-up interconnect structure 560 reduces the overall size of Fo-WLCSP 564 and the package profile dual Fo-PoP 630. Limiting the number of layers within build-up interconnect structure 560 also reduces the number of layers that could potentially warp. A decrease in warpage increases the manufacturing yield of dual Fo-PoPs 630. Additionally, forming fewer conductive layers within build-up interconnect structure 560 reduces interconnect distance, i.e., the distance an electrical signal must travel, between semiconductor die 524 and bumps 606. Shorter interconnect distance increases the speed and electrical performance of dual Fo-PoP 630. The increased number of conductive traces, i.e., increased number of potential interconnections sites, within build-up interconnect structure 560 makes build-up interconnect structure 560 compatible with semiconductor devices that require an increased number of electrical interconnection sites. Accordingly, semiconductor die or devices with an increased I/O and interconnection requirement can be incorporated into dual Fo-PoP 630.

Dual Fo-PoP 630 also includes build-up interconnect structure 610. Build-up interconnect structure 610 provides additional conductive layers within dual Fo-PoP 630, which may be used as a ground plane and for connection to other internal or external devices. The conductive layers of build-up interconnect structure 610, for example conductive layer 598 and conductive layer 602, are formed with relaxed design rules, meaning the conductive traces within conductive layers 598 and 602 can be formed with a larger pitch and wider line spacing than the conductive traces of conductive layers 552 and 556 of build-up interconnect structure 560. Relaxing the design rules of build-up interconnect structure 610 allows for greater flexibility in the materials and manufacturing techniques used in the fabrication of build-up interconnect structure 610. Build-up interconnect structure 610 can be formed using standard equipment and materials, as opposed to materials specific to fabricating conductive layers with narrow pitch and fine line spacing. The use of standardized equipment and materials reduces the manufacturing time and cost of dual Fo-PoP 630. Additionally, the relaxed design rules for build-up interconnect structure 610 provide greater flexibility in the placement of bumps 606 and the spacing of the conductive traces within conductive layers 598 and 602. The placement of bumps 606 and the line spacing of the conductive layers with build-up interconnect structure 610, particularly the line spacing of the final conductive layer, i.e., conductive layer 602, can be selected to mirror industry standards. For example, bumps 606 are formed with the same spacing as the interconnection pads on a standard PCB. Spacing the conductive traces of conductive layer 602 and/or forming bumps 606 according to industry standards makes dual Fo-PoP 630 compatible with an increased number of semiconductor devices and components.

As technology advances, the electrical interconnection density of semiconductor die is increasing. Dual Fo-PoP 630 is able to incorporate semiconductor die with a high interconnection requirement due to the narrow pitch and fine line spacing of build-up interconnect structure 560, while remaining compatible with standard devices and cost efficient to manufacture due to the larger pitch and wider line spacing of build-up interconnect structure 610.

Figure 13:
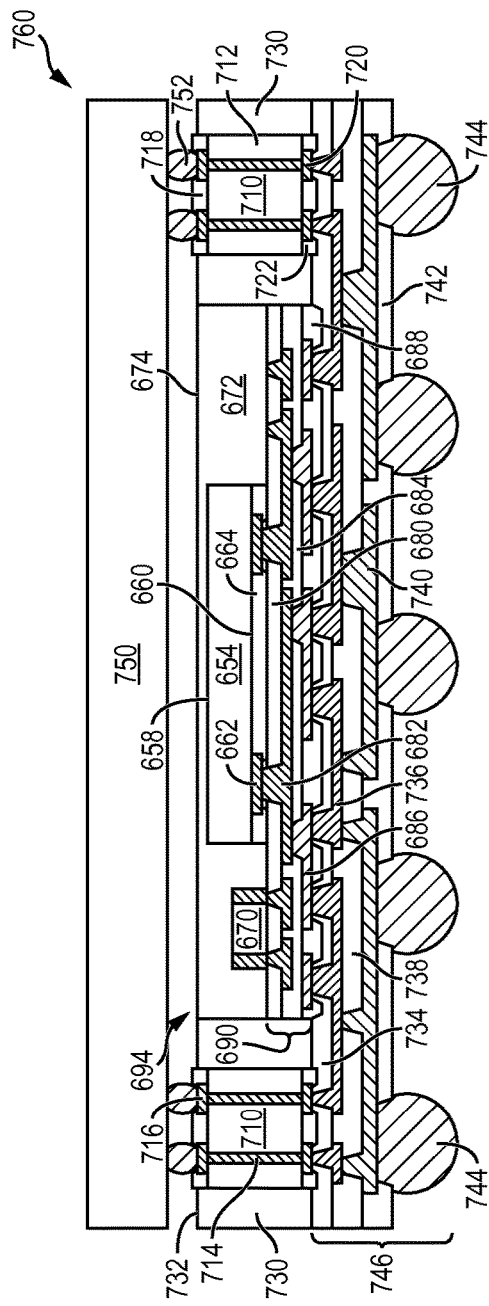
FIG. 13 illustrates a dual fan-out semiconductor device including an embedded passive device and an embedded 3D interconnect structure.

FIG. 13 illustrates an embodiment of dual Fo-PoP 760 including a Fo-WLCSP 694, an interposer 710, and a build-up interconnect structure 746. Fo-WLCSP 694 is similar to Fo-WLCSP 400 in FIG. 9e; interposer 710 is similar to interposer 570 in FIG. 11e; build-up interconnect structure 746 is similar to build-up interconnect structure 610 in FIG. 11h.

A semiconductor die 654, similar to semiconductor die 124 in FIG. 3c, is disposed over a temporary substrate or carrier, similar to carrier 350 in FIG. 9a, with active surface 660 of semiconductor die 654 oriented toward the carrier. The carrier includes a sacrificial base material such as silicon, polymer, beryllium oxide, glass, or other suitable low-cost, rigid material for structural support. An interface layer or double-sided tape, similar to interface layer 352 in FIG. 9a, is formed over the carrier as a temporary adhesive bonding film, etch-stop layer, or thermal release layer.

A semiconductor component or passive device 670, similar to passive device 366 in FIG. 9a, is mounted to the carrier adjacent to semiconductor die 654. An encapsulant 672 is deposited over semiconductor die 654 and passive device 670 using a paste printing, compressive molding, transfer molding, liquid encapsulant molding, vacuum lamination, spin coating, or other suitable applicator. Encapsulant 672 can be polymer composite material, such as epoxy resin with filler, epoxy acrylate with filler, or polymer with proper filler. Encapsulant 672 is non-conductive and environmentally protects the semiconductor device from external elements and contaminants. Encapsulant 672 also protects semiconductor die 654 from degradation due to exposure to light. The filler and CTE of encapsulant 672 are selected to aid with gap filling, warpage control, and reliability. In one embodiment, a portion of back surface 674 of encapsulant 672 is removed in a backgrinding operation. The backgrinding operation planarizes encapsulant 672 and exposes back surface 658 of semiconductor die 654.

The carrier and interface layer are then removed by chemical etching, mechanical peeling, CMP, mechanical grinding, thermal bake, UV light, laser scanning, or wet stripping to leaving passive device 670 and conductive layer 662 and insulating layer 664 of semiconductor die 654 exposed from encapsulant 672.

A build-up interconnect structure 690, similar to build-up interconnect structure 390 in FIG. 10, is formed over conductive layer 662 and insulating layer 664 of semiconductor die 654, passive device 670, encapsulant 672. Build-up interconnect structure 690 includes an insulating layer 680, a conductive layer 682, an insulating layer 684, a conductive layer 686, and an optional insulating layer 688.

Insulating or passivation layer 680 is formed over passive device 670, insulating layer 664 and conductive layer 662 of semiconductor die 654, and encapsulant 672 using PVD, CVD, printing, lamination, spin coating, spray coating, sintering, or thermal oxidation. The insulating layer 680 contains one or more layers of SiO2, Si3N4, SiON, Ta2O5, Al2O3, low temperature (less than 250° C.) curing polymer dielectric materials, or other material having similar insulating and structural properties. A portion of insulating layer 680 is removed by an exposure and development process, LDA, etching, or other suitable process to expose conductive layer 662 and passive device 670.

Electrically conductive layer or RDL 682 is formed over insulating layer 680, passive device 670, and conductive layer 662 using PVD, CVD, electrolytic plating, electroless plating process, or other suitable metal deposition process. Conductive layer 682 can be one or more layers of Al, Ti, TiW, Cu, Sn, Ni, Au, Ag, or other suitable electrically conductive material. One portion of conductive layer 682 is electrically connected to conductive layer 662 of semiconductor die 654. One portion of conductive layer 682 is electrically connected to passive device 670. Other portions of conductive layer 682 can be electrically common or electrically isolated depending on the design and function of semiconductor die 654. Conductive layer 682 includes a plurality of conductive traces. The conductive traces of conductive layer 682 are formed with narrow pitch and fine line spacing. For example, the conductive traces within conductive layer 682 are formed with a minimum line spacing of 5 μm, i.e., the minimum distance between the edges of adjacent conductive traces within conductive layer 682 is 5 μm. In one embodiment, conductive layer 682 has a minimum line spacing or distance between adjacent conductive traces of greater than or equal to 10 μm. The narrow pitch and fine line spacing of the conductive traces within conductive layer 682 creates space for more conductive traces over semiconductor die 654 and encapsulant 672.

Insulating or passivation layer 684 is formed over insulating layer 680 and conductive layer 682 using PVD, CVD, printing, lamination, spin coating, spray coating, sintering, or thermal oxidation. The insulating layer 684 contains one or more layers of SiO2, Si3N4, SiON, Ta2O5, Al2O3, low temperature (less than 250° C.) curing polymer dielectric materials, or other material having similar insulating and structural properties. A portion of insulating layer 684 is removed by an exposure and development process, LDA, etching, or other suitable process to expose conductive layer 682.

Electrically conductive layer or RDL 686 is formed over conductive layer 682 and insulating layer 684 using PVD, CVD, electrolytic plating, electroless plating process, or other suitable metal deposition process. Conductive layer 686 can be one or more layers of Al, Ti, TiW, Cu, Sn, Ni, Au, Ag, or other suitable electrically conductive material. One portion of conductive layer 686 is electrically connected to conductive layer 682. Other portions of conductive layer 686 can be electrically common or electrically isolated depending on the design and function of semiconductor die 654. Conductive layer 686 includes a plurality of conductive traces. The conductive traces of conductive layer 686 are formed with narrow pitch and fine line spacing. For example, the conductive traces within conductive layer 686 are formed with a minimum line spacing of 5 μm. In one embodiment, conductive layer 686 has a minimum line spacing of greater than or equal to 10 μm. The narrow pitch and fine line spacing of the conductive traces within conductive layer 686 creates space for more conductive traces over semiconductor die 654 and encapsulant 672.

Optional insulating or passivation layer 688 is formed over insulating layer 684 and conductive layer 686 using PVD, CVD, printing, lamination, spin coating, spray coating, sintering, or thermal oxidation. The insulating layer 688 contains one or more layers of SiO2, Si3N4, SiON, Ta2O5, Al2O3, low temperature (less than 250° C.) curing polymer dielectric materials, or other material having similar insulating and structural properties. A portion of insulating layer 688 is removed by an exposure and development process, LDA, etching, or other suitable process to expose conductive layer 686.

The combination of insulating layer 680, conductive layer 682, insulating layer 684, conductive layer 686, and insulating layer 688 constitutes build-up interconnect structure 690 formed over passive device 670, semiconductor die 654 and encapsulant 672. Conductive layers 682 and 686 and insulating layers 680, 684, and 688 may include an IPD, such as a capacitor, inductor, or resistor. Build-up interconnect structure 690 is formed using narrow pitch and fine line spacing technology, e.g., photosensitive dielectric resist and selectively plated Cu, and can have a line spacing as narrow as 5 μm. In one embodiment, the minimum line spacing of build-up interconnect structure 690 is greater than or equal to 10 μm. The narrow pitch and fine line spacing of conductive layers 682 and 686 creates space for a higher number of conductive traces within build-up interconnect structure 690. The increased density of conductive traces increases the number of possible interconnections sites and I/O terminal count of build-up interconnect structure 690. Thus, build-up interconnect structure 690 can be formed over semiconductor die that require an increased number of electrical interconnection sites. The narrow pitch and fine line spacing of the conductive layers within build-up interconnect structure 690 increases the conductive trace density and I/O of build-up interconnect structure 690, without requiring the formation of additional RDLs. In one embodiment, build-up interconnect structure 690 includes three or less RDLs. The limited number of RDLs within build-up interconnect structure 690 allows for a smaller and thinner overall semiconductor package, reduces warpage, and increases the speed of the device.

Semiconductor die 654, passive device 670, and build-up interconnect structure 690 represent a Fo-WLCSP in reconstituted wafer form. The reconstituted wafer is singulated through build-up interconnect structure 690 and encapsulant 672 using a saw blade or laser cutting tool into individual Fo-WLCSP 694 containing semiconductor die 654 and passive device 670. Fo-WLCSP 694 is similar to Fo-WLCSP 400 in FIG. 9e.

Fo-WLCSP 694 and 3D interconnect structures or interposers 710, similar to interposer 570 in FIG. 11e, are aligned with and mounted to a temporary substrate or carrier, similar to carrier 566 in FIG. 11e, with conductive layer 586 and insulating layer 588 of Fo-WLCSP 694 and insulating layer 722 and conductive layer 720 of interposer 710 oriented toward the carrier. The carrier contains a sacrificial base material such as silicon, polymer, beryllium oxide, glass, or other suitable low-cost, rigid material for structural support. An interface layer or double-sided tape, similar to interface layer 568 in FIG. 11e, is formed over the carrier as a temporary adhesive bonding film, etch-stop layer, or thermal release layer.

3D interconnect structure or interposer 710 is prefabricated, i.e., interposer 710 is formed prior to mounting interposer 710 to the carrier. Interposer 710 includes a core substrate 712. Substrate 712 includes one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Alternatively, core substrate 712 includes one or more insulating or dielectric layers.

A plurality of through vias is formed through core substrate 712 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 714. In one embodiment, Cu is deposited over the sidewall of the through vias by electroless plating and electroplating. The through vias are filled with conductive paste or plugging resin with fillers.

An electrically conductive layer or RDL 716 is formed over a surface of core substrate 712 and conductive vias 714 using a patterning and metal deposition process such as printing, PVD, CVD, sputtering, electrolytic plating, and electroless plating. Conductive layer 716 includes one or more layers of Al, Cu, Sn, Ni, Au, Ag, or other suitable electrically conductive material. Conductive layer 716 is electrically connected to conductive vias 714. Conductive layer 716 operates as contact pads electrically connected to conductive vias 714.

An insulating or passivation layer 718 is formed over the surface of core substrate 712 and conductive layer 716 using PVD, CVD, printing, spin coating, spray coating, slit coating, rolling coating, lamination, sintering, or thermal oxidation. Insulating layer 718 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 718 is removed by LDA, etching, or other suitable process to expose portions of conductive layer 716. In one embodiment, insulating layer 718 is a masking layer.

An electrically conductive layer or RDL 720 is formed over a surface of core substrate 712 opposite the conductive layer 716 using a patterning and metal deposition process such as printing, PVD, CVD, sputtering, electrolytic plating, and electroless plating. Conductive layer 720 includes one or more layers of Al, Cu, Sn, Ni, Au, Ag, or other suitable electrically conductive material. Conductive layer 720 is electrically connected to conductive vias 714 and conductive layer 716. Alternatively, conductive vias 714 are formed through core substrate 712 after forming conductive layer 716 and/or conductive layer 720.

An insulating or passivation layer 722 is formed over conductive layer 720 using PVD, CVD, printing, spin coating, spray coating, slit coating, rolling coating, lamination, sintering, or thermal oxidation. The insulating layer 722 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 722 is removed by an exposure and development process, LDA, etching, or other suitable process to expose portions of conductive layer 720. In one embodiment, insulating layer 722 is a masking layer. Substrate 712 is then singulated into individual 3D interconnect units or interposers 710. Interposer 710 provides electrical interconnect vertically through dual Fo-PoP 760 through conductive vias 714 according to the design and function of semiconductor die 654 and semiconductor device 750. Interposer 710 is known good having been inspected and tested by open/short probe or auto-scope inspection at an interim stage, i.e., prior to mounting Fo-WLCSP 694.

An encapsulant or molding compound 730 is deposited over Fo-WLCSP 694 and around interposer 710 using a paste printing, compressive molding, transfer molding, liquid encapsulant molding, vacuum lamination, spin coating, or other suitable applicator. Encapsulant 730 can be polymer composite material, such as epoxy resin with filler, epoxy acrylate with filler, or polymer with proper filler. Encapsulant 730 is non-conductive and environmentally protects the semiconductor device from external elements and contaminants. Encapsulant 730 also protects semiconductor die 654 from degradation due to exposure to light. The filler and CTE of encapsulant 730 are selected to aid with gap filling, warpage control, and reliability. Prior to forming encapsulant 730, a backgrinding operation and/or an RF etching, plasma clean, solvent strip, or wet clean process is performed on Fo-WLCSP 694 to roughen the surfaces of encapsulant 672 and build-up interconnect structure 690 and improve adhesion of encapsulant 730. Encapsulant 730 and/or encapsulant 672 include a controlled stress-releasing agent to improve adhesion of encapsulant 730. In one embodiment, a portion of surface 732 of encapsulant 730 and surface 674 of encapsulant 672 is removed in a backgrinding operation to planarize encapsulants 730 and 672 and expose conductive layer 716 of interposer 710 and back surface 658 of semiconductor die 654. Alternatively, conductive vias 714 are formed directly through encapsulant 730.

The carrier and interface layer are removed by chemical etching, mechanical peeling, CMP, mechanical grinding, thermal bake, UV light, laser scanning, or wet stripping leaving conductive layer 686 and insulating layer 688 of Fo-WLCSP 694 and conductive layer 720 and insulating layer 722 of interposer 710 exposed from encapsulant 730.

A build-up interconnect structure 746 is formed over conductive layer 686 and insulating layer 688 of Fo-WLCSP 694, conductive layer 720 and insulating layer 722 of interposer 710, and encapsulant 730. Build-up interconnect structure 746 includes an insulating layer 734, a conductive layer 736, an insulating layer 738, a conductive layer 740, an insulating layer 742, and bumps 744.

Insulating or passivation layer 734 is formed over conductive layer 686, insulating layer 688, conductive layer 720, insulating layer 722, and encapsulant 730 using PVD, CVD, printing, slit coating, spin coating, spray coating, injection coating, lamination, sintering, or thermal oxidation. Insulating layer 734 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, the material selected for insulating layer 734 is the same as the material selected for insulating layer 688 of Fo-WLCSP 694. A portion of insulating layer 734 is removed by an exposure and development process, LDA, etching, or other suitable process to expose conductive layer 686 of Fo-WLCSP 694 and conductive layer 720 of interposer 710.

Electrically conductive layer or RDL 736 is formed over insulating layer 734. Conductive layer 736 can be one or more layers of Al, Ti, TiW, Cu, Sn, Ni, Au, Ag, or other suitable electrically conductive material. One portion of conductive layer 736 is electrically connected to conductive layer 686 of Fo-WLCSP 694. One portion of conductive layer 736 is electrically connected to conductive layer 720 of interposer 710. Other portions of conductive layer 736 can be electrically common or electrically isolated depending on the design and function of semiconductor die 654. Conductive layer 736 includes a plurality of conductive traces. Conductive layer 736 is formed with a larger pitch and wider line spacing than build-up interconnect structure 690, i.e., the conductive traces within conductive layer 736 have a larger pitch than the conductive traces within build-up interconnect structure 690 and the distance between the edges of adjacent conductive traces within conductive layer 736 is greater than the distance between the edges of adjacent conductive traces within build-up interconnect structure 690. For example, conductive layer 736 has a minimum line spacing or distance between adjacent conductive traces of 15 μm. In one embodiment, the minimum line spacing of conductive layer 736 is greater than or equal to 30 μm and the minimum line spacing of build-up interconnect structure 690 is greater than or equal to 10 μm.

Insulating or passivation layer 738 is formed over insulating layer 734 and conductive layer 736 using PVD, CVD, printing, slit coating, spin coating, spray coating, injection coating, lamination, sintering, or thermal oxidation. Insulating layer 738 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. A portion of insulating layer 738 is removed by an exposure and development process, LDA, etching, or other suitable process to expose conductive layer 736.

Electrically conductive layer or RDL 740 is formed over conductive layer 736 and insulating layer 738 using PVD, CVD, electrolytic plating, electroless plating process, or other suitable metal deposition process. Conductive layer 740 can be one or more layers of Al, Ti, TiW, Cu, Sn, Ni, Au, Ag, or other suitable electrically conductive material. One portion of conductive layer 740 is electrically connected to conductive layer 736. Other portions of conductive layer 740 can be electrically common or electrically isolated depending on the design and function of semiconductor die 654. Conductive layer 740 includes a plurality of conductive traces. Conductive layer 740 is formed with a larger pitch and wider line spacing than build-up interconnect structure 690. For example, conductive layer 740 has a minimum line spacing of 15 μm. In one embodiment, the minimum line spacing of conductive layer 740 is greater than or equal to 30 μm and the minimum line spacing of build-up interconnect structure 690 is greater than or equal to 10 μm.

Insulating or passivation layer 742 is formed over insulating layer 738 and conductive layer 740 using PVD, CVD, printing, slit coating, spin coating, spray coating, injection coating, lamination, sintering, or thermal oxidation. Insulating layer 742 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, insulating layer 742 is a solder resist. Alternatively, insulating layer 742 is a double layer in which a first layer is a composite material including fiber, e.g., woven glass fiber, and the second layer of the double layer is a solder resist. A portion of insulating layer 742 is removed by an exposure and development process, LDA, etching, or other suitable process to expose conductive layer 740.

Electrically conductive bump material is deposited over conductive layer 740 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 740 using a suitable attachment or bonding process. In one embodiment, the bump material is reflowed by heating the material above the material's melting point to form balls or bumps 744. In some applications, bumps 744 are reflowed a second time to improve electrical contact to conductive layer 740. In one embodiment, bumps 744 are formed over a UBM layer. Bumps 744 can also be compression bonded or thermocompression bonded to conductive layer 740. Bumps 744 represent one type of interconnect structure that can be formed over conductive layer 740. The interconnect structure can also use bond wires, conductive paste, stud bump, micro bump, or other electrical interconnect.

The combination of insulating layer 734, conductive layer 736, insulating layer 738, conductive layer 740, insulating layer 742, and bumps 744 constitutes build-up interconnect structure 746 formed over Fo-WLCSP 694, interposer 710, and encapsulant 730. Conductive layer 736, conductive layer 740, insulating layer 734, insulating layer 738, and insulating layer 742 may include an IPD, such as a capacitor, inductor, or resistor. Build-up interconnect structure 746 may include as few as one RDL, such as conductive layer 736. In alternative embodiments, build-up interconnect structure 746 includes two or more RDL layers, such as conductive layers 736 and 740 and additional conductive layers similar to conductive layers 736 and 740. In one embodiment, at least one of the insulating layers of build-up interconnect structure 746 includes a glass cloth, glass cross, filler, or fiber, such as E-glass cloth, T-glass cloth, Al2O3, or silica filler, for enhanced bending strength. Build-up interconnect structure 746 has a larger pitch and wider line spacing than build-up interconnect structure 690. In one embodiment, the minimum line spacing of build-up interconnect structure 690 is greater than or equal to 10 μm and the minimum line spacing of build-up interconnect structure 746 is greater than or equal to 30 μm. The larger pitch and wider line spacing of build-up interconnect structure 746 allows greater flexibility in the materials and manufacturing techniques used in the fabrication of build-up interconnect structure 746, which reduces manufacturing costs. In one embodiment, a portion of build-up interconnect structure 746 includes a ground plane.

A semiconductor device or component 750 is mounted to conductive layer 716 of interposer 710 with bumps 752 at the wafer level, i.e., before singulation. Semiconductor device 750 may include filter, memory and other IC chips, processors, microcontrollers, known-good packages, or any other packaged device containing semiconductor die or other electronic devices or circuitry. Bumps 752 are Al, Sn, Ni, Au, Ag, Pb, Bi, Cu, solder, and combinations thereof. Bumps 752 can be eutectic Sn/Pb, high-lead solder, or lead-free solder. Bumps 752 represent one type of interconnect structure that can be formed between semiconductor devices 750 and conductive layer 716. The interconnect structure can also use bond wires, conductive paste, stud bump, micro bump, or other electrical interconnect. Semiconductor device 750 is mounted using pick and place or other suitable operation. Semiconductor device 750 is electrically connected to build-up interconnect structure 746 through conductive vias 714. Interposer 710 provides electrical interconnect vertically through dual Fo-PoP 760 according to the design and function of semiconductor die 654 and semiconductor device 750. Interposer 710 can be made with low cost manufacturing technology, such as substrate manufacturing, and provide a cost effective process for forming vertical interconnection in dual Fo-PoP 760. Interposer 710 allows integration of additional packages or devices, e.g., device 750, within dual Fo-PoP 760. Incorporating additional devices in a stacked or "package-on-package" orientation increases the electrical performance and functionality of dual Fo-PoP 760 without increasing the package footprint.

Fo-WLCSP 694, interposer 710, semiconductor device 750, and build-up interconnect structure 746 represent a dual Fo-PoP in reconstituted wafer form. The reconstituted wafer is singulated through build-up interconnect structure 746, semiconductor device 750, and encapsulant 730 using a saw blade or laser cutting tool into individual dual Fo-PoP 760 containing semiconductor die 654, passive device 670, interposer 710, and semiconductor device 750. Alternatively, semiconductor device 750 is mounted after singulation.

FIG. 13 shows dual Fo-PoP 760 after singulation. Semiconductor die 654 is electrically connected through build-up interconnect structure 690 and build-up interconnect structure 746 to bumps 744 for connection to external devices. The conductive layers of build-up interconnect structure 690, for example, conductive layer 682 and conductive layer 686, are formed using narrow pitch and fine line spacing processes and technology, e.g., photosensitive dielectric resist with selectively plated Cu. Forming the conductive layers in build-up interconnect structure 690 with narrow pitch and fine line spacing allows the conductive traces within the conductive layers to be formed closer together. Forming the conductive traces closer together allows more conductive traces to be formed over a given area, for example, the area over semiconductor die 654. An increase in the number of conductive traces over semiconductor die 654 increases the number of possible interconnections that may be formed with semiconductor die 654. Increasing the number of potential interconnections within a conductive layer increases the I/O of build-up interconnect structure 690 without increasing the number of conductive layers. Accordingly, forming conductive layers 682 and 686 with narrow line spacing and an increased number of conductive traces increases the number of possible interconnect sites and I/O of build-up interconnect structure 690 without requiring additional conductive layers. Forming less conductive layers within build-up interconnect structure 690 allows for a thinner build-up interconnect structure 690. A thinner build-up interconnect structure 690 reduces the overall size of Fo-WLCSP 694 and the package profile dual Fo-PoP 760. Limiting the number of layers within build-up interconnect structure 690 also reduces the number of layers that could potentially warp. A decrease in warpage increases the manufacturing yield of dual Fo-PoP 760. Additionally, forming fewer conductive layers within build-up interconnect structure 690 reduces interconnect distance, i.e., the distance an electrical signal must travel, between semiconductor die 654 and bumps 744. Shorter interconnect distance increases the speed and electrical performance of dual Fo-PoP 760. The increased number of conductive traces, i.e., increased number of potential interconnections sites, within build-up interconnect structure 690 makes build-up interconnect structure 690 compatible with semiconductor devices that require an increased number of electrical interconnection sites. Accordingly, semiconductor die or devices with an increased I/O and interconnection requirement can be incorporated into dual Fo-PoP 760.

Dual Fo-PoP 760 also includes build-up interconnect structure 746. Build-up interconnect structure 746 provides additional conductive layers within dual Fo-PoP 760, which may be used as a ground plane and for connection to other internal or external devices. The conductive layers of build-up interconnect structure 746, for example conductive layer 736 and conductive layer 740, are formed with relaxed design rules, meaning the conductive traces within conductive layers 736 and 740 can be formed with a larger pitch and wider line spacing than the conductive traces of conductive layers 682 and 686 of build-up interconnect structure 690. Relaxing the design rules of build-up interconnect structure 746 allows for greater flexibility in the materials and manufacturing techniques used in the fabrication of build-up interconnect structure 746. Build-up interconnect structure 746 can be formed using standard equipment and materials, as opposed to materials specific to fabricating conductive layers with narrow pitch and fine line spacing. The use of standardized equipment and materials reduces the manufacturing time and cost of dual Fo-PoP 760. Additionally, the relaxed design rules for build-up interconnect structure 746 provide greater flexibility in the placement of bumps 744 and the spacing of the conductive traces within conductive layers 736 and 740. The placement of bumps 744 and the line spacing of the conductive layers with build-up interconnect structure 746, particularly the line spacing of the final conductive layer, i.e., conductive layer 740, can be selected to mirror industry standards. For example, bumps 744 are formed with the same spacing as the interconnection pads on a standard PCB. Spacing the conductive traces in conductive layer 740 and/or forming bumps 744 according to industry standards makes dual Fo-PoP 760 compatible with an increased number of semiconductor devices and components.

As technology advances, the electrical interconnection requirement of semiconductor die and devices is increasing. Dual Fo-PoP 760 is able to incorporate semiconductor die with a high interconnection requirement due to the narrow pitch and fine line spacing of build-up interconnect structure 690, while remaining compatible with standard devices and cost efficient to manufacture due to larger pitch and wider line spacing of build-up interconnect structure 746.

Figure 14:
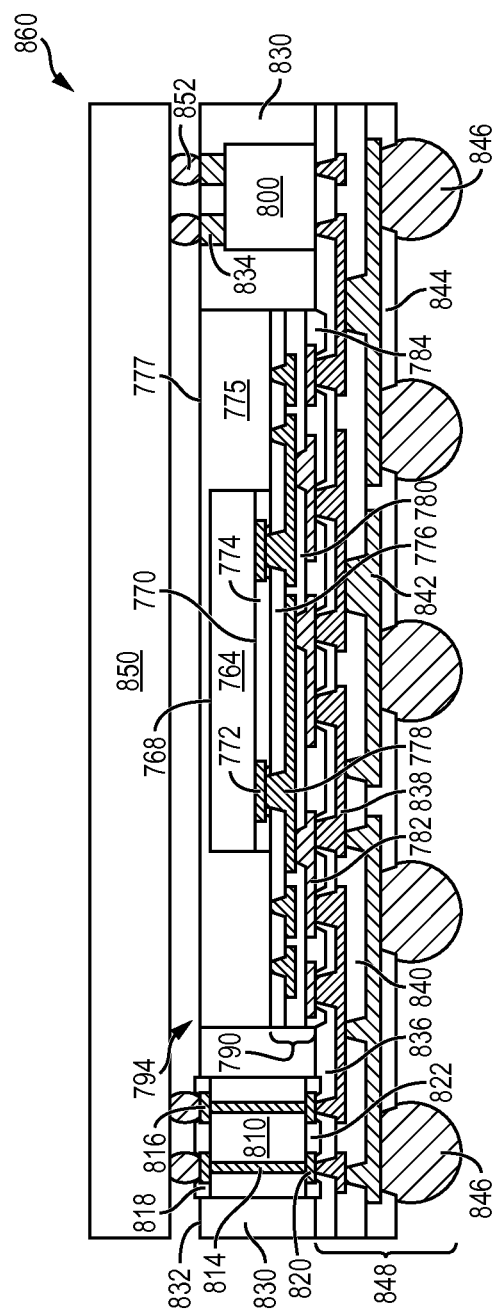
FIG. 14 illustrates a dual fan-out semiconductor device including an embedded 3D interconnect structure and an additional embedded semiconductor component.

FIG. 14 illustrates an embodiment of dual Fo-PoP 860. Dual Fo-PoP 860 includes Fo-WLCSP 794, similar to Fo-WLCSP 186 in FIG. 5k, and interposer 810, similar to interposer 570 in FIG. 11e. Dual Fo-PoP 860 also includes semiconductor device or component 850, similar to semiconductor device 750 in FIG. 13, and semiconductor device or component 800. Component 800 may include for example another semiconductor die, a ferrite, a passive device, a discrete semiconductor device, another semiconductor package.

A semiconductor die 764, similar to semiconductor die 124 in FIG. 3c, is disposed over a temporary substrate or carrier, similar to carrier 160 in FIG. 5a, with active surface 770 of semiconductor die 764 oriented toward the carrier. The carrier includes a sacrificial base material such as silicon, polymer, beryllium oxide, glass, or other suitable low-cost, rigid material for structural support. An interface layer or double-sided tape, similar to interface layer 162 in FIG. 5a, is formed over the carrier as a temporary adhesive bonding film, etch-stop layer, or thermal release layer.

An encapsulant 775 is deposited over semiconductor die 764 and the carrier using a paste printing, compressive molding, transfer molding, liquid encapsulant molding, vacuum lamination, spin coating, or other suitable applicator. Encapsulant 775 can be polymer composite material, such as epoxy resin with filler, epoxy acrylate with filler, or polymer with proper filler. Encapsulant 775 is non-conductive and environmentally protects the semiconductor device from external elements and contaminants. Encapsulant 775 also protects semiconductor die 764 from degradation due to exposure to light. The filler and CTE of encapsulant 775 are selected to aid with gap filling, warpage control, and reliability. In one embodiment, a portion of back surface 777 of encapsulant 775 is removed in a backgrinding operation. The backgrinding operation planarizes encapsulant 775 and exposes back surface 768 of semiconductor die 764.

The carrier and interface layer are then removed by chemical etching, mechanical peeling, CMP, mechanical grinding, thermal bake, UV light, laser scanning, or wet stripping to leaving conductive layer 772 and insulating layer 774 of semiconductor die 764 exposed from encapsulant 775.

A build-up interconnect structure 790, similar to build-up interconnect structure 180 in FIG. 5j, is formed over conductive layer 772 and insulating layer 774 of semiconductor die 764 and encapsulant 775. Build-up interconnect structure 790 includes an insulating layer 776, a conductive layer 778, an insulating layer 780, a conductive layer 782, and an optional insulating layer 784.

Insulating or passivation layer 776 is formed over insulating layer 774 and conductive layer 772 of semiconductor die 764 and encapsulant 775 using PVD, CVD, printing, lamination, spin coating, spray coating, sintering, or thermal oxidation. The insulating layer 776 contains one or more layers of SiO2, Si3N4, SiON, Ta2O5, Al2O3, low temperature (less than 250° C.) curing polymer dielectric materials, or other material having similar insulating and structural properties. A portion of insulating layer 776 is removed by an exposure and development process, LDA, etching, or other suitable process to expose conductive layer 772.

Electrically conductive layer or RDL 778 is formed over insulating layer 776 and conductive layer 772 using PVD, CVD, electrolytic plating, electroless plating process, or other suitable metal deposition process. Conductive layer 778 can be one or more layers of Al, Ti, TiW, Cu, Sn, Ni, Au, Ag, or other suitable electrically conductive material. One portion of conductive layer 778 is electrically connected to conductive layer 772 of semiconductor die 764. Other portions of conductive layer 778 can be electrically common or electrically isolated depending on the design and function of semiconductor die 764. Conductive layer 778 includes a plurality of conductive traces. The conductive traces of conductive layer 778 are formed with narrow pitch and fine line spacing. For example, the conductive traces within conductive layer 778 are formed with a minimum line spacing of 5 μm, i.e., the minimum distance between the edges of adjacent conductive traces within conductive layer 778 is 5 μm. In one embodiment, conductive layer 778 has a minimum line spacing or distance between adjacent conductive traces of greater than or equal to 10 μm. The narrow pitch and fine line spacing of the conductive traces within conductive layer 778 creates space for more conductive traces over semiconductor die 764 and encapsulant 775.

Insulating or passivation layer 780 is formed over insulating layer 776 and conductive layer 778 using PVD, CVD, printing, lamination, spin coating, spray coating, sintering, or thermal oxidation. The insulating layer 780 contains one or more layers of SiO2, Si3N4, SiON, Ta2O5, Al2O3, low temperature (less than 250° C.) curing polymer dielectric materials, or other material having similar insulating and structural properties. A portion of insulating layer 780 is removed by an exposure and development process, LDA, etching, or other suitable process to expose conductive layer 778.

Electrically conductive layer or RDL 782 is formed over conductive layer 778 and insulating layer 780 using PVD, CVD, electrolytic plating, electroless plating process, or other suitable metal deposition process. Conductive layer 782 can be one or more layers of Al, Ti, TiW, Cu, Sn, Ni, Au, Ag, or other suitable electrically conductive material. One portion of conductive layer 782 is electrically connected to conductive layer 778. Other portions of conductive layer 782 can be electrically common or electrically isolated depending on the design and function of semiconductor die 764. Conductive layer 782 includes a plurality of conductive traces. The conductive traces of conductive layer 782 are formed with narrow pitch and fine line spacing. For example, the conductive traces within conductive layer 782 are formed with a minimum line spacing of 5 μm. In one embodiment, conductive layer 782 has a minimum line spacing of greater than or equal to 10 μm. The narrow pitch and fine line spacing of the conductive traces within conductive layer 782 creates space for more conductive traces over semiconductor die 764 and encapsulant 775.

Optional insulating or passivation layer 784 is formed over insulating layer 780 and conductive layer 782 using PVD, CVD, printing, lamination, spin coating, spray coating, sintering, or thermal oxidation. The insulating layer 784 contains one or more layers of SiO2, Si3N4, SiON, Ta2O5, Al2O3, low temperature (less than 250° C.) curing polymer dielectric materials, or other material having similar insulating and structural properties. A portion of insulating layer 784 is removed by an exposure and development process, LDA, etching, or other suitable process to expose conductive layer 782.

The combination of insulating layer 776, conductive layer 778, insulating layer 780, conductive layer 782, and insulating layer 784 constitutes build-up interconnect structure 790 formed over semiconductor die 764 and encapsulant 775. Conductive layers 778 and 782 and insulating layers 776, 780, and 784 may include an IPD, such as a capacitor, inductor, or resistor. Build-up interconnect structure 790 is formed using narrow pitch and fine line spacing technology, e.g., photosensitive dielectric resist and selectively plated Cu, and can have a line spacing as narrow as 5 µm. In one embodiment, the minimum line spacing of build-up interconnect structure 790 is greater than or equal to 10 µm. The narrow pitch and fine line spacing of conductive layers 778 and 782 creates space for a higher number of conductive traces within build-up interconnect structure 790. The increased density of conductive traces increases the number of possible interconnections sites and I/O terminal count of build-up interconnect structure 790. Thus, build-up interconnect structure 790 can be formed over semiconductor die that require an increased number of electrical interconnection sites. The narrow pitch and fine line spacing of the conductive layers within build-up interconnect structure 790 increases the conductive trace density and I/O of build-up interconnect structure 790, without requiring the formation of additional RDLs. In one embodiment, build-up interconnect structure 790 includes three or less RDLs. The limited number of RDLs within build-up interconnect structure 790 allows for a smaller and thinner overall semiconductor package, reduces warpage, and increases the speed of the device.

Semiconductor die 764 and build-up interconnect structure 790 represent a Fo-WLCSP in reconstituted wafer form. The reconstituted wafer is singulated through build-up interconnect structure 790 and encapsulant 775 using a saw blade or laser cutting tool into individual Fo-WLCSP 794 containing semiconductor die 764. Fo-WLCSP 794 is similar to Fo-WLCSP 186 in FIG. 5k.

Fo-WLCSP 794, a 3D interconnect structures or interposer 810, and a semiconductor device or component 800 are aligned with and mounted to a temporary substrate or carrier, similar to carrier 566 in FIG. 11e, with conductive layer 782 and insulating layer 784 of Fo-WLCSP 794 and insulating layer 822 and conductive layer 820 of interposer 810 oriented toward the carrier. The carrier contains a sacrificial base material such as silicon, polymer, beryllium oxide, glass, or other suitable low-cost, rigid material for structural support. An interface layer or double-sided tape, similar to interface layer 568 in FIG. 11e, is formed over the carrier as a temporary adhesive bonding film, etch-stop layer, or thermal release layer.

Interposer 810 is prefabricated, i.e., interposer 810 is formed prior to mounting interposer 810 to the carrier. Interposer 810 includes a core substrate 812. Substrate 812 includes one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Alternatively, core substrate 812 includes one or more insulating or dielectric layers.

A plurality of through vias is formed through core substrate 812 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 814. In one embodiment, Cu is deposited over the sidewall of the through vias by electroless plating and electroplating. The through vias are filled with conductive paste or plugging resin with fillers.

An electrically conductive layer or RDL 816 is formed over a surface of core substrate 812 and conductive vias 814 using a patterning and metal deposition process such as printing, PVD, CVD, sputtering, electrolytic plating, and electroless plating. Conductive layer 816 includes one or more layers of Al, Cu, Sn, Ni, Au, Ag, or other suitable electrically conductive material. Conductive layer 816 is electrically connected to conductive vias 814. Conductive layer 816 operates as contact pads electrically connected to conductive vias 814.

An insulating or passivation layer 818 is formed over the surface of core substrate 812 and conductive layer 816 using PVD, CVD, printing, spin coating, spray coating, slit coating, rolling coating, lamination, sintering, or thermal oxidation. Insulating layer 818 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 818 is removed by LDA, etching, or other suitable process to expose portions of conductive layer 816. In one embodiment, insulating layer 818 is a masking layer.

An electrically conductive layer or RDL 820 is formed over a surface of core substrate 812 opposite the conductive layer 816 using a patterning and metal deposition process such as printing, PVD, CVD, sputtering, electrolytic plating, and electroless plating. Conductive layer 820 includes one or more layers of Al, Cu, Sn, Ni, Au, Ag, or other suitable electrically conductive material. Conductive layer 820 is electrically connected to conductive vias 814 and conductive layer 816. Alternatively, conductive vias 814 are formed through core substrate 812 after forming conductive layer 816 and/or conductive layer 820.

An insulating or passivation layer 822 is formed over conductive layer 820 using PVD, CVD, printing, spin coating, spray coating, slit coating, rolling coating, lamination, sintering, or thermal oxidation. The insulating layer 822 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 822 is removed by an exposure and development process, LDA, etching, or other suitable process to expose portions of conductive layer 820. In one embodiment, insulating layer 822 is a masking layer. Substrate 812 is then singulated into individual 3D interconnect units or interposers 810. Interposer 810 provides electrical interconnect vertically through the dual Fo-PoP 860 through conductive vias 814 according to the design and function of semiconductor die 764 and semiconductor device 850. Interposer 810 is known good having been inspected and tested by open/short probe or auto-scope inspection at an interim stage, i.e., prior to mounting Fo-WLCSP 794.

An encapsulant or molding compound 830 is deposited over Fo-WLCSP 794 and component 800 and around interposer 810 using a paste printing, compressive molding, transfer molding, liquid encapsulant molding, vacuum lamination, spin coating, or other suitable applicator. Encapsulant 830 can be polymer composite material, such as epoxy resin with filler, epoxy acrylate with filler, or polymer with proper filler. Encapsulant 830 is non-conductive and environmentally protects the semiconductor device from external elements and contaminants. Encapsulant 830 also protects semiconductor die 764 from degradation due to exposure to light. The filler and CTE of encapsulant 830 are selected to aid with gap filling, warpage control, and reliability. Prior to forming encapsulant 830, a backgrinding operation and/or an RF etching, plasma clean, solvent strip, or wet clean process is performed on Fo-WLCSP 794 to roughen the surfaces of encapsulant 775 and build-up interconnect structure 790 and improve adhesion of encapsulant 830. Encapsulant 830 and/or encapsulant 775 include a controlled stress-releasing agent to improve adhesion of encapsulant 830. In one embodiment, a portion of back surface 832 of encapsulant 830 and back surface 777 of encapsulant 775 is removed in a backgrinding operation to planarize encapsulants 830 and 775 and expose conductive layer 816 of interposer 810 and back surface 768 of semiconductor die 764.

A plurality of through vias is formed through encapsulant 830 over component 800 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 834. In one embodiment, Cu is deposited over the sidewall of the through vias by electroless plating and electroplating. The through vias are filled with conductive paste or plugging resin with fillers. Conductive vias are electrically connected to component 800 and semiconductor device 850. In an alternate embodiment, conductive vias 814 are formed directly through encapsulant 830 in the same manufacturing step as conductive vias 834.

The carrier and interface layer are removed by chemical etching, mechanical peeling, CMP, mechanical grinding, thermal bake, UV light, laser scanning, or wet stripping leaving conductive layer 782 and insulating layer 784 of Fo-WLCSP 794, conductive layer 820 and insulating layer 822 of interposer 810, and a portion of component 800 exposed from encapsulant 830.

A build-up interconnect structure 848, similar to build-up interconnect structure 610 in FIG. 11h, is formed over conductive layer 782 and insulating layer 784 of Fo-WLCSP 794, conductive layer 820 and insulating layer 822 of interposer 810, component 800, and encapsulant 830. Build-up interconnect structure 848 includes an insulating layer 836, a conductive layer 838, an insulating layer 840, a conductive layer 842, an insulating layer 844, and bumps 846.

Insulating or passivation layer 836 is formed over conductive layer 782, insulating layer 784, conductive layer 820, insulating layer 822, component 800, and encapsulant 830 using PVD, CVD, printing, slit coating, spin coating, spray coating, injection coating, lamination, sintering, or thermal oxidation. Insulating layer 836 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, the material selected for insulating layer 836 is the same as the material selected for insulating layer 784 of Fo-WLCSP 794. A portion of insulating layer 836 is removed by an exposure and development process, LDA, etching, or other suitable process to expose conductive layer 782 of Fo-WLCSP 794, conductive layer 820 of interposer 810, and a portion of component 800.

Electrically conductive layer or RDL 838 is formed over insulating layer 836. Conductive layer 838 can be one or more layers of Al, Ti, TiW, Cu, Sn, Ni, Au, Ag, or other suitable electrically conductive material. One portion of conductive layer 838 is electrically connected to conductive layer 782 of Fo-WLCSP 794. One portion of conductive layer 838 is electrically connected to conductive layer 820 of interposer 810. One portion of conductive layer 838 is electrically connected to component 800. Other portions of conductive layer 838 can be electrically common or electrically isolated depending on the design and function of semiconductor die 764. Conductive layer 838 includes a plurality of conductive traces. Conductive layer 838 is formed with a larger pitch and wider line spacing than build-up interconnect structure 790, i.e., the conductive traces within conductive layer 838 have a larger pitch than the conductive traces within build-up interconnect structure 790 and the distance between the edges of adjacent conductive traces within conductive layer 838 is greater than the distance between the edges of adjacent conductive traces within build-up interconnect structure 790. For example, conductive layer 838 has a minimum line spacing or distance between adjacent conductive traces of 15 μm. In one embodiment, the minimum line spacing of conductive layer 838 is greater than or equal to 30 μm and the minimum line spacing of build-up interconnect structure 790 is greater than or equal to 10 μm.

Insulating or passivation layer 840 is formed over insulating layer 836 and conductive layer 838 using PVD, CVD, printing, slit coating, spin coating, spray coating, injection coating, lamination, sintering, or thermal oxidation. Insulating layer 840 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. A portion of insulating layer 840 is removed by an exposure and development process, LDA, etching, or other suitable process to expose conductive layer 838.

Electrically conductive layer or RDL 842 is formed over conductive layer 838 and insulating layer 840 using PVD, CVD, electrolytic plating, electroless plating process, or other suitable metal deposition process. Conductive layer 842 can be one or more layers of Al, Ti, TiW, Cu, Sn, Ni, Au, Ag, or other suitable electrically conductive material. One portion of conductive layer 842 is electrically connected to conductive layer 838. Other portions of conductive layer 842 can be electrically common or electrically isolated depending on the design and function of semiconductor die 764. Conductive layer 842 includes a plurality of conductive traces. Conductive layer 842 is formed with a larger pitch and wider line spacing than build-up interconnect structure 790. For example, conductive layer 842 has a minimum line spacing of 15 μm. In one embodiment, the minimum line spacing of conductive layer 842 is greater than or equal to 30 μm and the minimum line spacing of build-up interconnect structure 790 is greater than or equal to 10 μm.

Insulating or passivation layer 844 is formed over insulating layer 840 and conductive layer 842 using PVD, CVD, printing, slit coating, spin coating, spray coating, injection coating, lamination, sintering, or thermal oxidation. Insulating layer 844 includes one or more layers of SiO2, Si3N4, SiON, Ta2O5, Al2O3, polymer dielectric resist with or without fillers or fibers, low temperature (less than 250° C.) curing polymer dielectric materials, or other material having similar structural and insulating properties. In one embodiment, insulating layer 844 is a solder resist. Alternatively, insulating layer 844 is a double layer in which a first layer is a composite material including fiber, e.g., woven glass fiber, and the second layer of the double layer is a solder resist. A portion of insulating layer 844 is removed by an exposure and development process, LDA, etching, or other suitable process to expose conductive layer 842.

An electrically conductive bump material is deposited over conductive layer 842 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 842 using a suitable attachment or bonding process. In one embodiment, the bump material is reflowed by heating the material above the material's melting point to form balls or bumps 846. In some applications, bumps 846 are reflowed a second time to improve electrical contact to conductive layer 842. In one embodiment, bumps 846 are formed over a UBM layer. Bumps 846 can also be compression bonded or thermocompression bonded to conductive layer 842. Bumps 846 represent one type of interconnect structure that can be formed over conductive layer 842. The interconnect structure can also use bond wires, conductive paste, stud bump, micro bump, or other electrical interconnect.

The combination of insulating layer 836, conductive layer 838, insulating layer 840, conductive layer 842, insulating layer 844, and bumps 846 constitutes build-up interconnect structure 848 formed over Fo-WLCSP 794, interposer 810, component 800, and encapsulant 830. Conductive layer 838, conductive layer 842, insulating layer 836, insulating layer 840, and insulating layer 844 may include an IPD, such as a capacitor, inductor, or resistor. Build-up interconnect structure 848 may include as few as one RDL, such as conductive layer 838. In alternative embodiments, build-up interconnect structure 848 includes two or more RDL layers, such as conductive layers 838 and 842 and additional conductive layers similar to conductive layers 838 and 842. In one embodiment, at least one of the insulating layers of build-up interconnect structure 848 includes a glass cloth, glass cross, filler, or fiber, such as E-glass cloth, T-glass cloth, Al2O3, or silica filler, for enhanced bending strength. Build-up interconnect structure 848 has a larger pitch and wider line spacing than build-up interconnect structure 790. In one embodiment, the minimum line spacing of build-up interconnect structure 790 is greater than or equal to 10 μm and the minimum line spacing of build-up interconnect structure 848 is greater than or equal to 30 μm. The larger pitch and wider line spacing of build-up interconnect structure 848 allows greater flexibility in the materials and manufacturing techniques used in the fabrication of build-up interconnect structure 848, which reduces manufacturing costs. In one embodiment, a portion of build-up interconnect structure 848 includes a ground plane.

Semiconductor device or component 850 is mounted to conductive layer 816 of interposer 810 and conductive vias 834 at the wafer level, i.e., before singulation. Semiconductor device 850 may include filter, memory and other IC chips, processors, microcontrollers, known-good packages, or any other packaged device containing semiconductor die or other electronic devices or circuitry. Bumps 852 electrically connect semiconductor device 850 to conductive vias 814 and 834. Bumps 852 are Al, Sn, Ni, Au, Ag, Pb, Bi, Cu, solder, and combinations thereof. Bumps 852 can be eutectic Sn/Pb, high-lead solder, or lead-free solder. Bumps 852 represent one type of interconnect structure that can be formed between semiconductor devices 850 and conductive vias 814 and 834. The interconnect structure can also use bond wires, conductive paste, stud bump, micro bump, or other electrical interconnect. Semiconductor device 850 is mounted using pick and place or other suitable operation. Semiconductor device 850 is electrically connected to build-up interconnect structure 848 through conductive vias 814 and electrically connected to component 800 through conductive vias 834. Interposer 810 provides electrical interconnect vertically through dual Fo-PoP 860 according to the design and function of semiconductor die 764 and semiconductor device 850. Interposer 810 can be made with low cost manufacturing technology, such as substrate manufacturing, and provide a cost effective process for forming vertical interconnection in dual Fo-PoP 860. Interposer 810 allows integration of additional packages or devices, e.g., device 850, within dual Fo-PoP 860. Incorporating additional devices in a stacked or "package-on-package" orientation increases the electrical performance and functionality of dual Fo-PoP 860 without increasing the package footprint.

Fo-WLCSP 794, component 800, interposer 810, semiconductor device 850, and build-up interconnect structure 848 represent a dual Fo-PoP in reconstituted wafer form. The reconstituted wafer is singulated through build-up interconnect structure 848, semiconductor device 850, and encapsulant 830 using a saw blade or laser cutting tool into individual dual Fo-PoP 860 containing semiconductor die 764, component 800, interposer 810, and semiconductor device 850. Alternatively, semiconductor device 850 is mounted after singulation.

FIG. 14 shows dual Fo-PoP 860 after singulation. Semiconductor die 764 is electrically connected through build-up interconnect structure 790 and build-up interconnect structure 848 to bumps 846 for connection to external devices. The conductive layers of build-up interconnect structure 790, for example, conductive layer 778 and conductive layer 782, are formed using narrow pitch and fine line spacing processes and technology, e.g., photosensitive dielectric resist with selectively plated Cu. Forming the conductive layers in build-up interconnect structure 790 with narrow pitch and fine line spacing allows the conductive traces within the conductive layers to be formed closer together. Forming the conductive traces closer together allows more conductive traces to be formed over a given area, for example, the area over semiconductor die 764. An increase in the number of conductive traces over semiconductor die 764 increases the number of possible interconnections that may be formed with semiconductor die 764. Increasing the number of potential interconnections within a conductive layer increases the I/O of build-up interconnect structure 790 without increasing the number of conductive layers. Accordingly, forming conductive layers 778 and 782 with narrow line spacing and an increased number of conductive traces increases the number of possible interconnect sites or I/O of build-up interconnect structure 790 without requiring additional conductive layers. Forming less conductive layers within build-up interconnect structure 790 allows for a thinner build-up interconnect structure 790. A thinner build-up interconnect structure 790 reduces the overall size of Fo-WLCSP 794 and the package profile dual Fo-PoP 860. Limiting the number of layers within build-up interconnect structure 790 also reduces the number of layers that could potentially warp. A decrease in warpage increases the manufacturing yield of dual Fo-PoP 860. Additionally, forming fewer conductive layers within build-up interconnect structure 790 reduces interconnect distance, i.e., the distance an electrical signal must travel, between semiconductor die 764 and bumps 846. Shorter interconnect distance increases the speed and electrical performance of dual Fo-PoP 860. The increased number of conductive traces, i.e., increased number of potential interconnections sites, within build-up interconnect structure 790 makes build-up interconnect structure 790 compatible with semiconductor devices that require an increased number of electrical interconnection sites. Accordingly, semiconductor die or devices with an increased I/O and interconnection requirement can be incorporated into dual Fo-PoP 860.

Dual Fo-PoP 860 also includes build-up interconnect structure 848. Build-up interconnect structure 848 provides additional conductive layers within dual Fo-PoP 860, which may be used as a ground plane and for connection to other internal or external devices. Embedding component 800 within dual Fo-PoP 860 increases the electrical performance and functionality of dual Fo-PoP 860 without increasing the package profile. The conductive layers of build-up interconnect structure 848, for example conductive layer 838 and conductive layer 842, are formed with relaxed design rules, meaning the conductive traces within conductive layers 838 and 842 can be formed with a larger pitch and wider line spacing than the conductive traces of conductive layers 778 and 802 of build-up interconnect structure 790. Relaxing the design rules of build-up interconnect structure 848 allows for greater flexibility in the materials and manufacturing techniques used in the fabrication of build-up interconnect structure 848. Build-up interconnect structure 848 can be formed using standard equipment and materials, as opposed to materials specific to fabricating conductive layers with narrow pitch and fine line spacing. The use of standardized equipment and materials reduces the manufacturing time and cost of dual Fo-PoP 860. Additionally, the relaxed design rules for build-up interconnect structure 848 provide greater flexibility in the placement of bumps 846 and the spacing of the conductive traces within conductive layers 838 and 842. The placement of bumps 846 and the line spacing of the conductive layers with build-up interconnect structure 848, particularly the line spacing of the final conductive layer, i.e., conductive layer 842, can be selected to mirror industry standards. For example, bumps 846 are formed with the same spacing as the interconnection pads on a standard PCB. Spacing the conductive traces in conductive layer 842 and/or forming bumps 846 according to industry standards makes dual Fo-PoP 860 compatible with an increased number of semiconductor devices and components.

As technology advances, the electrical interconnection requirement of semiconductor die and devices is increasing. Dual Fo-PoP 860 is able to incorporate semiconductor die with a high interconnection requirement due to the narrow pitch and fine line spacing of build-up interconnect structure 790, while remaining compatible with standard devices and cost efficient to manufacture due to the larger pitch and wider line spacing of build-up interconnect structure 848.

Figure 15F:
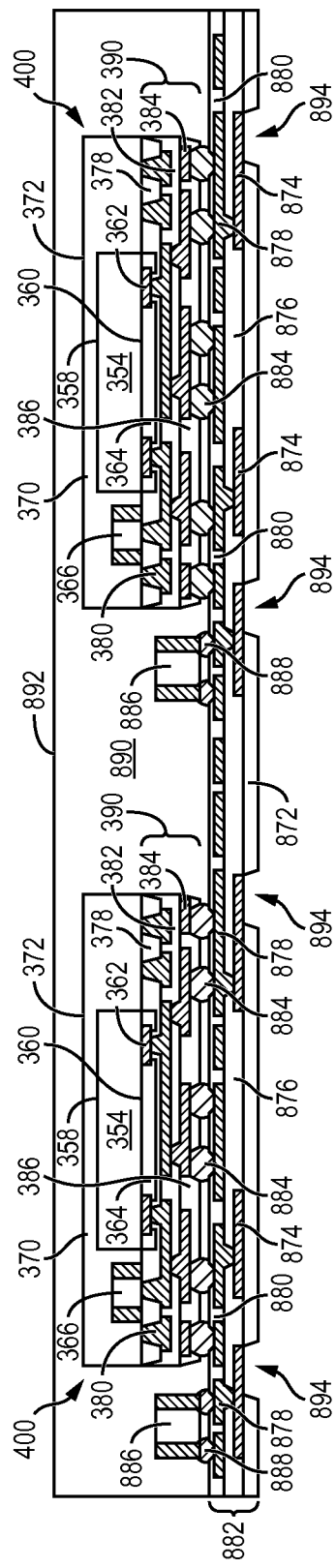

FIGS. 15a-15g illustrate, in relation to FIGS. 1 and 2a-2c, another process of forming a dual fan-out semiconductor device. FIG. 15a shows a cross-sectional view of a portion of a carrier or temporary substrate 870 containing sacrificial base material such as silicon, polymer, beryllium oxide, glass, or other suitable low-cost, rigid material for structural support.

An insulating or passivation layer 872 is applied over carrier 870. Insulating layer 872 can be formed using PVD, CVD, printing, spin coating, spray coating, sintering, or thermal oxidation. Insulating layer 872 includes one or more layers of Si3N4, SiO2, SiON, SiO2/Si3N4, Ta2O5, Al2O3, or other material having similar insulating and structural properties. In one embodiment, insulating layer 872 includes a laminated dielectric film. In alternate embodiments, insulating layer 872 can be replaced by a conductive layer, such as Cu. Insulating layer 872 is chosen to have good selectivity as a silicon etchant and can act as an etch stop during later removal of the carrier.

In FIG. 15b, an electrically conductive layer or RDL 874 is formed over insulating layer 872 and carrier 870 using a patterning and metal deposition process such as sputtering, electrolytic plating, and electroless plating. Conductive layer 874 includes a conductive material, such as Al, Cu, Sn, Ni, Au, Ag, or other electrically conductive material. Portions of conductive layer 874 can be electrically common or electrically isolated depending on a design and function of the later mounted semiconductor die. Conductive layer 874 includes a plurality of conductive traces. Conductive layer 874 is formed with a larger pitch than, for example, build-up interconnect structure 390 in FIG. 9d, and has a line spacing similar to the line spacing of, for example, build-up interconnect structure 390 in FIG. 9d, i.e., the conductive traces within conductive layer 874 have a larger pitch than the conductive traces within build-up interconnect structure 390 and the distance between the edges of adjacent conductive traces within conductive layer 874 is similar to the distance between the edges of adjacent conductive traces within build-up interconnect structure 390. In one embodiment, conductive layer 874 is formed with a minimum line spacing or distance between adjacent conductive traces of 5 µm.

An insulating or passivation layer 876 is applied over insulating layer 872 and conductive layer 874 for structural support and electrical isolation. Insulating layer 876 can be formed using PVD, CVD, printing, spin coating, spray coating, lamination, sintering, or thermal oxidation. Insulating layer 876 can have one or more layers of Si3N4, SiO2, SiON, PI, BCB, PBO, WPR, epoxy, or other material having similar insulating and structural properties. A portion of insulating layer 876 is removed by an exposure and development process, LDA, etching, or other suitable process to expose conductive layer 874.

In FIG. 15c, an electrically conductive layer 878 is deposited over insulating layer 876 using a PVD, CVD, electrolytic plating, or electroless plating process. Conductive layer 878 can be one or more layers of Al, Cu, Sn, Ni, Au, Ag, Ti, W, TiW/Cu, Ti/Cu, or other suitable electrically conductive material. One portion of conductive layer 878 is electrically connected to conductive layer 874. Other portions of conductive layer 878 can be electrically common or electrically isolated depending on the design and function of the later mounted semiconductor die. Conductive layer 878 includes a plurality of conductive traces. Conductive layer 878 is formed with a larger pitch than, for example, build-up interconnect structure 390 in FIG. 9d and has a line spacing similar to the line spacing of, for example, build-up interconnect structure 390 in FIG. 9d. In one embodiment, conductive layer 878 has a minimum line spacing of 5 µm.

An optional insulating or passivation layer 880 is applied over insulating layer 876 and conductive layer 878 for structural support and electrical isolation. Insulating layer 880 is formed using PVD, CVD, printing, spin coating, spray coating, lamination, sintering, or thermal oxidation. Insulating layer 880 includes one or more layers of Si3N4, SiO2, SiON, PI, BCB, PBO, WPR, epoxy, or other material having similar insulating and structural properties. A portion of insulating layer 880 is removed by an exposure and development process, LDA, etching, or other suitable process, to expose conductive layer 878.

Insulating layer 872, conductive layer 874, insulating layer 876, conductive layer 878, and insulating layer 880 constitute a WL RDL or build-up interconnect structure 882. Conductive layer 874, conductive layer 878, insulating layer 872, insulating layer 876, and insulating layer 880 may include an IPD, such as a capacitor, inductor, or resistor. In one embodiment, a portion of build-up interconnect structure 882 includes a ground plane. Conductive layer 874 and conductive layer 878 constitute two RDLs formed within build-up interconnect structure 882. Build-up interconnect structure 882 may include as few as one RDL, such as conductive layer 874. In alternative embodiments, build-up interconnect structure 882 includes two or more RDL layers, such as conductive layers 874 and 878 and additional conductive layers similar to conductive layers 874 and 878. In one embodiment, at least one of the insulating layers of build-up interconnect structure 882 includes a glass cloth, glass cross, filler, or fiber, such as E-glass cloth, T-glass cloth, Al2O3, or silica filler, for enhanced bending strength. The conductive traces within build-up interconnect structure 882 are formed with a larger pitch than, for example, build-up interconnect structure 390 and have a line spacing similar to the line spacing of, for example, build-up interconnect structure 390. In one embodiment, build-up interconnect structure 882 includes a minimum line spacing of 5 μm.

In FIG. 15d, Fo-WLCSP 400, including semiconductor die 354, passive device 366, and build-up interconnect structure 390, from FIG. 9e and a plurality of semiconductor components or passive devices 886 are disposed over build-up interconnect structure 882 and carrier 870.

An electrically conductive bump material is deposited over passive device 886 and conductive layer 384 of build-up interconnect structure 390 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to passive device 886 and conductive layer 384 using a suitable attachment or bonding process. In one embodiment, the bump material is reflowed by heating the material above the material's melting point to form balls or bumps 888 and 884. In some applications, bumps 888 and 884 are reflowed a second time to improve electrical contact to passive device 886 and conductive layer 384, respectively. In one embodiment, bumps 888 and 884 are formed over a UBM layer. Bumps 888 and 884 can also be compression bonded or thermocompression bonded to passive device 886 and conductive layer 384. Bumps 888 and 884 represent one type of interconnect structure that can be formed over passive device 886 and conductive layer 384. The interconnect structure can also use conductive paste, stud bump, micro bump, or other electrical interconnect. Alternatively, bumps 888 and 884 may be formed on conductive layer 878 of build-up interconnect structure 882.

Fo-WLCSP 400 and passive devices 886 are mounted to build-up interconnect structure 882 using a pick-and-place operation. Bumps 888 and 884 are reflowed to metallurgically and electrically connect bumps 888 and 884 to conductive layer 878. Fo-WLCSP 400 is known good having been tested prior to mounting Fo-WLCSP 400 to build-up interconnect structure 882. In some applications, bumps 888 and 884 are reflowed a second time to improve electrical contact to conductive layer 878. Bumps 888 and 884 can also be compression bonded or thermocompression bonded to conductive layer 878. In one embodiment, an underfill material is disposed between Fo-WLCSP 400 and build-up interconnect structure 882.

In FIG. 15e, an encapsulant or molding compound 890 is deposited over Fo-WLCSP 400, passive devices 886, and build-up interconnect structure 882 using a paste printing, compressive molding, transfer molding, liquid encapsulant molding, vacuum lamination, spin coating, or other suitable applicator. Encapsulant 890 can be polymer composite material, such as epoxy resin with filler, epoxy acrylate with filler, or polymer with proper filler. Encapsulant 890 is non-conductive and environmentally protects the semiconductor device from external elements and contaminants. Encapsulant 890 also protects semiconductor die 354 from degradation due to exposure to light. The filler and CTE of encapsulant 890 are selected to aid with gap filling, warpage control, and reliability. Prior to forming encapsulant 890, a backgrinding operation and/or an RF etching, plasma clean, solvent strip, or wet clean process is performed on Fo-WLCSP 400 to roughen the surfaces of encapsulant 370 and build-up interconnect structure 390 and improve adhesion of encapsulant 890. Encapsulant 890 and/or encapsulant 370 include a controlled stress-releasing agent to improve adhesion of encapsulant 890. In one embodiment, a portion of back surface 892 of encapsulant 890 and back surface 372 of encapsulant 370 are removed in a backgrinding operation. The backgrinding operation planarizes the surface of encapsulant 890 and encapsulant 370, and may expose back surface 358 of semiconductor die 354. The backgrinding operation reduces an overall thickness of the semiconductor package.

In FIG. 15f, carrier 870 is removed by mechanical backgrinding, chemical wet etching, plasma dry etching, or CMP. Insulating layer 872 is patterned and etched to create openings 894 exposing conductive layer 874. Alternatively, insulating layer 872 can be patterned and etched before conductive layer 874 is formed over carrier 870.

Figure 15G:
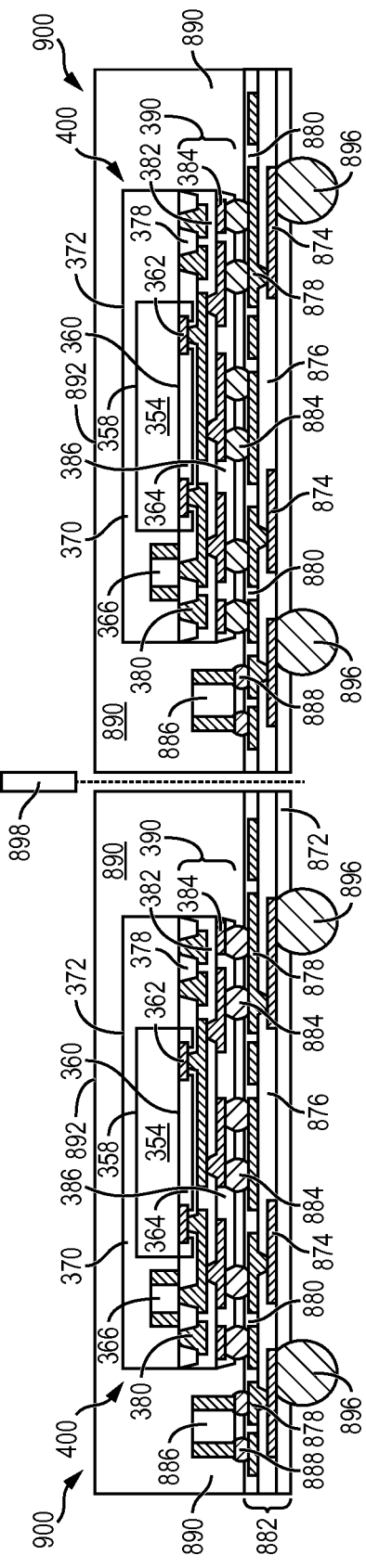

In FIG. 15g, an electrically conductive bump material is deposited over conductive layer 874 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 874 using a suitable attachment or bonding process. In one embodiment, the bump material is reflowed by heating the material above the material's melting point to form balls or bumps 896. In some applications, bumps 896 are reflowed a second time to improve electrical contact to conductive layer 874. In one embodiment, bumps 896 are formed over a UBM layer. Bumps 896 can also be compression bonded or thermocompression bonded to conductive layer 874. Bumps 896 represent one type of interconnect structure that can be formed over conductive layer 874. The interconnect structure can also use conductive paste, stud bump, micro bump, or other electrical interconnect.

Fo-WLCSP 400, passive devices 886, and build-up interconnect structure 882 represent a dual Fo-WLCSP in reconstituted wafer form. In FIG. 15g, the reconstituted wafer is singulated through build-up interconnect structure 882 and encapsulant 890 using a saw blade or laser cutting tool 898 into individual dual Fo-WLCSP 900.

Figure 16:
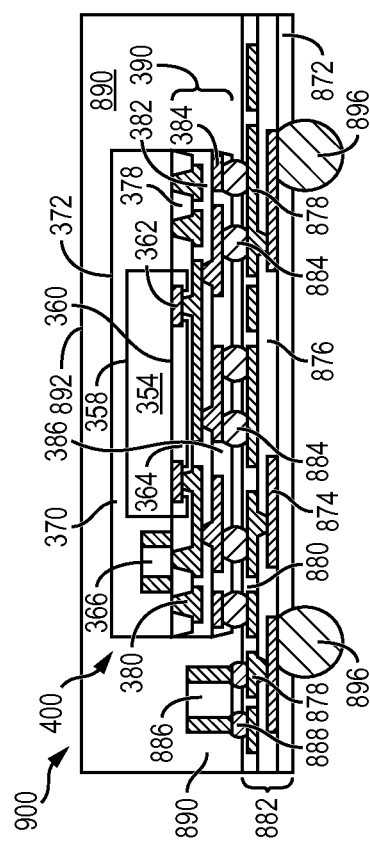
FIG. 16 illustrates the dual fan-out semiconductor device according to FIGS. 15a-15g.

FIG. 16 shows dual Fo-WLCSP 900 after singulation. Semiconductor die 354 is electrically connected through build-up interconnect structure 390 and build-up interconnect structure 882 to bumps 896 for connection to external devices. The conductive layers of build-up interconnect structure 390, for example, conductive layer 380 and conductive layer 384, are formed using narrow pitch and fine line spacing processes and technology, e.g., photosensitive dielectric resist with selectively plated Cu. Forming the conductive layers in build-up interconnect structure 390 with narrow pitch and fine line spacing allows the conductive traces within the conductive layers to be formed closer together. Forming the conductive traces closer together allows more conductive traces to be formed over a given area, for example, the area over semiconductor die 354. An increase in the number of conductive traces over semiconductor die 354 increases the number of possible interconnections that may be formed with semiconductor die 354.

Increasing the number of potential interconnections within a conductive layer increases the I/O of build-up interconnect structure 390 without increasing the number of conductive layers. Accordingly, forming conductive layers 380 and 384 with narrow line spacing and an increased number of conductive traces increases the number of possible interconnect sites or I/O of build-up interconnect structure 390 without requiring additional conductive layers. Forming less conductive layers within build-up interconnect structure 390 allows for a thinner build-up interconnect structure 390. A thinner build-up interconnect structure 390 reduces the overall size of Fo-WLCSP 400 and the package profile dual Fo-WLCSP 900. Limiting the number of layers within build-up interconnect structure 390 also reduces the number of layers that could potentially warp. A decrease in warpage increases the manufacturing yield of dual Fo-WLCSP 900. Additionally, forming fewer conductive layers within build-up interconnect structure 390 reduces interconnect distance, i.e., the distance an electrical signal must travel, between semiconductor die 354 and bumps 896. Shorter interconnect distance increases the speed and electrical performance of dual Fo-WLCSP 900. The increased number of conductive traces, i.e., increased number of potential interconnections sites, within build-up interconnect structure 390 makes build-up interconnect structure 390 compatible with semiconductor devices that require an increased number of electrical interconnection sites. Accordingly, semiconductor die or devices with an increased I/O and interconnection requirement can be incorporated into dual Fo-WLCSP 900.

Dual Fo-WLCSP 900 also includes build-up interconnect structure 882. Build-up interconnect structure 882 provides additional conductive layers within dual Fo-WLCSP 900, which may be used as a ground plane and for connection to other internal, e.g., passive device 886, or external devices. Embedding passive devices 366 and 886 within dual Fo-WLCSP 900 increases the electrical performance and functionality of dual Fo-WLCSP 900 without increasing the package profile. Build-up interconnect structure 882 has a larger pitch than build-up interconnect structure 390 and a line spacing similar to build-up interconnect structure 390. In one embodiment, both build-up interconnect structure 882 and build-up interconnect structure 390 include a line spacing of greater than or equal to 5 µm. Forming the build-up interconnect structures with a similar line spacing reduces manufacturing complexity, which increases yield and reduces costs. Forming the build-up interconnect structures with similar line spacing also allows for use of standardized materials and equipment. The use of standardized equipment and materials reduces the manufacturing time and cost of dual Fo-WLCSP 900. Forming build-up interconnect structure 882 independent of Fo-WLCSP 400 allows build-up interconnect structure 882 to accommodate a variety of semiconductor packages with varying I/O and interconnection density. Forming build-up interconnect structure 882 prior to attaching Fo-WLCSP 400 also allows build-up interconnect structure 882 to be tested prior to attaching Fo-WLCSP 400. Fo-WLCSP 400 are thus only mounted to known good build-up interconnect structures 882. Accordingly, the yield of dual Fo-WLCSP 900 is increased. In addition, by mounting only known good Fo-WLCSP 400 to only known good build-up interconnect structures 882, manufacturing steps and materials are not wasted making defective packages and the overall cost of dual Fo-WLCSP 900 is reduced. The increased pitch of build-up interconnect structure 882 provides greater flexibility in the placement of bumps 896. The placement of bumps 896 and the pitch of the conductive traces within build-up interconnect structure 882, particularly the pitch of the traces in the bottom conductive layer, i.e., conductive layer 874, can be selected to mirror industry standards. For example, bumps 896 are formed with the same spacing as the interconnection pads on a standard PCB. Forming bumps 896 and the conductive traces in conductive layer 874 according to industry standards makes dual Fo-WLCSP 900 compatible with an increased number of semiconductor devices and components.

As technology advances, the electrical interconnection requirement of semiconductor die and devices is increasing. Dual Fo-WLCSP 900 is able to incorporate semiconductor die with a high interconnection requirement due to the narrow pitch and fine line spacing of build-up interconnect structure 390, while remaining compatible with standard devices and cost efficient to manufacture due to the incorporation of build-up interconnect structure 882.

Figure 17:
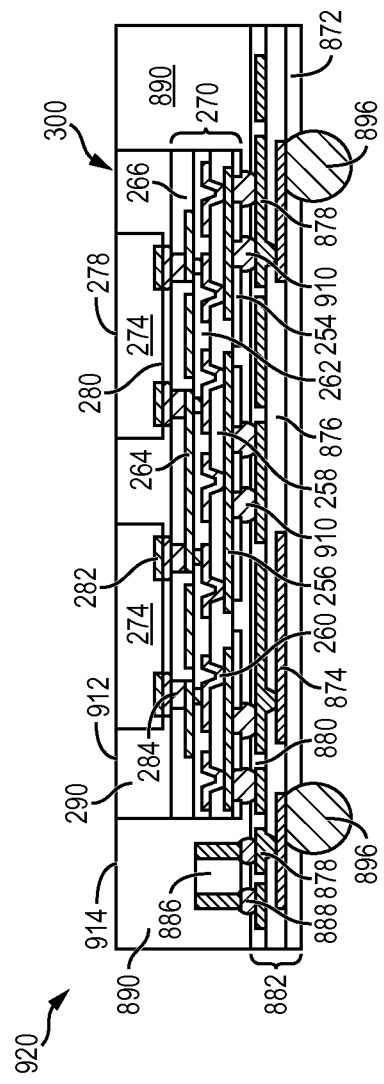
FIG. 17 illustrates another dual fan-out semiconductor device.

FIG. 17 shows dual Fo-WLCSP 920 similar to dual Fo-WLCSP 900 in FIG. 16. In dual Fo-WLCSP 920, Fo-WLCSP 400 has been replace by Fo-WLCSP 300, including semiconductor die 274 and build-up interconnect structure 270, from FIG. 7h.

An electrically conductive bump material is deposited over conductive layer 256 of build-up interconnect structure 270 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 256 using a suitable attachment or bonding process. In one embodiment, the bump material is reflowed by heating the material above the material's melting point to form balls or bumps 910. In some applications, bumps 910 are reflowed a second time to improve electrical contact to conductive layer 256. In one embodiment, bumps 910 are formed over a UBM layer. Bumps 910 can also be compression bonded or thermocompression bonded to conductive layer 256. Bumps 910 represent one type of interconnect structure that can be formed over conductive layer 256. The interconnect structure can also use conductive paste, stud bump, micro bump, or other electrical interconnect. Alternatively, bumps 910 may be formed on conductive layer 878 of build-up interconnect structure 882.

Fo-WLCSP 300 are mounted to build-up interconnect structure 882 using a pick-and-place operation. Bumps 910 are reflowed to metallurgically and electrically connect bumps 910 to conductive layer 878. Fo-WLCSP 300 is known good having been tested prior to mounting Fo-WLCSP 300 to build-up interconnect structure 882. In some applications, bumps 910 are reflowed a second time to improve electrical contact to conductive layer 878. Bumps 910 can also be compression bonded or thermocompression bonded to conductive layer 878. In one embodiment, an underfill material is disposed between Fo-WLCSP 300 and build-up interconnect structure 882.

Encapsulant 890 is disposed over Fo-WLCSP 300, passive device 886, and build-up interconnect structure 882. A portion of encapsulant 890 and encapsulant 290 is removed in an optional backgrinding operation to planarize encapsulants 890 and 290 and expose surface 278 of semiconductor die 274. In FIG. 17, back surface 914 of encapsulant 890 and back surface 912 of encapsulant 370 are coplanar with exposed back surface 278 of semiconductor die 274. The backgrinding operation reduces an overall thickness of dual Fo-WLCSP 920.

In dual Fo-WLCSP 920, semiconductor die 274 are electrically connected through build-up interconnect structure 270 and build-up interconnect structure 882 to bumps 896 for connection to external devices. The conductive layers of build-up interconnect structure 270, for example conductive layer 256, conductive layer 260, and conductive layer 264, are formed using narrow pitch and fine line spacing processes and technology, e.g., photosensitive dielectric resist with selectively plated Cu. In one embodiment, the conductive layers of build-up interconnect structure 270 include a minimum line spacing of 2 µm. Forming the conductive layers within build-up interconnect structure 270 with narrow pitch and fine line spacing allows the conductive traces within the conductive layers to be formed closer together. Forming the conductive traces closer together allows more conductive traces to be formed over a given area, for example, the area over semiconductor die 274. An increase in the number of conductive traces over semiconductor die 274 increases the number of possible interconnections that may be formed with semiconductor die 274. Increasing the number of potential interconnections within a conductive layer increases the I/O of build-up interconnect structure 270 without increasing the number of conductive layers. Accordingly, forming conductive layers 256, 260, and 264 with narrow line spacing and an increased number of conductive traces, increases the number of possible interconnect sites or I/O of build-up interconnect structure 270 without requiring formation of additional conductive layers. Forming less conductive layers within build-up interconnect structure 270 allows for a thinner build-up interconnect structure 270. A thinner build-up interconnect structure 270 reduces the overall size of Fo-WLCSP 300 and the package profile dual Fo-WLCSP 920. Limiting the number of layers within build-up interconnect structure 270 also reduces the number of layers that could potentially warp. A decrease in warpage increases the manufacturing yield of dual Fo-WLCSP 920. Additionally, forming fewer conductive layers within build-up interconnect structure 270 reduces interconnect distance, i.e., the distance an electrical signal must travel, between semiconductor die 274 and between semiconductor die 274 and bumps 896. Shorter interconnect distance increases the speed and electrical performance of dual Fo-WLCSP 920. The increased number of conductive traces, i.e., increased number of potential interconnections sites, within build-up interconnect structure 270 makes build-up interconnect structure 270 compatible with semiconductor devices that require an increased number of electrical interconnection sites. Accordingly, semiconductor die or devices with an increased I/O and interconnection requirement can be incorporated into dual Fo-WLCSP 920. Forming build-up interconnect structure 270 prior to attaching semiconductor die 274 allows build-up interconnect structure 270 to be tested prior to attaching semiconductor die 274. Semiconductor die 274 are thus only mounted to known good build-up interconnect structures 270. Accordingly, the yield of dual Fo-WLCSP 920 is increased. In addition, by mounting only KGD to only known good build-up interconnect structures 270, manufacturing steps and materials are not wasted making defective packages and the overall cost of dual Fo-WLCSP 920 is reduced.

Dual Fo-WLCSP 920 also includes build-up interconnect structure 882. Build-up interconnect structure 882 provides additional conductive layers within dual Fo-WLCSP 920, which may be used as a ground plane and for connection to other internal, e.g., passive device 886, or external devices. Embedding passive devices 886 within dual Fo-WLCSP 920 increases the electrical performance and functionality of dual Fo-WLCSP 920 without increasing the package profile. The conductive layers of build-up interconnect structure 882, for example conductive layer 874 and conductive layer 878, are formed with relaxed design rules, meaning the conductive traces within conductive layers 874 and 878 can be formed with a larger pitch and wider line spacing than the conductive traces of conductive layers 256, 260, and 264 in build-up interconnect structure 270. In one embodiment, build-up interconnect structure 270 includes a line spacing of less than or equal to 10 µm and build-up interconnect structure 882 includes a line spacing of greater than or equal to 5 µm. Relaxing the design rules of build-up interconnect structure 882 allows for greater flexibility in the materials and manufacturing techniques used in the fabrication of build-up interconnect structure 882. Build-up interconnect structure 882 can be formed with a line spacing similar to other build-up interconnect structures, e.g., build-up interconnect structure 390 in FIG. 9e. Forming the build-up interconnect structures with a similar line spacing reduces manufacturing complexity, which increases yield and reduces costs. Additionally, build-up interconnect structure 882 can be formed using standard equipment and materials. The use of standardized equipment and materials reduces the manufacturing time and cost of dual Fo-WLCSP 920. Forming build-up interconnect structure 882 independent of Fo-WLCSP 300 allows build-up interconnect structure 882 to accommodate a variety semiconductor packages with varying I/O and interconnection density. Forming build-up interconnect structure 882 prior to attaching Fo-WLCSP 300 also allows build-up interconnect structure 882 to be tested prior to attaching Fo-WLCSP 300. Fo-WLCSP 300 are thus only mounted to known good build-up interconnect structures 882 and the yield of dual Fo-WLCSP 920 is increased. In addition, by mounting only known good Fo-WLCSP 300 to only known good build-up interconnect structures 882, manufacturing steps and materials are not wasted making defective packages and the overall cost of dual Fo-WLCSP 920 is reduced. The wider pitch and line spacing of build-up interconnect structure 882 also provide greater flexibility in the placement of bumps 896 and the spacing of the conductive traces within conductive layers 874 and 878. The placement of bumps 896 and the line spacing of the conductive layers with build-up interconnect structure 882, particularly the line spacing of the final conductive layer, i.e., conductive layer 874, can be selected to mirror industry standards. For example, bumps 896 are formed with the same spacing as the interconnection pads on a standard PCB. Spacing the conductive traces within conductive layer 874 and/or forming bumps 896 according to industry standards makes dual Fo-WLCSP 920 compatible with an increased number of semiconductor devices and components.

As technology advances, the electrical interconnection requirement of semiconductor die and devices is increasing. Dual Fo-WLCSP 920 is able to incorporate semiconductor die with a high interconnection requirement due to the narrow pitch and fine line spacing of build-up interconnect structure 270, while remaining compatible with standard devices and cost efficient to manufacture due to the incorporation of build-up interconnect structure 882.

While one or more embodiments of the present invention have been illustrated in detail, the skilled artisan will appreciate that modifications and adaptations to the embodiments may be made without departing from the scope of the present invention as set forth in the following claims.

What is claimed:

1. A method of making a semiconductor device, comprising:

providing a first semiconductor die including an active surface, a back surface opposite the active surface, and a side surface extending from the active surface to the back surface, wherein the side surface of the first semiconductor die is perpendicular to the active surface of the first semiconductor die and the back surface of the first semiconductor die;

disposing a first interposer adjacent to the first semiconductor die;

depositing a first encapsulant around the first semiconductor die, around the first interposer, and in direct physical contact with the side surface of the first semiconductor die, wherein a side surface of the first encapsulant facing away from the first semiconductor die is perpendicular to the active surface of the first semiconductor die;

forming a plurality of first conductive traces over the first semiconductor die, the first interposer, and the first encapsulant;

disposing a second interposer adjacent to the first encapsulant, outside a footprint of the first encapsulant, and outside a footprint of the first semiconductor die;

depositing a second encapsulant around the first encapsulant, around the second interposer, and in direct physical contact with the side surface of the first encapsulant, wherein the first encapsulant is discrete from the second encapsulant;

forming a plurality of second conductive traces over the plurality of first conductive traces and the second encapsulant including a portion of the plurality of second conductive traces extending outside a footprint of the first encapsulant, wherein a pitch of the plurality of second conductive traces is greater than a pitch of the plurality of first conductive traces; and disposing the first semiconductor die and the plurality of first conductive traces over the plurality of second conductive traces, wherein a second conductive trace of the plurality of second conductive traces directly contacts a first conductive trace of the plurality of first conductive traces.

2. The method of claim 1, further including:

disposing a passive device adjacent to the first semiconductor die; and depositing the first encapsulant around the passive device.

3. The method of claim 1, further including:

disposing a passive device adjacent to the first encapsulant; and depositing the second encapsulant around the passive device.

4. The method of claim 1, further including forming an insulating layer comprising a fiber over the plurality of second conductive traces.

5. A semiconductor device, comprising:

a first semiconductor die including an active surface, a back surface opposite the active surface, and a side surface extending from the active surface to the back surface, wherein the side surface of the first semiconductor die is perpendicular to the active surface of the first semiconductor die and the back surface of the first semiconductor die;

a first insulating layer formed on the active surface of the first semiconductor die and including:
  a side surface of the first insulating layer that is coplanar with the side surface of the first semiconductor die, and
  a front surface of the first insulating layer oriented away from the first semiconductor die and parallel to the active surface of the first semiconductor die;

a first interposer disposed adjacent to the first semiconductor die and outside a footprint of the first semiconductor die, wherein the first interposer includes a first core substrate and a first conductive via extending through the first core substrate, and wherein the first interposer includes a front surface parallel to the front surface of the semiconductor die and the first interposer includes a side surface perpendicular to the front surface of the first interposer;

a first encapsulant deposited over the first semiconductor die and the first interposer with the first encapsulant in direct physical contact with the side surface of the first semiconductor die, the side surface of the first insulating layer, and the side surface of the first interposer, wherein a front surface of the first encapsulant is coplanar with the front surface of the first insulating layer and a front surface of the first interposer;

a first build-up interconnect structure formed over the first semiconductor die, the first interposer, and the first encapsulant, the first build-up interconnect structure including:
  a second insulating layer deposited on and in direct physical contact with the front surface of the first insulating layer, a front surface of the first interposer, and the front surface of the first encapsulant, wherein the second insulating layer extends outside the footprint of the first semiconductor die,
  a plurality of first conductive traces formed over the second insulating layer, and
  a third insulating layer formed over the plurality of first conductive traces with a front surface of the third insulating layer oriented away from the first semiconductor die and parallel to the active surface of the first semiconductor die, wherein a side surface of the third insulating layer is coplanar with a side surface of the second insulating layer and a side surface of the first encapsulant;

a second interposer disposed outside a footprint of the first encapsulant and outside the footprint of the first semiconductor die, wherein the second interposer includes a second core substrate and a second conductive via extending through the second core substrate, and wherein the second interposer includes a front surface parallel to the front surface of the semiconductor die and the second interposer includes a side surface perpendicular to the front surface of the first interposer;

a second encapsulant deposited around the first encapsulant, the second interposer, and the first build-up interconnect structure with the second encapsulant in direct physical contact with the side surface of the first encapsulant, the side surface of the second interposer, the side surface of the second insulating layer, and the side surface of the third insulating layer, wherein a front surface of the second encapsulant outside the footprint of the first encapsulant is coplanar with the front surface of the third insulating layer, and wherein the second encapsulant is a unitary molding compound; and a second build-up interconnect structure formed over the first build-up interconnect structure, second interposer, and the second encapsulant, wherein the second build-up interconnect structure includes:
  a fourth insulating layer deposited on and in direct physical contact with the front surface of the third insulating layer, the front surface of the second interposer, and the front surface of the second encapsulant, wherein a side surface of the fourth insulating layer is coplanar with a side surface of the second encapsulant, and wherein the fourth insulating layer extends outside the footprint of the first encapsulant, and
  a plurality of second conductive traces formed over the fourth insulating layer with a second conductive trace of the plurality of second conductive traces in direct physical contact with a first conductive trace of the plurality of first conductive traces, wherein a pitch of the plurality of second conductive traces is greater than a pitch of the plurality of first conductive traces.

6. The semiconductor device of claim 5, further including:
a first conductive via disposed in the first encapsulant; and
a second conductive via disposed in the second encapsulant and outside the first encapsulant.

7. The semiconductor device of claim 5, further including a ground plane formed in the second build-up interconnect structure.

8. The semiconductor device of claim 5, further including a passive device disposed over the first build-up interconnect structure.

9. The semiconductor device of claim 5, further including a second semiconductor die disposed over the first build-up interconnect structure.

10. A semiconductor device, comprising:
a first semiconductor die including an active surface, a back surface opposite the active surface, and a side surface extending from the active surface to the back surface, wherein the side surface of the first semiconductor die is perpendicular to the active surface of the first semiconductor die and the back surface of the first semiconductor die;
a first interposer disposed adjacent to the first semiconductor die;
a first encapsulant disposed around the first semiconductor die and the first interposer with a front surface of the first encapsulant outside a footprint of the first semiconductor die and a side surface of the first encapsulant perpendicular to the front surface of the first encapsulant, wherein the first encapsulant is in direct physical contact with the side surface of the first semiconductor die and a side surface of the first interposer;
a first interconnect structure including:
  a plurality of first conductive traces, and
  a first insulating layer disposed over the plurality of first conductive traces, wherein the first interconnect structure is in direct physical contact with the front surface of the first encapsulant and a front surface of the first interposer, the first interconnect structure extends directly over the active surface of the first semiconductor die, and a side surface of the first insulating layer is coplanar with the side surface of the first encapsulant;
a second interposer disposed adjacent to the first encapsulant with a portion of the first encapsulant between the first interposer and second interposer;
a second encapsulant deposited in direct physical contact with the side surface of the first encapsulant, a side surface of the second interposer, and the side surface of the first insulating layer, wherein a front surface of the second encapsulant is coplanar with a front surface of the first insulating layer and a front surface of the second interposer, a side surface of the second encapsulant outside a footprint of the first encapsulant is perpendicular to the front surface of the second encapsulant, and the side surface of the first encapsulant is directly between the side surface of the first semiconductor die and the side surface of the second encapsulant; and
a second interconnect structure disposed over the first interconnect structure and the second encapsulant, wherein the second interconnect structure extends outside a footprint of the first interconnect structure and includes:
  a second insulating layer comprising a back surface of the second insulating layer in direct physical contact with the front surface of the first insulating layer, the front surface of the second interposer, and the front surface of the second encapsulant, and
  a plurality of second conductive traces with a second conductive trace of the plurality of second conductive traces in direct physical contact with a first conductive trace of the plurality of first conductive traces through an opening in the second insulating layer, wherein a pitch of the plurality of second conductive traces is greater than a pitch of the plurality of first conductive traces.

11. The semiconductor device of claim 10, wherein:
the first interposer includes a first core substrate and a first conductive via formed through the first core substrate; and
the second interposer includes a second core substrate and a second conductive via formed through the second core substrate.

12. A semiconductor device, comprising:
a first semiconductor die including an active surface, a back surface opposite the active surface, and a side surface extending from the active surface to the back surface, wherein the side surface of the first semiconductor die is perpendicular to the active surface of the first semiconductor die and the back surface of the first semiconductor die;
a first interposer disposed adjacent to the first semiconductor die;
a first encapsulant deposited around the first semiconductor die, around the first interposer, and in direct physical contact with the side surface of the first semiconductor die, wherein a side surface of the first encapsulant facing away from the first semiconductor die is perpendicular to the active surface of the first semiconductor die;
a plurality of first conductive traces formed over the first semiconductor die, the first interposer, and the first encapsulant;
a second interposer disposed adjacent to the first encapsulant, outside a footprint of the first encapsulant, and outside a footprint of the first semiconductor die;
a second encapsulant deposited around the first encapsulant, around the second interposer, and in direct physical contact with the side surface of the first encapsulant, wherein the first encapsulant is discrete from the second encapsulant; and a plurality of second conductive traces formed over the plurality of first conductive traces and the second encapsulant, wherein a portion of the plurality of second conductive traces extends outside a footprint of the first encapsulant, a second conductive trace of the plurality of second conductive traces directly contacts a first conductive trace of the plurality of first conductive traces, and a pitch of the plurality of second conductive traces is greater than a pitch of the plurality of first conductive traces.

13. The semiconductor device of claim 12, further including a second semiconductor die disposed over the first semiconductor die.

14. The semiconductor device of claim 12, wherein the second encapsulant is a unitary molding compound.

15. The semiconductor device of claim 12, further including a clear boundary between the first encapsulant and the second encapsulant.

16. The semiconductor device of claim 12, wherein the second encapsulant is deposited in a separate processing step from the first encapsulant.

17. The semiconductor device of claim 10, further including a second semiconductor die disposed over the first semiconductor die, wherein the second semiconductor die is coupled to the first interconnect structure through the first interposer, and wherein the second semiconductor die is coupled to the second interconnect structure through the second interposer.

18. The semiconductor device of claim 10, wherein the first interposer includes a first conductive via and a first core substrate surrounding the first conductive via, and wherein the second interposer includes a second conductive via and a second core substrate surrounding the second conductive via.

19. The semiconductor device of claim 10, wherein the first interposer is disposed outside a footprint of the first semiconductor die.

20. The semiconductor device of claim 10, wherein a back surface of the first encapsulant is coplanar with a back surface of the second encapsulant, a back surface of the first interposer, and a back surface of the second interposer.

21. The semiconductor device of claim 5, wherein the first interposer includes a first contact pad formed on the first conductive via and the first core substrate, and wherein the second interposer includes a second contact pad formed on the second conductive via and the second core substrate.

22. The semiconductor device of claim 21, further including:
a second semiconductor die disposed over the first semiconductor die;
a first conductive bump extending from the second semiconductor die to the first contact pad; and
a second conductive bump extending from the second semiconductor die to the second contact pad.

23. The semiconductor device of claim 5, wherein the second encapsulant extends directly between the side surface of the first encapsulant and the side surface of the second interposer, and wherein the side surface of the first encapsulant and the side surface of the second interposer face each other.

24. The semiconductor device of claim 12, further including a second semiconductor die disposed over the first semiconductor die and coupled to the first interposer and the second interposer.

25. The semiconductor device of claim 12, wherein a back surface of the first encapsulant is coplanar with a back surface of the second encapsulant, a back surface of the first interposer, and a back surface of the second interposer.

26. A semiconductor device, comprising:
a first build-up interconnect structure;
a first interposer disposed on the first build-up interconnect structure;
a semiconductor package disposed on the first build-up interconnect structure adjacent to the first interposer, the semiconductor package comprising,
a second build-up interconnect structure coupled to the first build-up interconnect structure,
a semiconductor die disposed on the second build-up interconnect structure,
a second interposer disposed on the second build-up interconnect structure adjacent the semiconductor die, and
a second encapsulant deposited over the second build-up interconnect structure and surrounding the semiconductor die and the second interposer; and
a first encapsulant deposited over the first build-up interconnect structure and surrounding the semiconductor package and the first interposer.

27. The semiconductor device of claim 26, wherein:
a first end of the first interposer physically contacts the first build-up interconnect structure and a second end of the first interposer is exposed at a surface of the first encapsulant opposite the first build-up interconnect structure; and
a first end of the second interposer physically contacts the second build-up interconnect structure and a second end of the second interposer is exposed at a surface of the second encapsulant opposite the second build-up interconnect structure.

28. The semiconductor device of claim 27, wherein the surface of the first encapsulant and the surface of the second encapsulant are coplanar.

29. The semiconductor device of claim 27, further including a second semiconductor package coupled to the first build-up interconnect structure through the first interposer and coupled to the second build-up interconnect structure through the second interposer.

30. The semiconductor device of claim 26, wherein the first interposer includes a first conductive via and the second interposer includes a second conductive via.

* * * * *